United States Patent
Ye et al.

(10) Patent No.: US 9,893,748 B2
(45) Date of Patent: Feb. 13, 2018

(54) ANALOG PREDISTORTER CORE MODULE AND ANALOG PREDISTORTER SYSTEM

(71) Applicant: Huawei Technologies Co., Ltd., Shenzhen (CN)

(72) Inventors: Siqing Ye, Shenzhen (CN); Jinming Wang, Shanghai (CN); Erni Zhu, Shanghai (CN); Chen Wang, Shanghai (CN); Lan You, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/585,642

(22) Filed: May 3, 2017

(65) Prior Publication Data
US 2017/0237455 A1    Aug. 17, 2017

Related U.S. Application Data

(63) Continuation of application No. PCT/CN2014/091111, filed on Nov. 14, 2014.

(51) Int. Cl.
*H04B 1/04* (2006.01)
*H03F 1/32* (2006.01)
(Continued)

(52) U.S. Cl.
CPC ......... *H04B 1/0475* (2013.01); *H03F 1/3247* (2013.01); *H03F 3/19* (2013.01);
(Continued)

(58) Field of Classification Search
CPC ....... H04B 1/0475; H03F 1/3247; H03F 3/19; H03F 3/21
(Continued)

(56) References Cited

U.S. PATENT DOCUMENTS 7,026,873 B2   4/2006   Shanbhag
7,769,103 B2   8/2010   Carichner et al.
(Continued)

FOREIGN PATENT DOCUMENTS

CN    1783858 A      6/2006
CN    101022434 A    8/2007
(Continued)

*Primary Examiner* — Sanh Phu
(74) *Attorney, Agent, or Firm* — Slater Matsil, LLP

(57) ABSTRACT

An analog predistorter (APD) core module including a radio frequency delay module, an envelope module, and a contact matrix module. The radio frequency delay module is configured to receive a feed-forward radio frequency signal, generate multiple radio frequency delay signals with different delays according to the feed-forward radio frequency signal, and output each radio frequency delay signal to the contact matrix module. The envelope module is configured to receive the feed-forward radio frequency signal, perform envelope detection on the feed-forward radio frequency signal to obtain multiple envelope signals with different delays, and output each envelope signal to the contact matrix module. The contact matrix module is configured to receive each radio frequency delay signal, each envelope signal, and a predistortion coefficient from an exterior source, and generate a predistortion signal according to the predistortion coefficient, each radio frequency delay signal, and each envelope signal.

15 Claims, 20 Drawing Sheets

(51) Int. Cl.
*H03F 3/19* (2006.01)
*H03F 3/21* (2006.01)
(52) U.S. Cl.
CPC ......... *H03F 3/21* (2013.01); *H03F 2200/102* (2013.01); *H03F 2200/451* (2013.01); *H03F 2201/3233* (2013.01); *H04B 2001/0408* (2013.01)
(58) Field of Classification Search
USPC ...................................... 455/114.3
See application file for complete search history.

(56) References Cited

U.S. PATENT DOCUMENTS

| | | | |
|---|---|---|---|
| 2004/0196922 | A1 | 10/2004 | Leffel |
| 2006/0217083 | A1 | 9/2006 | Braithwaite |
| 2012/0106600 | A1 | 5/2012 | Yu et al. |
| 2015/0318880 | A1* | 11/2015 | Rexberg ................ H03F 1/3247 375/297 |

FOREIGN PATENT DOCUMENTS

| | | |
|---|---|---|
| CN | 101651459 A | 2/2010 |
| CN | 102055411 A | 5/2011 |

* cited by examiner

ANALOG PREDISTORTER CORE MODULE AND ANALOG PREDISTORTER SYSTEM

CROSS-REFERENCE TO RELATED APPLICATIONS

This application is a continuation of International Application No. PCT/CN2014/091111, filed on Nov. 14, 2014, the disclosure of which is hereby incorporated by reference in its entirety.

TECHNICAL FIELD

The present invention relates to the communications field, and in particular, to an analog predistorter core module and an analog predistorter system.

BACKGROUND

A power amplifier (PA) is an amplifier that amplifies signal power and is generally applied in the communications field. For example, in a base station in the communications field, a PA is generally used to amplify power of a to-be-transmitted signal. However, in the base station, transmit distortion of the PA causes distortion of a transmit signal that is obtained after the PA performs amplification. This affects communications quality.

To ensure communications quality, an analog predistorter system is currently used to correct distortion generated by the PA, to eliminate distortion of the signal that is obtained after the PA performs amplification. The analog predistorter system includes a master delay module, an analog predistorter (APD) core module, and an APD training module. An input end of the master delay module, a first input end of the APD core module, and a first input end of the APD training module are all connected to an input end of the analog predistorter system. An output end of the master delay module and an output end of the APD core module are separately connected to an input end of the PA. An output end of the PA is connected to a second input end of the APD training module. An output end of the APD training module is connected to a second input end of the APD core module.

The input end of the analog predistorter system receives a radio frequency signal from exterior, and separately transmits the radio frequency signal to the master delay module, the APD core module, and the APD training module. The master delay module delays the radio frequency signal to obtain a master delay signal, and outputs the master delay signal to the PA. The PA performs coupling on transmit signals generated by the PA to obtain some transmit signals, and sends the some transmit signals to the APD training module. The APD training module calculates a predistortion coefficient according to the radio frequency signal and the transmit signals generated by the PA, and sends the predistortion coefficient to the APD core module. The APD core module generates a predistortion signal according to the radio frequency signal and the predistortion coefficient, and transmits the predistortion signal to the PA. The PA amplifies a mixed signal obtained by mixing the predistortion signal and the master delay signal, to obtain a transmit signal.

The APD training module calculates and adjusts the predistortion coefficient according to the radio frequency signal and the transmit signals output by the PA. When the predistortion coefficient generated by the APD training module is accurate enough, the predistortion signal generated by the APD core module can precisely offset distortion generated by the PA, so that the transmit signal output by the PA is nearly the same as the radio frequency signal.

In a process of implementing the present invention, the inventor finds that the prior art has at least the following problem:

In the foregoing analog predistorter system, when the PA has a distortion characteristic that is not corresponding to the APD core module, distortion generated by the PA cannot be effectively offset.

SUMMARY

To resolve the foregoing problem, embodiments of the present invention provide an analog predistorter core module and an analog predistorter system. The technical solutions are as follows.

According to a first aspect, an analog predistorter APD core module is provided, and the APD core module includes a radio frequency delay module, an envelope module, and a contact matrix module, where the contact matrix module is connected to both the radio frequency delay module and the envelope module, where the radio frequency delay module is configured to receive a feed-forward radio frequency signal, generate multiple radio frequency delay signals with different delays according to the feed-forward radio frequency signal, and output each radio frequency delay signal to the contact matrix module. The envelope module is configured to receive the feed-forward radio frequency signal, perform envelope detection on the feed-forward radio frequency signal to obtain multiple envelope signals with different delays, and output each envelope signal to the contact matrix module. The contact matrix module is configured to receive each radio frequency delay signal, each envelope signal, and a predistortion coefficient from exterior, and generate a predistortion signal according to the predistortion coefficient, each radio frequency delay signal, and each envelope signal.

With reference to the first aspect, in a first possible implementation manner of the first aspect, the radio frequency delay module includes multiple radio frequency delay units RFDs, and the multiple radio frequency delay units RFDs are respectively an $RFD_0$, an $RFD_1$, ..., and an $RFD_{N-1}$, where N is a quantity of columns of a preset nonlinear model matrix, the $RFD_0$, the $RFD_1$, ..., and the $RFD_{N-1}$ are sequentially connected in series, and an output end of each RFD in the $RFD_0$, the $RFD_1$, ..., and the $RFD_{N-1}$ i is connected to the contact matrix module, the $RFD_0$ is configured to receive a feed-forward radio frequency signal x(t), delay the feed-forward radio frequency signal x(t) to obtain a first radio frequency delay signal $x(t-\tau_{RF1})$, and output the first radio frequency delay signal $x(t-\tau_{RF1})$ to the contact matrix module, and the $RFD_n$ is configured to receive an $n^{th}$ radio frequency delay signal $x(t-\tau_{RFn})$ output by the $RFD_{n-1}$, delay the $n^{th}$ radio frequency delay signal $x(t-\tau_{RFn})$ to obtain an $(n+1)^{th}$ radio frequency delay signal $x(t-\tau_{RFn+1})$, and output the $(n+1)^{th}$ radio frequency delay signal $x(t-\tau_{RFn+1})$ to the contact matrix module, where n=1, 2, ..., N−1.

With reference to the first aspect or the first possible implementation manner, in a second possible implementation manner of the first aspect, the envelope module includes an envelope generation unit ED and multiple envelope delay units BBDs, and the multiple BBDs are respectively a $BBD_1$, a $BBD_2$, ..., and a $BBD_{M-1}$, where M is a quantity of rows of the preset nonlinear model matrix, an output end of the ED is connected to an input end of the $BBD_1$, the $BBD_1$, the $BBD_2$, ..., and the $BBD_M$ are sequentially connected in series, and an output end of each BBD in the $BBD_1$, the $BBD_2$, ..., and the $BBD_{M-1}$ is connected to the contact matrix module, the ED is configured to receive the feed-forward radio frequency signal x(t), perform envelope detection on the feed-forward radio frequency signal x(t) to obtain a first envelope signal $r(t-\tau_{BB1})$, and output the first envelope signal $r(t-\tau_{BB1})$ to the $BBD_1$ and the contact matrix module, the $BBD_1$ is configured to delay the first envelope signal $r(t-\tau_{BB1})$ to obtain a second envelope signal $r(t-\tau_{BB2})$, and output the second envelope signal $r(t-\tau_{BB2})$ to the $BBD_2$ and the contact matrix module, the $BBD_m$ is configured to receive an $m^{th}$ envelope signal $r(t-\tau_{BBm})$ output by the $BBD_{m-1}$, delay the $m^{th}$ envelope signal $r(t-\tau_{BBm})$ to obtain an $(m+1)^{th}$ envelope signal $r(t-\tau_{BBm+1})$, and output the $(m+1)^{th}$ envelope signal $r(t-\tau_{BBm+1})$ to the $BBD_{m+1}$ and the contact matrix module, where m=2, 3, ..., M-2. The $BBD_{M-1}$ is configured to receive an $(M-1)^{th}$ envelope signal $r(t-\tau_{BBM-1})$ output by the $BBD_{M-2}$, delay the $(M-1)^{th}$ envelope signal $r(t-\tau_{BBM-1})$ to obtain an $M^{th}$ envelope signal $r(t-\tau_{BBM})$, and output the $M^{th}$ envelope signal $r(t-\tau_{BBM})$ to the contact matrix module.

With reference to the first aspect, in a third possible implementation manner of the first aspect, the envelope module includes multiple envelope generation units EDs, and the multiple envelope generation units EDs are respectively an $ED_0$, an $ED_1$, ..., and an $ED_{N-1}$, where N is a quantity of columns of a preset nonlinear model matrix, an input end of the $ED_0$ is configured to receive the feed-forward radio frequency signal, and an output end is connected to the contact matrix module, and an input end of the $ED_n$ is connected to an output end of the radio frequency delay module, and an output end is connected to the contact matrix module, where n=1, 2, ..., N-1. The $ED_n$ is configured to receive an $(n+1)^{th}$ radio frequency delay signal $x(t-\tau_{RFn+1})$, perform envelope detection on the $(n+1)^{th}$ radio frequency delay signal $x(t-\tau_{RFn+1})$ to obtain an $(n+1)^{th}$ envelope signal $r(t-\tau_{BBn+1})$, and output the $(n+1)^{th}$ envelope signal $r(t-\tau_{BBn+1})$ to the contact matrix module, where n=0, 1, ..., N-1.

With reference to the first aspect, in a fourth possible implementation manner of the first aspect, the envelope module includes multiple envelope generation units EDs and a BBD, and the multiple EDs are respectively an $ED_0$, an $ED_1$, ..., and an $ED_N$, where N is a quantity of columns of a preset nonlinear model matrix, an input end of the $ED_0$ is configured to receive the feed-forward radio frequency signal, and an output end is connected to the contact matrix module, an input end of the $ED_n$ is connected to an output end of the radio frequency delay module, and an output end is connected to the contact matrix module, where n=1, 2, ..., N, an input end of the BBD is connected to an output end of the $ED_N$, and an output end is connected to the contact matrix module, the $ED_0$ is configured to receive the feed-forward radio frequency signal x(t), perform envelope detection on the feed-forward radio frequency delay signal x(t) to obtain a first envelope signal $r(t-\tau_{BB1})$, and output the first envelope signal $r(t-\tau_{BB1})$ to the contact matrix module. The $ED_n$ is configured to receive an $n^{th}$ radio frequency delay signal $x(t-\tau_{RFn})$, perform envelope detection on the $n^{th}$ radio frequency delay signal $x(t-\tau_{RFn})$ to obtain an $(n+1)^{th}$ envelope signal $r(t-\tau_{BBn+1})$, and output the $(n+1)^{th}$ envelope signal $r(t-\tau_{BBn+1})$ to the contact matrix module, where n=1, 2, ..., N-1, the $ED_N$ is configured to receive an $N^{th}$ radio frequency delay signal $x(t-\tau_{RFN})$, perform envelope detection on the $N^{th}$ radio frequency delay signal $x(t-\tau_{RFN})$ to obtain an $(N+1)^{th}$ envelope signal $r(t-\tau_{BBN+1})$, and output the $(N+1)^{th}$ envelope signal $r(t-\tau_{BBN+1})$ to the contact matrix module and the BBD, and the BBD is configured to receive the $(N+1)^{th}$ envelope signal $r(t-\tau_{BBN+1})$, and delay the $(N+1)^{th}$ envelope signal $r(t-\tau_{BBN+1})$ to obtain an $(N+2)^{th}$ envelope signal $r(t-\tau_{BBN+2})$, and output the $(N+2)^{th}$ envelope signal $r(t-\tau_{BBN+2})$ to the contact matrix module.

With reference to the first aspect, in a fifth possible implementation manner of the first aspect, the contact matrix module includes multiple BSLs and a predistortion signal adder, and the multiple BSLs are respectively a $BSL_1$, a $BSL_2$, ..., and a $BSL_N$, where N is a preset integer, where the $BSL_n$ is connected to the radio frequency delay module, the envelope module, the predistortion signal adder, and an APD training module, where n=1, 2, ..., N. The $BSL_n$ receives an $n^{th}$ radio frequency delay signal $x(t-\tau_{RFn})$ output by the radio frequency delay module, M envelope signals output by the envelope module, and a predistortion coefficient output by the APD training module, selects at least one envelope signal from the M envelope signals, performs amplitude conversion and phase conversion on the $n^{th}$ radio frequency delay signal $x(t-\tau_{RFn})$ according to the selected at least one envelope signal and the received predistortion coefficient to obtain an $n^{th}$ tap signal, and outputs the $n^{th}$ tap signal to the predistortion signal adder, and the predistortion signal adder is configured to receive tap signals output by all BSLs, where the tap signals are respectively a first tap signal, a second tap signal, ..., and an $N^{th}$ tap signal; and add the first tap signal, the second tap signal, ..., and the $N^{th}$ tap signal to obtain the predistortion signal.

With reference to the fifth possible implementation manner of the first aspect, in a sixth possible implementation manner of the first aspect, the $BSL_n$ includes an in-phase BLUT, a quadrature BLUT, and an AVM; an envelope input end of the in-phase BLUT and an envelope input end of the quadrature BLUT are connected to the envelope module; a coefficient input end of the in-phase BLUT and a coefficient input end of the quadrature BLUT are connected to coefficient input ends of the BSL module; a coefficient at the coefficient input end of the in-phase BLUT is an in-phase BLUT coefficient; a coefficient at the coefficient input end of the quadrature BLUT is a quadrature BLUT coefficient; a coefficient at a coefficient input end of the BSL module is a BSL coefficient; the BSL coefficient includes two coefficients: the in-phase BLUT coefficient and the quadrature BLUT coefficient; an output end of the in-phase BLUT and an output end of the quadrature BLUT are respectively connected to an in-phase modulation signal input end of the AVM and a quadrature modulation signal input end of the AVM; a first input end of the AVM is connected to the radio frequency delay module; and an output end of the AVM is connected to the predistortion signal adder. The envelope input end of the in-phase BLUT and the envelope input end of the quadrature BLUT include at least one delayed envelope signal, and the included envelope signal is determined by a nonlinear model matrix A; and correspondingly, nonlinear predistortion coefficients included in the in-phase BLUT coefficient and the quadrature BLUT coefficient are also determined by the nonlinear model matrix A. Whether the in-phase BLUT coefficient and the quadrature BLUT coefficient include a linear predistortion coefficient is determined by a linear model vector L; and the in-phase BLUT receives a linear predistortion coefficient $h_{n,i}$ and nonlinear predistortion coefficients $c_{m,n,1,i} \sim c_{m,n,K,i}$ that are input by the APD training module, selects at least one envelope signal, obtains an in-phase BLUT output signal $w_{n,i}(t)$ according to the linear predistortion coefficient $h_{n,i}$, the nonlinear predistortion coefficients $c_{m,n,1,i} \sim c_{m,n,K,i}$, and the selected at least one envelope signal, and outputs the in-phase BLUT output signal $w_{n,i}(t)$ to the in-phase modulation signal input end of the AVM, in the $BSL_n$, i in a subscript of the coefficient indicates that a radio frequency signal served by the coefficient is the $n^{th}$ radio frequency delay signal $x(t-\tau_{RFn})$, and q in a subscript of the coefficient indicates that a radio frequency signal served by the coefficient is Hilbert transform of the $n^{th}$ radio frequency delay signal, that is, $\hat{x}(t-\tau_{RFn})$, and in the $BSL_n$, m in a subscript of the coefficient indicates that an envelope signal served by the coefficient is an $m^{th}$ envelope delay signal $r(t-\tau_{BBm})$. The quadrature BLUT receives a linear predistortion coefficient $h_{n,q}$ and nonlinear predistortion coefficients $c_{m,n,1,q} \sim c_{m,n,K,q}$ that are input by the APD training module, selects at least one envelope signal, obtains a quadrature BLUT output signal $w_{n,q}(t)$ according to the linear predistortion coefficient $h_{n,q}$, the nonlinear predistortion coefficients $c_{m,n,1,q} \sim c_{m,n,K,q}$ and the selected at least one envelope signal, and outputs the quadrature BLUT output signal $w_{n,q}(t)$ to the quadrature modulation signal input end of the AVM; and the AVM receives the in-phase BLUT output signal $w_{n,i}(t)$, the quadrature BLUT output signal $w_{n,q}(t)$, and the radio frequency delay signal $x(t-\tau_{RFn})$ output by the radio frequency delay module, and processes the radio frequency delay signal $x(t-\tau_{RFn})$ according to the in-phase BLUT output signal $w_{n,i}(t)$ and the quadrature BLUT output signal $w_{n,q}(t)$, to obtain an output radio frequency signal $v_n(t)$, that is, the $n^{th}$ tap signal, where n=1, 2, . . . , N.

With reference to the sixth possible implementation manner of the first aspect, in a seventh possible implementation manner of the first aspect, the AVM included in the $BSL_n$ includes a QPS, an in-phase multiplier, a quadrature multiplier, and a subtractor. An input end of the QPS is connected to an output end of the radio frequency delay module, a first output end is connected to a first input end of the in-phase multiplier, and a second output end is connected to a first input end of the quadrature multiplier, the QPS is configured to receive the $n^{th}$ radio frequency delay signal $x(t-\tau_{RFn})$ sent by the radio frequency delay module; divide the $n^{th}$ radio frequency delay signal $x(t-\tau_{RFn})$ into a radio frequency delay signal $x(t-\tau_{RFn})$ on a 0-degree and a radio frequency delay signal $\hat{x}(t-\tau_{RFn})$ on a 90-degree, where a phase difference between the two radio frequency delay signals is 90 degrees; output the radio frequency delay signal $x(t-\tau_{RFn})$ on the 0-degree to the in-phase multiplier, and output the radio frequency delay signal $\hat{x}(t-\tau_{RFn})$ on the −90-degree to the quadrature multiplier, the signal $x(t-\tau_{RFn})$ that is on the 0-degree and is output by the QPS is merely for ease of description, and does not indicate that the signal that is on the 0-degree and is output by the QPS is the same as the radio frequency signal $x(t-\tau_{RFn})$ input to the QPS, where a key technical characteristic of the QPS is a 90-degree phase difference between the output radio frequency delay signal on the 0-degree and the output radio frequency delay signal on the −90-degree, and whether the output radio frequency delay signal on the 0-degree or the output radio frequency delay signal on the −90-degree is the same as the input radio frequency signal is not concerned, the in-phase multiplier is configured to receive the in-phase BLUT output signal and the radio frequency delay signal $x(t-\tau_{RFn})$ on the 0-degree, and multiply the in-phase BLUT output signal by the radio frequency delay signal $x(t-\tau_{RFn})$ on the 0-degree to obtain an in-phase modulated radio frequency signal, and output the in-phase modulated radio frequency signal to the subtractor, the second multiplier is configured to receive the quadrature BLUT output signal and the radio frequency delay signal $\hat{x}(t-\tau_{RFn})$ on the −90-degree, and multiply the quadrature BLUT output signal by the radio frequency delay signal $\hat{x}(t-\tau_{RFn})$ on the −90-degree to obtain a quadrature modulated radio frequency signal, and output the quadrature modulated radio frequency signal to the subtractor, and the subtractor is configured to subtract the quadrature modulated radio frequency signal from the in-phase modulated radio frequency signal to obtain the $n^{th}$ tap signal.

With reference to the sixth possible implementation manner of the first aspect, in an eighth possible implementation manner of the first aspect, the BLUT included in the $BSL_n$ includes at least one LUT and a BLUT adder, and the at least one LUT includes a $LUT_{m,n}$, where m=1, 2, . . . , M, and M is a preset integer. The nonlinear model matrix A is preset, where A has M rows and N columns, an element on the $m^{th}$ row and the $n^{th}$ column of A is $A_{m,n}$, and a value of $A_{m,n}$ is 0 or 1; and when $A_{m,n}=1$, it indicates that the BLUT includes the $LUT_{m,n}$, and a BLUT coefficient input to the BLUT includes the nonlinear predistortion coefficients $c_{m,n,1,i}$ to $c_{m,n,K,i}$; or when $A_{m,n}=0$, it indicates that the BLUT does not include the $LUT_{m,n}$, and a BLUT coefficient input to the BLUT does not include the nonlinear predistortion coefficients $c_{m,n,1,i}$ to $c_{m,n,K,i}$, where m=1, 2, . . . , M, and M is a preset integer, the linear model vector L is preset, where L has N elements, an $n^{th}$ element of L is $L_n$, and a value of $L_n$ is 0 or 1; when $L_n=1$, the BLUT coefficient includes linear predistortion coefficients $h_{n,i}$ and $h_{n,q}$, or when $L_n=0$, the BLUT coefficient does not include linear predistortion coefficients $h_{n,i}$ and $h_{n,q}$, where n=1, 2, . . . , N; a first input end of the $LUT_{m,n}$ is connected to the envelope module, a second input end is connected to the APD training module, and an output end is connected to the BLUT adder; and the BLUT adder is further connected to the APD training module, the $LUT_{m,n}$ receives the $m^{th}$ envelope signal $r(t-\tau_{BBm})$ output by the envelope module and the nonlinear predistortion coefficient output by the APD training module, obtains, according to the predistortion coefficient, a LUT signal corresponding to the $m^{th}$ envelope signal $r(t-\tau_{BBm})$, and outputs the LUT signal to the BLUT adder, where m=1, 2, . . . , M, and the BLUT adder receives a LUT signal output by each LUT and the linear predistortion coefficient output by the APD training module, and adds each LUT signal and the linear predistortion coefficient to obtain an in-phase modulation signal and a quadrature modulation signal.

With reference to the eighth possible implementation manner of the first aspect, in a ninth possible implementation manner of the first aspect, the LUT includes an LUT adder, a reference voltage generation module, multiple basis function generation units BFGs, and multiple multipliers, and each BFG in the multiple BFGs is corresponding to a multiplier. A first input end of each BFG is connected to the envelope module, a second input end is connected to the reference voltage generation module, and an output end of each BFG is respectively connected to a first input end of a multiplier corresponding to each BFG, a second input end of each multiplier in the multiple multipliers is connected to the APD training module, and an output end is connected to the LUT adder, the BFG is configured to receive the envelope signal $r(t-\tau_{BBm})$ output by the envelope module and a reference voltage input by the reference voltage) generation module, generate a basis function signal according to the envelope signal $r(t-\tau_{BBm})$ and the reference voltage, and output the basis function signal to a multiplier corresponding to the BFG, where m=1, 2, . . . , M, the multiplier is configured to receive the basis function signal and a first predistortion coefficient output by the APD training module, obtain a basis contribution signal according to the basis signal and the first predistortion coefficient, and output the basis contribution signal to the BLUT adder, and the LUT adder is configured to receive a basis contribution signal output by each multiplier, and add the received basis contribution signals, to obtain the LUT signal.

With reference to the eighth possible implementation manner of the first aspect, in a tenth possible implementation manner of the first aspect, the LUT includes an LUT adder, multiple basis function generation units BFGs, and multiple multipliers, and each BFG in the multiple BFGs is corresponding to a multiplier, an input end of each BFG is connected to the envelope module, and an output end is respectively connected to a first input end of a multiplier corresponding to each BFG; and a second input end of each multiplier in the multiple multipliers is connected to the APD training module, and an output end is connected to the LUT adder, the BFG is configured to receive the envelope signal $r(t-\tau_{BBm})$ output by the envelope module, generate a basis function signal according to the envelope signal $r(t-\tau_{BBm})$, and output the basis function signal to a multiplier corresponding to the BFG, where m=1, 2, . . . , M, the multiplier is configured to receive the basis function signal and a first predistortion coefficient output by the APD training module, obtain a basis contribution signal according to the basis signal and the first predistortion coefficient, and output the basis contribution signal to the BLUT adder, and the LUT adder is configured to receive a basis contribution signal output by each multiplier, and add the received basis contribution signals, to obtain the LUT signal.

With reference to the eighth possible implementation manner of the first aspect, in an eleventh possible implementation manner of the first aspect, the reference voltage generation module included in the LUT includes an amplifier, a third resistor, a fourth resistor, and multiple fifth resistors, and the multiple fifth resistors are sequentially connected in series to form a series circuit. An output end of the amplifier is connected to an end of the third resistor, an end of the series circuit, and a BFG; another end of the third resistor is connected to a negative electrode input end of the amplifier and an end of the fourth resistor; and another end of the fourth resistor is connected to the ground, and a connection point of any two neighboring fifth resistors in the series circuit is connected to a BFG, and another end of the series circuit is connected to the ground.

With reference to the eighth possible implementation manner of the first aspect, in a twelfth possible implementation manner of the first aspect, the LUT includes K BFGs, and the K BFGs are respectively a BFG_1, a BFG_2, . . . , and a BFG_K, where K is a preset integer, and a gate electrode of a first MOS transistor of the BFG_k is connected to the envelope module included in the APD core module, a gate electrode of a second MOS transistor is connected to the reference voltage generation module included in the APD core module, and a V1 output end of the BFG_k outputs a single-ended downhill basis function signal, or a V2 output end of the BFG_k outputs a single-ended uphill basis function signal, where k=1, 2, . . . , K.

With reference to the eighth possible implementation manner of the first aspect, in a thirteenth possible implementation manner of the first aspect, the LUT includes K BFGs and K+1 LSs, K is a preset integer, the K BFGs are respectively a BFG_1, a BFG_2, . . . , and a BFG_K, and the K+1 LSs are respectively an LS0, an LS1, . . . , and an LSK, a first input end of the LS0 is connected to a differential positive end of an output end of the differential envelope module, a second input end receives a constant-voltage signal Vref0 input from exterior, and an output end is connected to a differential positive input end of the BFG_k, to perform, according to the constant-voltage signal, translation on a differential positive-end envelope signal output by the differential envelope module, and output the translated differential positive-end envelope signal to the differential positive input end of an input end of the BFG_k, where k=1, 2, . . . , K. A first input end of the LSk is connected to a differential negative end of the output end of the envelope module, a second input end is connected to Vrefk output by the reference voltage generation module, and an output end is connected to a differential negative input end of an input end of the BFG_k, to receive a differential negative-end envelope signal and a reference voltage that is output by the reference voltage generation module, perform translation on the differential negative-end envelope signal according to the reference voltage, and output the translated differential negative-end envelope signal to the differential negative input end of the input end of the BFG_k, where k=1, 2, . . . , K, and a signal output by a V2 output end is subtracted from a signal output by a V1 output end of the BFG_k to form a differential downhill function signal, or a signal output by a V1 output end is subtracted from a signal output by a V2 output end of the BFG_k to form a differential uphill function signal.

With reference to the twelfth possible implementation manner or the thirteenth possible implementation manner of the first aspect, in a fourteenth possible implementation manner of the first aspect, the APD core module further includes a first LS and multiple second LSs, and each BFG in the multiple BFGs is corresponding to a second LS. A first input end of the first LS is connected to the differential positive output end of the differential envelope module, and an output end is connected to the differential positive input end of each BFG in the multiple BFGs, and a first input end of each second LS in the multiple second LSs is connected to the differential negative output end of the envelope module, a second input end is connected to the reference voltage generation module, and an output end is connected to a differential negative input end of a BFG corresponding to the second LS.

With reference to the twelfth possible implementation manner or the thirteenth possible implementation manner of the first aspect, in a fifteenth possible implementation manner of the first aspect, each BFG in the K BFGs includes a first MOS transistor, a second MOS transistor, a third MOS transistor, a first resistor, and a second resistor. An end of the first resistor and an end of the second resistor are both connected to a power supply, another end of the first resistor is connected to a drain electrode of the first MOS transistor, and another end of the second resistor is connected to a drain electrode of the second MOS transistor, and a base electrode of the first MOS transistor is connected to the external envelope module, and a source electrode is connected to a drain electrode of the third MOS transistor; a base electrode of the second MOS transistor is connected to the external reference voltage generation module, and a source electrode is connected to the drain electrode of the third MOS transistor, and a source electrode of the third MOS transistor is connected to the ground.

According to a second aspect, an analog predistorter APD core module is provided, and the APD core module includes a linear filtering module and a ZMNL module, where an output end of the linear filtering module is connected to an input end of the ZMNL module. The linear filtering module is configured to receive a feed-forward radio frequency signal, perform linear filtering on the feed-forward radio frequency signal according to a linear filtering coefficient, and output, to the ZMNL module, a radio frequency signal obtained after the linear filtering, where the radio frequency signal obtained after the linear filtering is referred to as a linear premodulated signal, and the ZMNL module is configured to receive the linear premodulated signal output by the linear filtering module, and perform nonlinear processing on the linear premodulated signal according to a ZMNL coefficient, to generate a predistortion signal.

With reference to the second aspect, in a first possible implementation manner of the second aspect, the linear filtering module includes P−1 radio frequency delay units, P digital vector modulator units, and a linear adder, where the P−1 radio frequency delay units are respectively an $RFD_{in1}$, an $RFD_{in2}$, . . . , and an $RFD_{inP-1}$, the P digital vector modulator units are respectively a $DVM_{in1}$, a $DVM_{in2}$, . . . , and a $DVM_{inP}$, and P is a preset integer. The $RFD_{in1}$, the $RFD_{in2}$, . . . , and the $RFD_{inP-1}$ are sequentially connected in series, output ends of the $RFD_{in1}$, the $RFD_{in2}$, . . . , and the $RFD_{inP-1}$ are respectively connected to input ends of the $DVM_{in2}$, the $DVM_{in3}$, . . . , and the $DVM_{inP}$, and output ends of the $DVM_{in1}$, the $DVM_{in2}$, . . . , and the $DVM_{inP}$ are connected to the linear adder, the $RFD_{in1}$ is configured to receive a feed-forward radio frequency signal x(t), delay the feed-forward radio frequency signal x(t) to obtain a first radio frequency delay signal $x(t-\tau_{RF1})$, and output the first radio frequency delay signal $x(t-\tau_{RF1})$ to the $RFD_{in2}$ and the $DVM_{in2}$, the $RFD_{inp}$ is configured to receive a $(p-1)^{th}$ radio frequency delay signal $x(t-\tau_{RFp-1})$ output by the $RFD_{inp-1}$, delay the $(p-1)^{th}$ radio frequency delay signal $x(t-\tau_{RFp-1})$ to obtain a $p^{th}$ radio frequency delay signal $x(t-\tau_{RFp})$, and output the $p^{th}$ radio frequency delay signal $x(t-\tau_{RFp})$ to the $RFD_{inp+1}$ and the $DVM_{inp+1}$, where p=2, 3, . . . , P−2, the $RFD_{inP-1}$ is configured to receive a $(P-2)^{th}$ radio frequency delay signal $x(t-\tau_{RFP-2})$ output by the $RFD_{inP-2}$, delay the $(P-2)^{th}$ radio frequency delay signal $x(t-\tau_{RFP-2})$ to obtain a $(P-1)^{th}$ radio frequency delay signal $x(t-\tau_{RFP-1})$, and output the $(P-1)^{th}$ radio frequency delay signal $x(t-\tau_{RFP-1})$ to the $DVM_{inP}$, the $DVM_{in1}$ is configured to receive the feed-forward radio frequency signal x(t) and a predistortion coefficient input from exterior, perform, according to the predistortion coefficient, amplitude conversion and phase conversion on the feed-forward radio frequency signal x(t) to obtain an output signal $u_1(t)$, and output the output signal $u_1(t)$ to the linear adder, the $DVM_{inp}$ is configured to receive the $(p-1)^{th}$ radio frequency delay signal $x(t-\tau_{RF-1})$, perform amplitude conversion and phase conversion on the $(p-1)^{th}$ radio frequency delay signal $x(t-\tau_{RFp-1})$ to obtain an output signal $u_p(t)$, and output the output signal $u_p(t)$ to the linear adder, and the linear adder is configured to receive output signals output by the $DVM_{in1}$, the $DVM_{in2}$, . . . , and the $DVM_{inP}$, and add the $u_1(t)$, the $u_2(t)$, . . . , and the $u_P(t)$ to obtain the linear premodulated signal.

With reference to the second aspect, in a second possible implementation manner of the second aspect, the ZMNL module includes an envelope detection unit ED and a signal lookup table unit SL, where an input end of the ZMNL module and an input end of the ED are connected to a radio frequency input end x of the SL, an output end of the ED is connected to an envelope input end y of the SL, and an output end of the SL is an output end of the ZMNL. The ED is configured to perform envelope detection on the linear premodulated signal output by the linear filter to generate an envelope signal, and output the envelope signal to the SL, and the SL is configured to receive the linear premodulated signal output by the linear filter, the envelope signal output by the ED, and a predistortion coefficient input from exterior, and perform amplitude conversion and phase conversion on the linear premodulated signal according to the predistortion coefficient and the envelope signal, to obtain the predistortion signal.

With reference to the second aspect, or the first possible implementation manner or the second possible implementation manner of the second aspect, in a third possible implementation manner of the second aspect, the APD core module further includes a broadband linear filtering module, where the broadband linear filtering module is connected to the ZMNL module, and the broadband linear filtering module is configured to process, according to the predistortion coefficient input by an APD training module, the linear premodulated signal input to the ZMNL module, and output the predistortion signal.

According to a third aspect, an APD core module is provided, including a linear filtering module, an SBSL module, and a broadband linear filtering module, where the linear filtering module processes a feed-forward radio frequency signal according to a linear filtering coefficient input by an APD training module, and outputs a linear premodulated signal, the SBSL module processes the linear premodulated signal according to an SBSL coefficient input by the APD training module, and outputs a middle predistortion signal, and the broadband linear filtering module processes, according to a broadband linear filtering coefficient input by the APD training module, the middle predistortion signal input by the SBSL module, and outputs a predistortion signal.

According to a fourth aspect, an analog predistorter APD system is provided, including a master delay module, the APD core module according to any one of the first aspect or the first to the fifteenth possible implementation manners of the first aspect, and an APD training module, where an input end of the analog predistorter system is connected to an input end of the master delay module, the input end of the analog predistorter system is connected to both a first input end of the APD core module and a first input end of the APD training module by using a feed-forward coupler, an output end of the master delay module and an output end of the APD core module are respectively connected to a first input end of a combining coupler and a second input end of the combining coupler, an output end of the combining coupler is connected to an input end of the PA, a second input end of the APD training module is connected to an output end of the PA by using a feedback coupler, and an output end of the APD training module is connected to a second input end of the APD core module; the master delay module is configured to receive a feed-forward radio frequency signal input by the input end of the analog predistorter system, delay the feed-forward radio frequency signal to obtain a master delay signal, and output the master delay signal to the combining coupler; the APD training module is configured to receive the feed-forward radio frequency signal obtained from the input end of the analog predistorter system by means of coupling by the feed-forward coupler and a transmit signal obtained, from a transmit signal generated by the PA, by means of coupling by the feedback coupler, calculate a predistortion coefficient according to the received feed-forward radio frequency signal and the received transmit signal, and send the predistortion coefficient to the APD core module; and the APD core module is configured to receive the feed-forward radio frequency signal obtained from the input end of the analog predistorter system by means of coupling by the feed-forward coupler and the predistortion coefficient sent by the APD training module, generate a predistortion signal according to the received feed-forward radio frequency signal and the received predistortion coefficient, and output the predistortion signal to the combining coupler; the combining coupler mixes the predistortion signal and the master delay signal to obtain a mixed signal, and outputs the mixed signal to the PA; and the PA amplifies the mixed signal, and outputs a transmit signal.

According to a fifth aspect, an analog predistorter APD system is provided, including a master delay module, the APD core module according to any one of the second aspect or the first to the third possible implementation manners of the second aspect, and an APD training module, where an input end of the analog predistorter system is connected to an input end of the master delay module, the input end of the analog predistorter system is connected to both a first input end of the APD core module and a first input end of the APD training module by using a feed-forward coupler, an output end of the master delay module and an output end of the APD core module are respectively connected to a first input end of a combining coupler and a second input end of the combining coupler, an output end of the combining coupler is connected to an input end of the PA, a second input end of the APD training module is connected to an output end of the PA by using a feedback coupler, and an output end of the APD training module is connected to a second input end of the APD core module. The master delay module is configured to receive a feed-forward radio frequency signal input by the input end of the analog predistorter system, delay the feed-forward radio frequency signal to obtain a master delay signal, and output the master delay signal to the combining coupler; the APD training module is configured to receive the feed-forward radio frequency signal obtained from the input end of the analog predistorter system by means of coupling by the feed-forward coupler and a transmit signal obtained, from a transmit signal generated by the PA, by means of coupling by the feedback coupler, calculate a predistortion coefficient according to the received feed-forward radio frequency signal and the received transmit signal, and send the predistortion coefficient to the APD core module; and the APD core module is configured to receive the feed-forward radio frequency signal obtained from the input end of the analog predistorter system by means of coupling by the feed-forward coupler and the predistortion coefficient sent by the APD training module, generate a predistortion signal according to the received feed-forward radio frequency signal and the received predistortion coefficient, and output the predistortion signal to the combining coupler; the combining coupler mixes the predistortion signal and the master delay signal to obtain a mixed signal, and outputs the mixed signal to the PA; and the PA amplifies the mixed signal, and outputs a transmit signal.

In the embodiments of the present invention, a radio frequency delay module delays a feed-forward radio frequency signal to obtain multiple radio frequency delay signals with different delays, and inputs each radio frequency delay signal to a contact matrix module, so that the contact matrix module generates a predistortion signal according to the radio frequency delay signals with different delays. Therefore, when a PA has a distortion characteristic that is not corresponding to an APD core module, an effect on the contact matrix module can be eliminated, and distortion generated by the PA can be effectively offset.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 2-1 is a rough block diagram of an APD core module in a matrix model according to an embodiment of the present invention;

FIG. 2-2 is a fine block diagram of a first embodiment of an envelope module of an APD core module in a matrix model according to an embodiment of the present invention;

FIG. 2-3 is a fine block diagram of a second embodiment of an envelope module of an APD core module in a matrix model according to an embodiment of the present invention;

FIG. 2-4 is a fine block diagram of a third embodiment of an envelope module of an APD core module in a matrix model according to an embodiment of the present invention;

FIG. 2-5 is an internal block diagram of a BSL module according to an embodiment of the present invention;

FIG. 2-6 is an internal block diagram of an AVM module according to an embodiment of the present invention;

FIG. 2-7a is a block diagram of an in-phase BLUT according to an embodiment of the present invention;

FIG. 2-7b is a block diagram of a quadrature BLUT according to an embodiment of the present invention;

FIG. 2-8a is a block diagram of an in-phase LUT using a polynomial basis function according to an embodiment of the present invention;

FIG. 2-8b is a block diagram of a quadrature LUT using a polynomial basis function according to an embodiment of the present invention;

FIG. 3-1 is a rough block diagram of a first embodiment of an APD core module in a cascaded model according to an embodiment of the present invention;

FIG. 3-2 is a fine block diagram of a first embodiment of an APD core module in a cascaded model according to an embodiment of the present invention;

FIG. 3-3 is an internal block diagram of a DVM module according to an embodiment of the present invention;

FIG. 3-4 is an internal block diagram of an SL (Signal lookup table (LUT)) module according to an embodiment of the present invention;

FIG. 3-5 is a rough block diagram of a second embodiment of an APD core module in a cascaded model according to an embodiment of the present invention;

FIG. 3-6 is a fine block diagram of a second embodiment of an APD core module in a cascaded model according to an embodiment of the present invention;

FIG. 3-7 is a rough block diagram of a third embodiment of an APD core module in a cascaded model according to an embodiment of the present invention;

FIG. 3-8 is an internal block diagram of an SBSL module according to an embodiment of the present invention;

FIG. 4-1a is a block diagram of an in-phase LUT using a ramp basis function in the present invention according to an embodiment of the present invention;

FIG. 4-1b is a block diagram of a quadrature LUT using a ramp basis function in the present invention according to an embodiment of the present invention;

FIG. 4-2 is a reference voltage generation module of a ramp basis function according to an embodiment of the present invention;

FIG. 4-3 is a first structural block diagram of a level shifter of a ramp basis function according to an embodiment of the present invention;

FIG. 4-4 is a second structural block diagram of a level shifter of a ramp basis function according to an embodiment of the present invention;

FIG. 4-5 is a basic unit of a ramp basis function according to an embodiment of the present invention;

FIG. 4-6 is a circuit that generates a single-ended downhill basis function signal of a ramp basis function according to an embodiment of the present invention;

FIG. 4-7 is a single-ended downhill basis function of a ramp basis function according to an embodiment of the present invention;

FIG. 4-8 is a circuit that generates a single-ended uphill basis function of a ramp basis function according to an embodiment of the present invention;

FIG. 4-9 is a single-ended uphill basis function of a ramp basis function according to an embodiment of the present invention;

FIG. 4-10 is a circuit that generates a differential downhill basis function of a ramp basis function according to an embodiment of the present invention;

FIG. 4-11 is a differential downhill basis function of a ramp basis function according to an embodiment of the present invention;

FIG. 4-12 is a circuit that generates a differential uphill basis function of a ramp basis function according to an embodiment of the present invention; and FIG. 4-13 is a differential uphill basis function of a ramp basis function according to an embodiment of the present invention.

DETAILED DESCRIPTION OF ILLUSTRATIVE EMBODIMENTS

To make the objectives, technical solutions, and advantages of the present invention clearer, the following further describes the embodiments of the present invention in detail with reference to the accompanying drawings.

Technical description of the present invention is described according to four parts.

A first part is a block diagram of a system in the present invention.

A second part is a first type of an APD model in the present invention, that is, a matrix model.

A third part is a second type of an APD model in the present invention, that is, a cascaded model.

A fourth part is an APD basis function in the present invention, that is, a ramp basis function.

The prior art has at least the following problems.

In a first aspect, when a PA has relatively strong memory distortion, because an APD core module in the prior art has an extremely limited capability in correcting memory distortion, distortion generated by the PA cannot be effectively corrected.

In a second aspect, an even polynomial is used as an APD basis function in the prior art. A problem is that according to the even polynomial, a dynamic difference between different basis functions especially between a high-order term and a low-order term is great, leading to a series of problems in circuit implementation and algorithm robustness.

To resolve the problem in the first aspect, the present invention provides two types of APD models, that is, the matrix model and the cascaded model. The two types of models both have a relatively strong capability in correcting memory distortion. When the PA has relatively strong memory distortion, distortion generated by the PA can be effectively corrected.

To resolve the problem in the second aspect, the present invention provides the ramp basis function. A dynamic difference between different basis functions is small. This facilitates circuit implementation and algorithm robustness.

The first part of the present invention is a block diagram of a system in the present invention.

Figure 1:
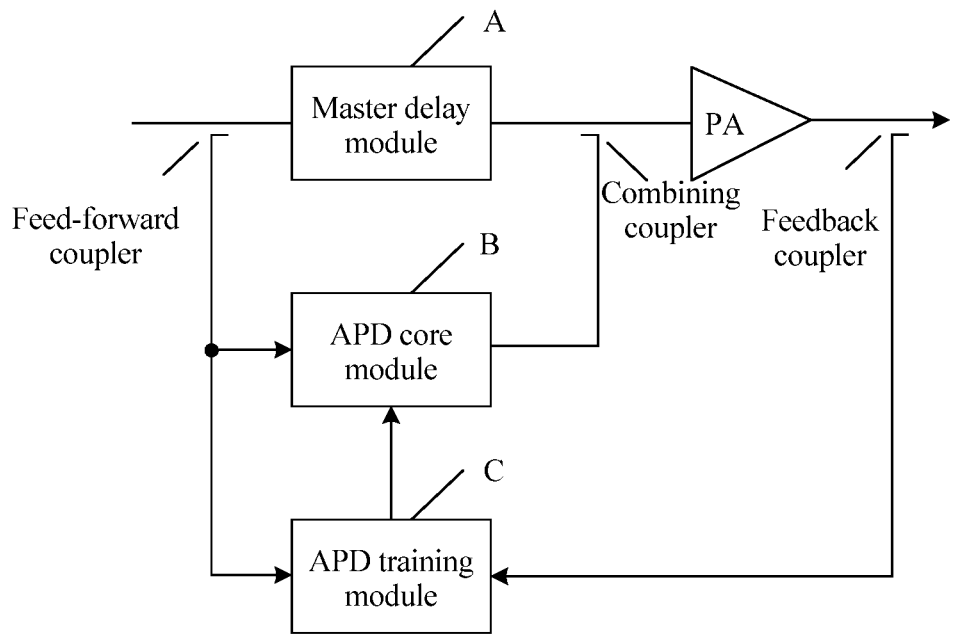
FIG. 1 is a structural block diagram of an analog predistorter system according to an embodiment of the present invention.

Referring to FIG. 1, the present invention provides an analog predistorter system, including: a master delay module A, an APD core module B, an APD training module C, a feed-forward coupler, a combining coupler, and a feedback coupler. An input end of the analog predistorter system is connected to an input end of the master delay module A. The input end of the analog predistorter system is connected to a first input end of the APD core module B and a first input end of the APD training module C by using the feed-forward coupler. An output end of the master delay module A and an output end of the APD core module B are respectively connected to a first input end of the combining coupler and a second input end of the combining coupler, and an output end of the combining coupler is connected to an input end of a PA. A second input end of the APD training module C is connected to an output end of the PA by using the feedback coupler, and an output end of the APD training module C is connected to a second input end of the APD core module B.

The input end of the analog predistorter system receives a radio frequency signal, and outputs the radio frequency signal to the master delay module A and the feed-forward coupler.

The feed-forward coupler is configured to perform coupling on the radio frequency signal to obtain some radio frequency signals, use the some radio frequency signals as a feed-forward radio frequency signal, and output the feed-forward radio frequency signal to the APD core module B and the APD training module C.

The master delay module A is configured to receive the radio frequency signal, delay the radio frequency signal to obtain a master delay signal, and output the master delay signal to the combining coupler.

The feedback coupler is configured to perform coupling on a transmit signal generated by the PA to obtain some transmit signals, and send, to the APD training module C, the some transmit signals obtained by means of coupling.

The APD training module C is configured to receive the feed-forward radio frequency signal and the some transmit signals sent by the feedback coupler, calculate a predistortion coefficient according to the feed-forward radio frequency signal and the some transmit signals, and send the predistortion coefficient to the APD core module B.

The APD core module B is configured to receive the feed-forward radio frequency signal and the predistortion coefficient sent by the APD training module C, generate a predistortion signal according to the received feed-forward radio frequency signal and the received predistortion coefficient, and output the predistortion signal to the combining coupler.

The combining coupler is configured to mix the predistortion signal and the master delay signal to obtain a mixed signal, and output the mixed signal to the PA. The PA amplifies the mixed signal, and outputs a transmit signal.

The APD training module C calculates and adjusts the predistortion coefficient according to the feed-forward radio frequency signal and the transmit signal output by the PA. When the predistortion coefficient generated by the APD training module C is accurate enough, the predistortion signal generated by the APD core module B can precisely offset distortion generated by the PA, so that the transmit signal output by the PA is nearly the same as the feed-forward radio frequency signal.

The second part is a first type of an APD model in the present invention, that is, a matrix model.

Figures 1, 2:
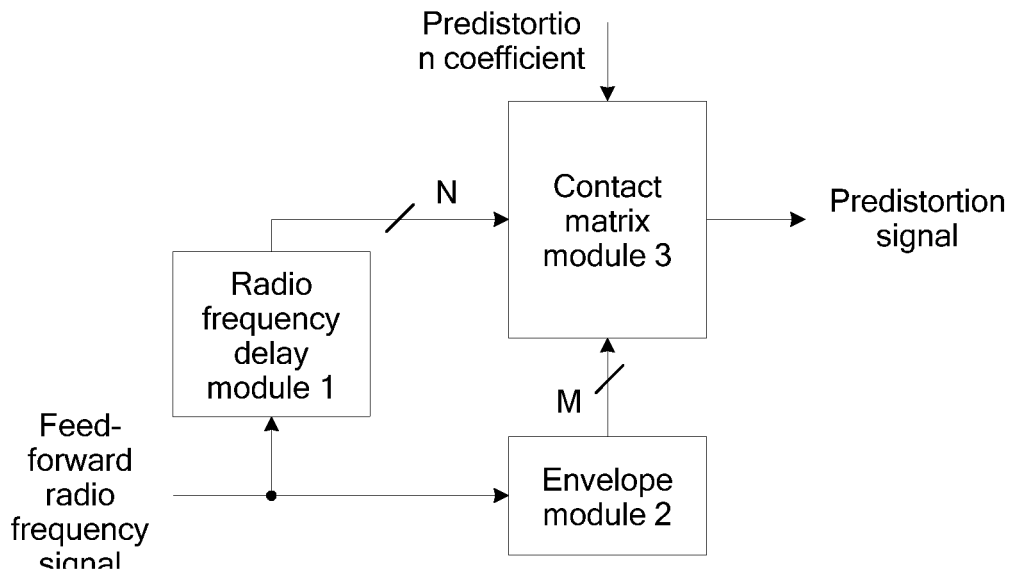
Figure 2:
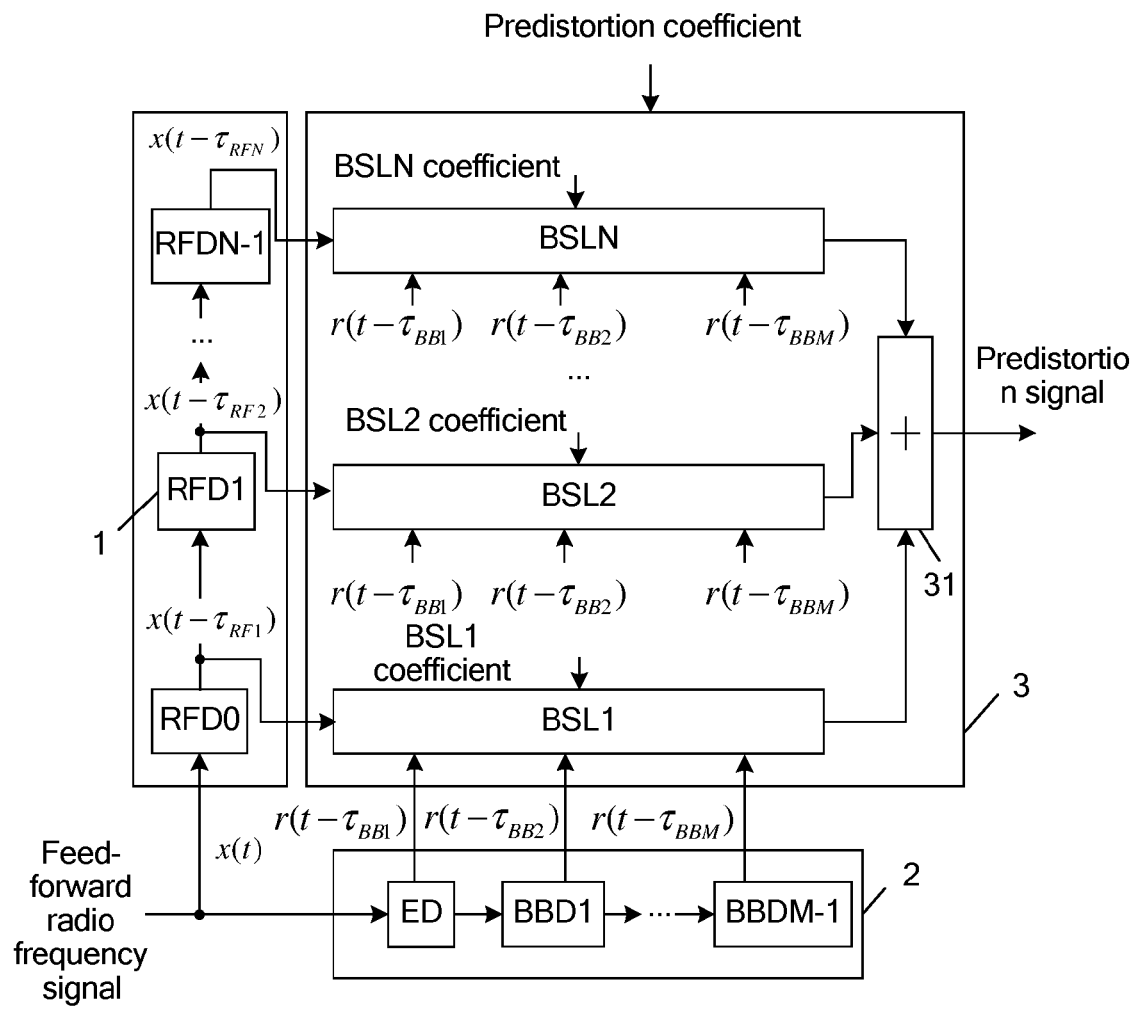

The first type of a model of the APD core module B in the block diagram of the system in the present invention is the matrix model. Referring to FIG. 2-1, the matrix model of the APD core module B includes a radio frequency delay module 1, an envelope module 2, and a contact matrix module 3. The contact matrix module 3 is connected to both the radio frequency delay module 1 and the envelope module 2.

The radio frequency delay module 1 is configured to receive a feed-forward radio frequency signal, generate multiple radio frequency delay signals with different delays according to the feed-forward radio frequency signal, and output each radio frequency delay signal to the contact matrix module 3.

The envelope module 2 is configured to receive the feed-forward radio frequency signal, perform envelope detection on the feed-forward radio frequency signal to obtain multiple envelope signals with different delays, and output each envelope signal to the contact matrix module 3.

The contact matrix module 3 is configured to receive each radio frequency delay signal, each envelope signal, and a predistortion coefficient from exterior, and generate a predistortion signal according to the predistortion coefficient, each radio frequency delay signal, and each envelope signal.

The predistortion coefficient is output by the APD training module C to the contact matrix module 3. The feed-forward radio frequency signal is output by the input end of the analog predistorter system to the radio frequency delay module 1, the envelope module 2, and the contact matrix module 3.

In the present invention, the exterior refers to a part except the APD core module B. That is, an external signal received by the radio frequency delay module 1, the envelope module 2, and the contact matrix module 3 is a signal output by another part except the APD core module B to the APD core module B.

Referring to FIG. 2-2, the radio frequency delay module 1 includes multiple radio frequency delay (RFD) units. The multiple radio frequency delay units are respectively an $RFD_0$, an $RFD_1$, ..., and an $RFD_{N-1}$, and N is a preset integer.

The $RFD_0$, the $RFD_1$, ..., and the $RFD_{N-1}$ are sequentially connected in series. An output end of each RFD in the $RFD_0$, the $RFD_1$, ..., and the $RFD_{N-1}$ is connected to the contact matrix module 3.

The $RFD_0$ is configured to receive a feed-forward radio frequency signal x(t), delay the feed-forward radio frequency signal x(t) to obtain a first radio frequency delay signal $x(t-\tau_{RF1})$, and output the first radio frequency delay signal $x(t-\tau_{RF1})$ to the contact matrix module 3, where $\tau_{RF1}$ is a delay generated by the $RFD_0$.

The $RFD_n$ is configured to receive an $n^{th}$ radio frequency delay signal $x(t-\tau_{RFn})$ output by the $RFD_{n-1}$, delay the $n^{th}$ radio frequency delay signal $x(t-\tau_{RFn})$ to obtain an $(n+1)^{th}$ radio frequency delay signal $x(t-\tau_{RFn+1})$, and output the $(n+1)^{th}$ radio frequency delay signal $x(t-\tau_{RFn+1})$ to the contact matrix module 3, where n=1, 2, ..., N−1, and $\tau_{RFn+1}$ is a delay jointly generated by the $RFD_0$, the $RFD_1$, ..., and the $RFD_n$.

Preferably, referring to FIG. 2-2, the envelope module 2 includes an ED (Envelope Detector, envelope detector) and multiple BBDs (Baseband Delay). The multiple BBDs are respectively a $BBD_1$, a $BBD_2$, ..., and a $BBD_{M-1}$, and M is a preset integer.

An output end of the ED is connected to an input end of the $BBD_1$. The $BBD_1$, the $BBD_2$, ..., and the $BBD_{M-1}$ are sequentially connected in series. An output end of each BBD in the $BBD_1$, the $BBD_2$, ..., and the $BBD_{M-1}$ is connected to the contact matrix module 3.

The ED is configured to receive the feed-forward radio frequency signal x(t), and perform envelope detection on the feed-forward radio frequency signal x(t) to obtain a first envelope signal $r(t-\tau_{BB1})$. Assuming that an envelope signal of x(t) is r(t), and a delay of the ED module is $\tau_{BB1}$, the ED outputs the envelope signal $r(t-\tau_{BB1})$. Because the delay of the ED module is generally small, it may be roughly considered that $\tau_{BB1}=0$. That is, the envelope signal output by the ED, that is, the first envelope signal, is approximately the envelope signal r(t) of the feed-forward radio frequency signal x(t). The first envelope signal $r(t-\tau_{BB1})$ is output to the $BBD_1$.

According to a design, the ED may output a square of an envelope of the radio frequency signal, that is, the signal output by the ED may be $r^2(t-\tau_{BB1})$. The "According to a design" means that, if the design is that the ED outputs $r(t-\tau_{BB1})$, and a corresponding circuit is manufactured, the ED can output only $r(t-\tau_{BB1})$ but cannot output $r^2(t-\tau_{BB1})$. Similarly, when the design is that the ED outputs $r^2(t-\tau_{BB1})$, and a corresponding circuit is manufactured, the ED can output only $r^2(t-\tau_{BB1})$ but cannot output $r(t-\tau_{BB1})$.

The following description is based on a fact that the signal output by the ED is $r(t-\tau_{BB1})$. Actually, the signal output by the ED may be $r^2(t-\tau_{BB1})$, but a description manner needs to be correspondingly modified. Details are not described.

Compared with x(t), r(t) and $r^2(t)$ have a much lower frequency. Actually, r(t) and $r^2(t)$ are baseband signals.

$r(t-\tau_{BBm})$ represents an envelope of $x(t-\tau_{BBm})$, and m=1, 2, ..., M−1. $x(t-\tau_{BBm})$ is not a signal appeared in a circuit, but is a hypothetical signal introduced to make technical description clearer. That is, $x(t-\tau_{BBm})$ is a radio frequency signal obtained when it is assumed that a delay amount of the feed-forward radio frequency signal is equal to $\tau_{BBm}$.

The $BBD_1$ is configured to delay the first envelope signal $r(t-\tau_{BB1})$ to obtain a second envelope signal $r(t-\tau_{BB2})$, and output the second envelope signal $r(t-\tau_{BB2})$ to the $BBD_2$ and the contact matrix module 3, where $\tau_{BB2}$ is a delay generated by the $BBD_1$.

The $BBD_m$ is configured to receive an $m^{th}$ envelope signal $r(t-\tau_{BBm})$ output by the $BBD_{m-1}$, delay the $m^{th}$ envelope signal $r(t-\tau_{BBm})$ to obtain an $(m+1)^{th}$ envelope signal $r(t-\tau_{BBm+1})$, and output the $(m+1)^{th}$ envelope signal $r(t-\tau_{BBm+1})$ to the $BBD_{m+1}$ and the contact matrix module 3, where m=2, 3, ..., M−2, and $\tau_{BBm+1}$ is a delay jointly generated by the $BBD_1$, the $BBD_2$, ..., and the $BBD_m$.

The $BBD_{M-1}$ is configured to receive an $(M-1)^{th}$ envelope signal $r(t-\tau_{BBM-1})$ output by the $BBD_{M-2}$, delay the $(M-1)^{th}$ envelope signal $r(t-\tau_{BBM-1})$ to obtain an $M^{th}$ envelope signal $r(t-\tau_{BBM})$, and output the $M^{th}$ envelope signal $r(t-\tau_{BBM})$ to the contact matrix module 3, where $\tau_{BBM}$ is a delay jointly generated by the $BBD_1$, the $BBD_2$, ..., and the $BBD_{M-1}$.

Referring to FIG. 2-2, the contact matrix module 3 includes multiple BSLs (Block Signal LUT (lookup table)) and a predistortion signal adder 31. The multiple BSLs are respectively a $BSL_1$, a $BSL_2$, ..., and a $BSL_N$.

The $BSL_n$ is connected to the radio frequency delay module 1, the envelope module 2, the predistortion signal adder 31, and the APD training module C. Preferably, the $BSL_n$ is connected to an output end of the $RFD_{n-1}$ included in the radio frequency delay module 1, and an output end of the ED, an output end of the $BBD_1$, an output end of the $BBD_2$, ..., and an output end of the $BBD_{M-1}$. The ED, the $BBD_1$, the $BBD_2$, ..., and the $BBD_{M-1}$ are included in the envelope module 2, and n=1, 2, ..., N.

The $BSL_n$ receives an $n^{th}$ radio frequency delay signal $x(t-\tau_{RFn})$ output by the radio frequency delay module 1, M envelope signals output by the envelope module 2, and a predistortion coefficient output by the APD training module C. The $BSL_n$ receives a $BSL_n$ coefficient, that is, a predistortion coefficient that is related to the $BSL_n$ and is in the predistortion coefficient output by the APD training module C to the contact matrix module 3. The $BSL_n$ selects at least one envelope signal from the M envelope signals, performs amplitude conversion and phase conversion on the $n^{th}$ radio frequency delay signal $x(t-\tau_{RFn})$ according to the selected at least one envelope signal and the received $BSL_n$ coefficient to obtain an $n^{th}$ tap signal $v_n(t)$, and outputs the $n^{th}$ tap signal $v_n(t)$ to the predistortion signal adder 31.

The predistortion signal adder 31 is configured to receive tap signals output by all BSLs, where the tap signals are respectively a first tap signal, a second tap signal, ..., and an $N^{th}$ tap signal; and add the first tap signal, the second tap signal, ..., and the $N^{th}$ tap signal to obtain the predistortion signal.

The predistortion coefficient output by the APD training module C to the $BSL_n$ is the $BSL_n$ coefficient. The $BSL_n$ coefficient includes an in-phase BLUT (Block LUT (Look Up Table)) coefficient and a quadrature BLUT coefficient. The in-phase BLUT coefficient and the quadrature BLUT coefficient both include a linear predistortion coefficient and a nonlinear predistortion coefficient.

It can be seen that, in the first type of the APD model in the present invention, that is, the matrix model, the predistortion coefficient output by the APD training module C to the APD core module B includes N BSL coefficients, that is, a $BSL_1$ coefficient to a $BSL_N$ coefficient. Each BSL coefficient in the $BSL_1$ coefficient to $BSL_N$ coefficient further includes an in-phase BLUT coefficient and a quadrature BLUT coefficient. The in-phase BLUT coefficient and the quadrature BLUT coefficient both further include a linear predistortion coefficient and a nonlinear predistortion coefficient. A linear model vector L is preset, and L has N elements. The $n^{th}$ element in L is $L_n$, and a value of $L_n$ is 0 or 1. When $L_n=1$, the $BSL_n$ coefficient includes linear predistortion coefficients $h_{n,i}$ and $h_{n,i}$. When $L_n=0$, the $BSL_n$ coefficient does not include linear predistortion coefficients $h_{n,i}$ and $h_{n,q}$, and n=1, 2, ..., N.

Setting of the linear model vector L is related to a delay amount $\tau_{RFmain}$ of the master delay module in FIG. 1. Generally, $L_n$ corresponding to a radio frequency delay that is equal to $\tau_{RFmain}$ or is closest to $\tau_{RFmain}$ needs to be set to 0, and n=1, 2, ..., N.

A nonlinear model matrix A is preset in advance, and A has M rows and N columns. An element on the $m^{th}$ row and the $n^{th}$ column of A is $A_{m,n}$, and a value of $A_{m,n}$ is 0 or 1. The $BSL_n$ selects at least one envelope signal from the M envelope signals according to the nonlinear model matrix A, and sets a corresponding nonlinear predistortion coefficient. When $A_{m,n}=1$, the $BSL_n$ selects the $m^{th}$ envelope signal $r(t-\tau_{BBm})$ from the M envelope signals, and sets corresponding nonlinear predistortion coefficients $c_{m,n,k,i}$ and $c_{m,n,k,q}$. When $A_{m,n}=0$, the $BSL_n$ does not select, from the M envelope signals, the $m^{th}$ envelope signal $r(t-\tau_{BBm})$ output by the envelope module 2, and therefore, does not set corresponding nonlinear predistortion coefficients $c_{m,n,k,i}$ and $c_{m,n,k,q}$, where m=1, 2, ..., M, n=1, 2, ..., N, and k=1, 2, ..., K. Herein, K is a quantity of basis functions, and k is a basis number.

In the $BSL_n$, i in a subscript of the nonlinear predistortion coefficient $c_{m,n,k,i}$ indicates that a radio frequency signal served by the coefficient is the $n^{th}$ radio frequency delay signal $x(t-\tau_{RFn})$, and q in a subscript of the nonlinear predistortion coefficient $c_{m,n,k,q}$ indicates that a radio frequency signal served by the coefficient is Hilbert transform of the $n^{th}$ radio frequency delay signal, that is, $\hat{x}(t-\tau_{RFn})$. For example, a radio frequency signal served by $h_{n,i}$ is the $n^{th}$ radio frequency delay signal $x(t-\tau_{RFn})$, and a radio frequency signal served by $h_{n,q}$ is Hilbert transform of the $n^{th}$ radio frequency delay signal, that is, $\hat{x}(t-\tau_{RFn})$. $\hat{x}(t-\tau_{RFn})$ is generated in an analog vector modulator (AVM).

In the $BSL_n$, m in a subscript of the coefficient indicates that an envelope signal served by the coefficient is the $m^{th}$ envelope delay signal $r(t-\tau_{BBm})$. For example, an envelope signal served by $c_{m,n,1,i} \sim c_{m,n,K,i}$ is the $m^{th}$ envelope delay signal $r(t-\tau_{BBm})$, and m=1, 2, ..., M. For example, design parameters for simulating predistortion are as follows:

$$\tau_{RFmain} = 2 \text{ ns}$$

$$N = 3, M = 3$$

$$\tau_{RF1} = 0 \text{ ns}, \tau_{RF2} = 2 \text{ ns}, \tau_{RF3} = 4 \text{ ns}$$

$$\tau_{BB1} = 0 \text{ ns}, \tau_{BB2} = 2 \text{ ns}, \tau_{BB3} = 4 \text{ ns}$$

$$L = [1 \quad 0 \quad 1]$$

$$A = \begin{bmatrix} 1 & 1 & 0 \\ 0 & 1 & 0 \\ 0 & 1 & 1 \end{bmatrix}$$

where $\tau_{RFmain}$ is the delay amount of the master delay module in FIG. 1, L is the preset linear model vector, and A is the preset nonlinear model matrix.

Because $\tau_{RF2}$ and $\tau_{RFmain}$ are both equal to 2 ns, the second element in L, that is, $L_2$, is set to 0.

Corresponding to the foregoing design parameters, the radio frequency delay module 1 outputs three radio frequency signals, and the three radio frequency signals are respectively a first radio frequency delay signal $x(t-\tau_{RF1})$, a second radio frequency delay signal $x(t-\tau_{RF2})$, and a third radio frequency delay signal $x(t-\tau_{RF3})$. The envelope module 2 outputs three envelope signals, and the three envelope signals are respectively a first envelope signal $r(t-\tau_{BB1})$, a second envelope signal $r(t-\tau_{BB2})$, and a third envelope signal $r(t-\tau_{BB3})$.

For the $BSL_1$, the radio frequency delay module 1 outputs $x(t-\tau_{RF1})$ to the $BSL_1$, and the envelope module 2 outputs $r(t-\tau_{BB1})$ to the $BSL_1$. Correspondingly, the $BSL_1$ obtains $h_{1,i}$ and $h_{1,q}$ by means of splitting from input predistortion coefficients, and uses $h_{1,i}$ and $h_{1,q}$ as linear predistortion coefficients of the $BSL_1$. The $BSL_1$ obtains $c_{1,1,k,i}$ and $c_{1,1,k,q}$ by means of splitting from the input predistortion coefficients, and uses the $c_{1,1,k,i}$ and $c_{1,1,k,q}$ as nonlinear predistortion coefficients of the $BSL_1$, and k=1, 2, ..., K.

For the $BSL_2$, the radio frequency delay module 1 outputs $x(t-\tau_{RF2})$ to the $BSL_2$, and the envelope module 2 outputs $r(t-\tau_{BB1})$, $r(t-\tau_{BB2})$, and $r(t-\tau_{BB3})$ to the $BSL_2$. Correspondingly, the $BSL_2$ obtains $c_{1,2,k,i}$, $c_{1,2,k,q}$, $c_{2,2,k,i}$, $c_{2,2,k,q}$, $c_{3,2,k,i}$, and $c_{3,2,k,q}$ by means of splitting from input predistortion coefficients, and uses $c_{1,2,k,i}$, $c_{1,2,k,q}$, $c_{2,2,k,i}$, $c_{2,2,k,q}$, $c_{3,2,k,i}$, and $c_{3,2,k,q}$ as nonlinear predistortion coefficients of the $BSL_2$, and k=1, 2, ..., K.

For the $BSL_3$, the radio frequency delay module 1 outputs $x(t-\tau_{RF3})$ to the $BSL_3$, and the envelope module 2 outputs $r(t-\tau_{BB3})$ to the $BSL_3$. Correspondingly, the $BSL_3$ obtains $h_{3,i}$ and $h_{3,q}$ by means of splitting from input predistortion coefficients, and uses $h_{3,i}$ and $h_{3,q}$ as linear predistortion coefficients of the $BSL_3$. The $BSL_3$ obtains $c_{3,3,k,i}$ and $c_{3,3,k,q}$ by means of splitting from the input predistortion coefficients, and uses $c_{3,3,k,i}$ and $c_{3,3,k,q}$ as nonlinear predistortion coefficients of the $BSL_3$, and k=1, 2, . . . , K.

FIG. 2-2 shows a first implementation manner of the envelope module 2. A characteristic of this implementation manner is that there is only one envelope generation unit ED, and all envelope delay signals are the output signal of the ED, or all envelope delay signals are obtained by performing different delays on the signal output by the ED.

There is a second implementation manner of the envelope module 2. A characteristic of the second implementation manner is that there are multiple envelope generation units EDs.

M envelope signals need to be generated in total in both the first implementation manner of the envelope module 2 and the second implementation manner of the envelope module 2. Each envelope signal has a different delay. Generally, M is not less than N, and N is a quantity of radio frequency delay signals.

For the second implementation manner of the envelope module 2, there are generally R EDs, and R is not greater than N. A radio frequency delay signal is input to each ED in the R EDs. The remaining M-R envelope signals are generated by delaying output signals of some EDs.

Figures 2, 3:
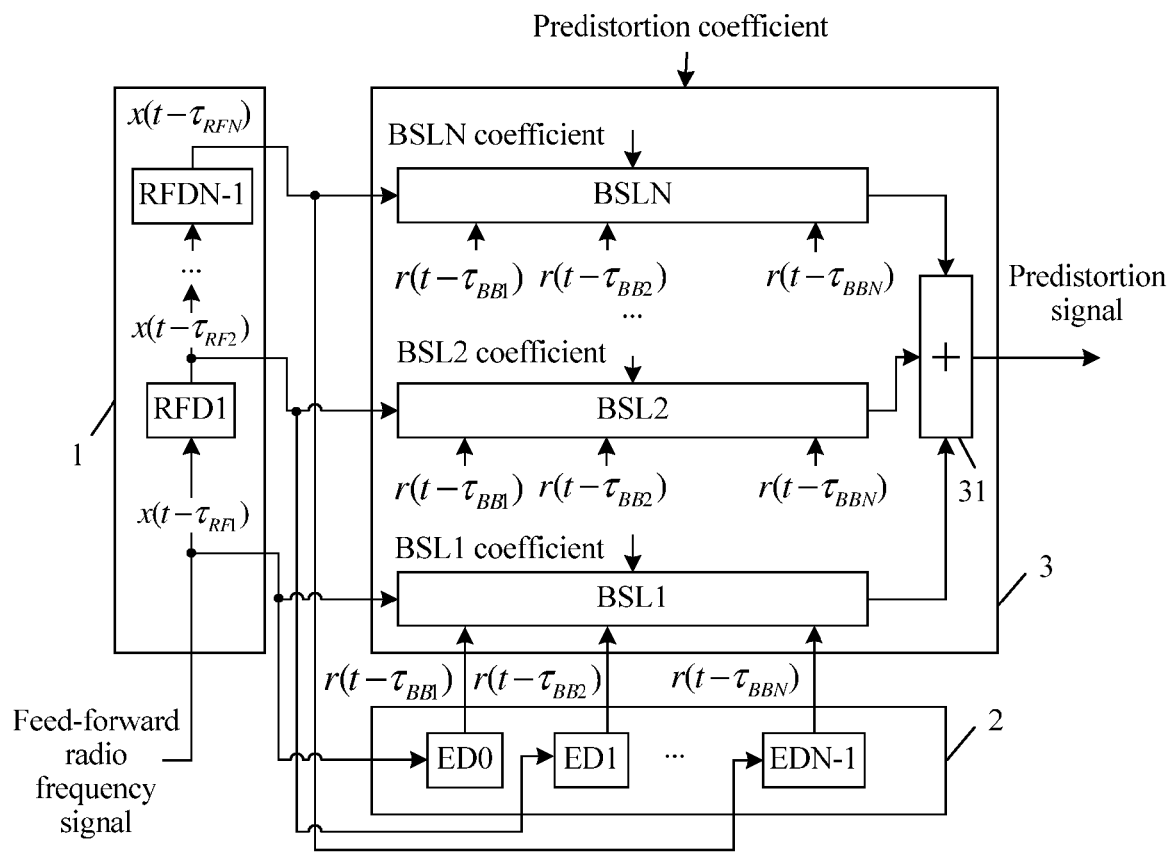

Referring to FIG. 2-3, a first embodiment of the second implementation manner of the envelope module 2 in the present invention is provided.

The envelope module 2 shown in FIG. 2-3 includes multiple envelope generation units EDs, and the multiple envelope generation units EDs are respectively an $ED_0$, an $ED_1$, . . . , and an $ED_{N-1}$, where N is a quantity of columns of a preset nonlinear model matrix.

An input end of the $ED_0$ receives the feed-forward radio frequency signal, and an output end is connected to the contact matrix module 3.

An input end of the $ED_n$ is connected to an output end of the radio frequency delay module 1, and an output end is connected to the contact matrix module 3, where n=1, 2, . . . , N−1.

The $ED_n$ is configured to receive an $(n+1)^{th}$ radio frequency delay signal $x(t-\tau_{RFn+1})$, perform envelope detection on the $(n+1)^{th}$ radio frequency delay signal $x(t-\tau_{RFn+1})$ to obtain an $(n+1)^{th}$ envelope signal $r(t-\tau_{BBn+1})$, and output the $(n+1)^{th}$ envelope signal $r(t-\tau_{BBn+1})$ to the contact matrix module 3, where n=0, 1, . . . , N−1.

In this embodiment, M=N. In this case, there are N envelope generation units. The N envelope generation units are respectively the $ED_0$, the $ED_1$, . . . , and the $ED_{N-1}$. The $ED_0$, the $ED_1$, . . . , and the $ED_{N-1}$ respectively receive $x(t-\tau_{RF1})$, $x(t-\tau_{RF2})$, . . . , and $x(t-\tau_{RFN})$, convert $x(t-\tau_{RF1})$, $x(t-\tau_{RF2})$, . . . , and $x(t-\tau_{RFN})$ into corresponding envelope signals $r(t-\tau_{BB1})$, $r(t-\tau_{BB2})$, . . . , and $r(t-\tau_{BBN})$, and output the corresponding envelope signals $r(t-\tau_{BB1})$, $r(t-\tau_{BB2})$, . . . , and $r(t-\tau_{BBN})$ to the contact matrix module 3. In this embodiment, $\tau_{RF1}$ is equal to 0 or very close to 0. Therefore, it may be considered that the $x(t-\tau_{RF1})$ and the feed-forward radio frequency signal x(t) are a same signal.

Figures 2, 3, 4:
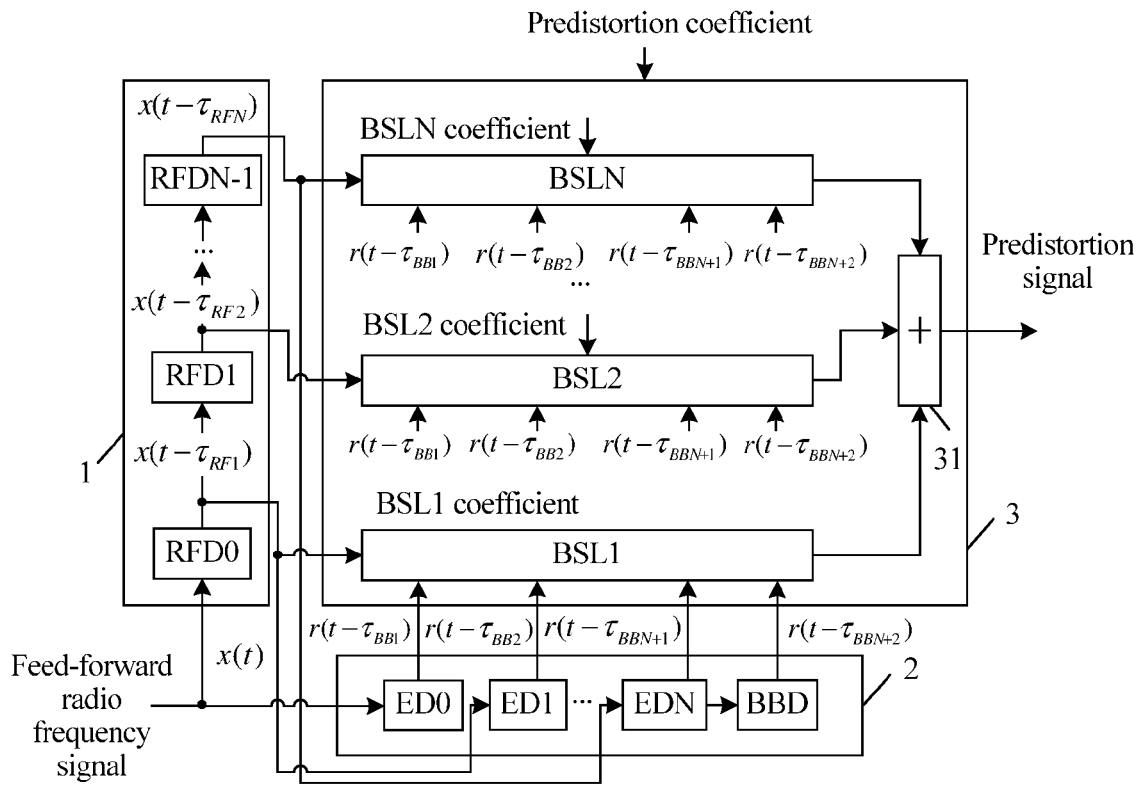

Referring to FIG. 2-4, a second embodiment of the second implementation manner of the envelope module 2 in the present invention is provided. In this embodiment, M=N+2. In this case, there are N+1 envelope generation units EDs.

The N+1 envelope generation units EDs are respectively an $ED_0$, an $ED_1$, . . . , and an $ED_N$. The $ED_0$, the $ED_1$, . . . , and the $ED_N$ respectively receive the feed-forward radio frequency signal, a first radio frequency delay signal, a second radio frequency delay signal, . . . , and an $N^{th}$ radio frequency delay signal, that is, x(t), $x(t-\tau_{RF1})$, $x(t-\tau_{RF2})$, . . . , and $x(t-\tau_{RFN})$, convert x(t), $x(t-\tau_{RF1})$, $x(t-\tau_{RF2})$, . . . , and $x(t-\tau_{RFN})$ into a corresponding first envelope delay signal, a corresponding second envelope delay signal, . . . , and a corresponding $(N+1)^{th}$ envelope delay signal, that is, r(t), $r(t-\tau_{BB1})$, $r(t-\tau_{BB2})$, . . . , and $r(t-\tau_{BBN})$, delay $r(t-\tau_{BBN})$ to obtain $r(t-\tau_{BBN+1})$, and output the N+2 envelope signals r(t), $r(t-\tau_{BB1})$, $r(t-\tau_{BB2})$, . . . , and $r(t-\tau_{BBN+1})$ to the contact matrix module 3. Herein, $\tau_{BBn}$ represents an envelope delay, but a value of $\tau_{BBn}$ is the same as that of a radio frequency delay $\tau_{RFn}$, where n=1, 2, . . . , N+1.

In the second embodiment, the envelope module 2 includes multiple envelope generation units EDs and a BBD. The multiple EDs are respectively the $ED_0$, the $ED_1$, . . . , and the $ED_N$, and N is a quantity of columns of a preset nonlinear model matrix.

An input end of the $ED_0$ receives the feed-forward radio frequency signal, and an output end is connected to the contact matrix module 3.

An input end of the $ED_n$ is connected to an output end of the radio frequency delay module 1, and an output end is connected to the contact matrix module 3, where n=1, 2, . . . , N.

An input end of the BBD is connected to an output end of the $ED_N$, and an output end is connected to the contact matrix module 3.

The $ED_0$ is configured to receive the feed-forward radio frequency signal x(t), perform envelope detection on the feed-forward radio frequency delay signal x(t) to obtain a first envelope signal $r(t-\tau_{BB1})$, and output the first envelope signal $r(t-\tau_{BB1})$ to the contact matrix module 3.

The $ED_n$ is configured to receive an $n^{th}$ radio frequency delay signal $x(t-\tau_{RFn})$, perform envelope detection on the $n^{th}$ radio frequency delay signal $x(t-\tau_{RFn})$ to obtain an $(n+1)^{th}$ envelope signal $r(t-\tau_{BBn+1})$, and output the $(n+1)^{th}$ envelope signal $r(t-\tau_{BBn+1})$ to the contact matrix module 3, where n=1, 2, . . . , N−1.

The $ED_N$ is configured to receive an $N^{th}$ radio frequency delay signal $x(t-\tau_{RFN})$, perform envelope detection on the $N^{th}$ radio frequency delay signal $x(t-\tau_{RFN})$ to obtain an $(N+1)^{th}$ envelope signal $r(t-\tau_{BBN+1})$, and output the $(N+1)^{th}$ envelope signal $r(t-\tau_{BBN+1})$ to the contact matrix module 3 and the BBD.

The BBD is configured to receive the $(N+1)^{th}$ envelope signal $r(t-\tau_{BBN+1})$, and delay the $(N+1)^{th}$ envelope signal $r(t-\tau_{BBN+1})$ to obtain an $(N+2)^{th}$ envelope signal $r(t-\tau_{BBN+2})$, and output the $(N+2)^{th}$ envelope signal $r(t-\tau_{BBN+2})$ to the contact matrix module 3.

The following describes a structure and a working process of a BSL by using $BSL_n$ as an example, and n is a number in 1 to N.

Referring to FIG. 2-5, the BSL includes an in-phase BLUT 325, a quadrature BLUT 326, and an AVM 327.

A radio frequency signal input end of the BSL is connected to an input end of the AVM. An envelope signal input end of the BSL is connected to an envelope input end of the in-phase BLUT and an envelope input end of the quadrature BLUT. The envelope input end of the in-phase BLUT and the envelope input end of the quadrature BLUT include one or more envelope signals.

A coefficient input end of the in-phase BLUT and a coefficient input end of the quadrature BLUT are connected to coefficient input ends of the BSL module. A coefficient at the coefficient input end of the in-phase BLUT is an in-phase BLUT coefficient. A coefficient at the coefficient input end of the quadrature BLUT is a quadrature BLUT coefficient. A coefficient at a coefficient input end of the BSL module is a BSL coefficient. The BSL coefficient includes two coefficients: the in-phase BLUT coefficient and the quadrature BLUT coefficient.

A BSL coefficient of each BSL is a predistortion coefficient output by the APD training module C to the contact matrix module. Therefore, it may be considered that the in-phase BLUT and the quadrature BLUT respectively receive the in-phase BLUT coefficient and the quadrature BLUT coefficient from the APD training module C. The in-phase BLUT coefficient and the quadrature BLUT coefficient both include a linear coefficient and a nonlinear coefficient. An output end of the in-phase BLUT and an output end of the quadrature BLUT are respectively connected to an in-phase modulation signal input end of the AVM and a quadrature modulation signal input end of the AVM. An output end of the AVM unit is an output end of the BSL module.

The in-phase BLUT 325 obtains an in-phase BLUT output signal $w_{n,i}(t)$ according to a linear predistortion coefficient $h_{n,i}$, nonlinear predistortion coefficients $c_{m,n,1,i}$~$c_{m,n,K,i}$, and selected at least one envelope signal, and outputs the in-phase BLUT output signal $w_{n,i}(t)$ to the in-phase modulation signal input end of the AVM.

The quadrature BLUT 326 obtains a quadrature BLUT output signal $w_{n,q}(t)$ according to a linear predistortion coefficient $h_{n,q}$, nonlinear predistortion coefficients $c_{m,n,1,q}$~$c_{m,n,K,q}$, and selected at least one envelope signal, and outputs the quadrature BLUT output signal $w_{n,q}(t)$ to the quadrature modulation signal input end of the AVM.

The AVM processes an input radio frequency delay signal $x(t-\tau_{RFn})$ according to the in-phase BLUT output signal $w_{n,i}(t)$ and the quadrature BLUT output signal $w_{n,q}(t)$, to obtain an output radio frequency signal $v_n(t)$. The processing may be represented by using a formula $v_n(t)=w_{n,i}(t)x(t-\tau_{RFn})-w_{n,q}(t)\hat{x}(t-\tau_{RFn})$. $\hat{x}(t-\tau_{RFn})$ represents Hilbert transform of the $x(t-\tau_{RFn})$, that is, a signal obtained after −90-degree phase shift is performed. For description of a detailed process, refer to a description part of the AVM.

The two BLUTs have a same structure, that is, the in-phase BLUT 325 and the quadrature BLUT 326 have a same structure and a same working process and receive a same envelope signal, but receive different coefficients. Certainly, because the input coefficients are different, output signals are different, that is, $w_{n,i}(t)$ is different from $w_{n,q}(t)$.

The envelope input end of the in-phase BLUT 325 and the envelope input end of the quadrature BLUT 326 are connected to the envelope module 2. The coefficient input end of the in-phase BLUT 325 and the coefficient input end of the quadrature BLUT 326 are connected to the coefficient input ends of the BSL module. A coefficient at the coefficient input end of the in-phase BLUT is the in-phase BLUT coefficient. A coefficient at the coefficient input end of the quadrature BLUT is the quadrature BLUT coefficient. A coefficient at the coefficient input end of the BSL module is the BSL coefficient. The BSL coefficient includes two coefficients: the in-phase BLUT coefficient and the quadrature BLUT coefficient. The output end of the in-phase BLUT and the output end of the quadrature BLUT are respectively connected to the in-phase modulation signal input end of the AVM and the quadrature modulation signal input end of the AVM. The first input end of the AVM is connected to the radio frequency delay module, and the output end of the AVM is connected to the predistortion signal adder.

The envelope input end of the in-phase BLUT and the envelope input end of the quadrature BLUT include at least one delayed envelope signal. The included envelope signal is determined by the nonlinear model matrix A. Correspondingly, nonlinear predistortion coefficients included in the in-phase BLUT coefficient and the quadrature BLUT coefficient are also determined by the nonlinear model matrix A.

Whether the in-phase BLUT coefficient and the quadrature BLUT coefficient include a linear predistortion coefficient is determined by a linear model vector L. The in-phase BLUT receives the linear predistortion coefficient $h_{n,i}$ and the nonlinear predistortion coefficients $c_{m,n,1,i}$~$c_{m,n,K,i}$ that are input by the APD training module, selects at least one envelope signal, obtains the in-phase BLUT output signal $w_{n,i}(t)$ according to the linear predistortion coefficient $h_{n,i}$, the nonlinear predistortion coefficients $c_{m,n,1,i}$~$c_{m,n,K,i}$, and the selected at least one envelope signal, and outputs the in-phase BLUT output signal $w_{n,i}(t)$ to the in-phase modulation signal input end of the AVM.

In the $BSL_n$, i in a subscript of the coefficient indicates that a radio frequency signal served by the coefficient is the $n^{th}$ radio frequency delay signal $x(t-\tau_{RFn})$, and q in a subscript of the coefficient indicates that a radio frequency signal served by the coefficient is Hilbert transform of the $n^{th}$ radio frequency delay signal, that is, $\hat{x}(t-\tau_{RFn})$. For example, a radio frequency signal served by $h_{n,i}$ is the $n^{th}$ radio frequency delay signal $x(t-\tau_{RFn})$, and a radio frequency signal served by $h_{n,q}$ is Hilbert transform of the $n^{th}$ radio frequency delay signal $\hat{x}(t-\tau_{RFn})$. $\hat{x}(t-\tau_{RFn})$ is generated in the AVM.

In the $BSL_n$, m in a subscript of the coefficient indicates that an envelope signal served by the coefficient is an $m^{th}$ envelope delay signal $r(t-\tau_{BBm})$. For example, an envelope signal served by $c_{m,n,1,i}$~$c_{m,n,K,i}$ is the $m^{th}$ envelope delay signal $r(t-\tau_{BBm})$, and m=1, 2, . . . , M.

The quadrature BLUT receives the linear predistortion coefficient $h_{n,q}$ and the nonlinear predistortion coefficients $c_{m,n,1,q}$~$c_{m,n,K,q}$ that are input by the APD training module, selects at least one envelope signal, obtains the quadrature BLUT output signal $w_{n,q}(t)$ according to the linear predistortion coefficient $h_{n,q}$, the nonlinear predistortion coefficients $c_{m,n,1,q}$~$c_{m,n,K,q}$, and the selected at least one envelope signal, and outputs the quadrature BLUT output signal $w_{n,q}(t)$ to the quadrature modulation signal input end of the AVM.

The AVM receives the in-phase BLUT output signal $w_{n,i}(t)$, the quadrature BLUT output signal $w_{n,q}(t)$, and the radio frequency delay signal $x(t-\tau_{RFn})$ output by the radio frequency delay module, and processes the radio frequency delay signal $x(t-\tau_{RFn})$ according to the in-phase BLUT output signal $w_{n,i}(t)$ and the quadrature BLUT output signal $w_{n,q}(t)$, to obtain the output radio frequency signal $v_n(t)$, that is, the $n^{th}$ tap signal, where n=1, 2, . . . , N.

The following further describes an internal block diagram of the BSL by using the in-phase BLUT as an example. It is assumed that the following in-phase BLUT 325 is in the $BSL_n$. Reference is made to FIG. 2-7a.

Because the BLUT is in the $BSL_n$, if the $n^{th}$ element of the linear model vector L $L_n$ is equal to 1, the BLUT coefficient input to the in-phase BLUT 325 includes the linear predistortion coefficient $h_{n,i}$. If the $n^{th}$ element of the linear model vector L $L_n$ is equal to 0, the BLUT coefficient input to the in-phase BLUT 325 does not include the linear predistortion coefficient $h_{n,i}$.

The in-phase BLUT 325 further includes at least one LUT and a BLUT adder 3211. The at least one LUT includes an $LUT_{m,n}$. In the $LUT_{m,n}$, m in a subscript "m,n" of the LUT indicates that an envelope signal input to the $BSL_n$ is the $m^{th}$ envelope signal $r(t-\tau_{BBm})$, and m is a specific value in 1, 2, ..., M. In the $LUT_{m,n}$, n in the subscript "m,n" of the LUT indicates that a radio frequency signal input to the $BSL_n$ is the $n^{th}$ radio frequency delay signal $x(t-\tau_{RFn})$, and n is a specific value in 1, 2, ..., N.

When $A_{m,n}=1$, it indicates that the BLUT includes the $LUT_{m,n}$, and a BLUT coefficient input to the in-phase BLUT 325 includes the nonlinear predistortion coefficients $c_{m,n,1,i}$ to $c_{m,n,K,i}$. When $A_{m,n}=0$, it indicates that the in-phase BLUT does not include the $LUT_{m,n}$, and a BLUT coefficient input to the in-phase BLUT 325 does not include the nonlinear predistortion coefficients $c_{m,n,1,i}$ to $c_{m,n,K,i}$, where m=1, 2, ..., M, and M is a preset integer.

If there are S elements in a same column of A (different ms corresponding to a specific n), and $A_{m,n}=1$, the total nonlinear predistortion coefficients of the in-phase BLUT 325 are S*K real numbers, and S is not greater than M. K is a quantity of basis functions. It is assumed herein that all S column elements use K basis functions. In principle, when the S column elements use different quantities of basis functions, a quantity of the total nonlinear predistortion coefficients of the in-phase BLUT 325 is not difficult to calculate, but the quantity of the total nonlinear predistortion coefficients may not be S*K in this case.

A first input end of the $LUT_{m,n}$ is connected to the envelope module 2, a second input end is connected to the APD training module C, and an output end is connected to the BLUT adder 3211. The BLUT adder 3211 is further connected to the APD training module C, and m=1, 2, ..., M.

The $LUT_{m,n}$ receives the $m^{th}$ envelope signal $r(t-\tau_{BBm})$ output by the envelope module 2 and the nonlinear predistortion coefficients $c_{m,n,1,i}$ to $c_{m,n,K,i}$ output by the APD training module C, obtains, according to the nonlinear predistortion coefficients $c_{m,n,1,i}$ to $c_{m,n,K,i}$, a LUT signal $\rho_{m,n,i}(t)$ corresponding to the $m^{th}$ envelope signal $r(t-\tau_{BBm})$, and outputs the LUT signal $\rho_{m,n,i}(t)$ to the BLUT adder 3211, and m=1, 2, ..., M.

The BLUT adder 3211 receives a LUT signal output by each LUT and the linear predistortion coefficient $h_{n,i}$ output by the APD training module C; adds each LUT signal $\rho_{m,n,i}(t)$ and the linear predistortion coefficient $h_{n,i}$ to obtain a BLUT output signal, that is, an in-phase modulation signal $w_{n,i}(t)$, where $$w_{n,i}(t) = \sum_{\substack{m=1-M \\ A(m,n)=1}} \rho_{m,n,i}(t);$$

and outputs the $w_{n,i}(t)$ to the in-phase modulation signal input end of the AVM 327.

The in-phase BLUT 325 and the quadrature BLUT 326 have a same structure and a working process, and receive a same envelope signal. A difference is that the APD training module C outputs the linear predistortion coefficient $h_{n,i}$ and the nonlinear predistortion coefficients $c_{m,n,1,i}$ to $c_{m,n,K,i}$ to the in-phase BLUT, and outputs the linear predistortion coefficient $h_{n,q}$ and the nonlinear predistortion coefficients $c_{m,n,1,q}$ to $c_{m,n,K,q}$ to the quadrature BLUT, where m=1, 2, ..., M. The in-phase BLUT output signal is $$w_{n,i}(t) = \sum_{\substack{m=1-M \\ A(m,n)=1}} \rho_{m,n,i}(t), \text{ where}$$

$$\rho_{m,n,i}(t) = \sum_{k=1}^{K} c_{m,n,k,i} s_k(t-\tau_{BBm}).$$

The quadrature BLUT output signal is $$w_{n,q}(t) = \sum_{\substack{m=1-M \\ A(m,n)=1}} \rho_{m,n,q}(t), \text{ where}$$

$$\rho_{m,n,q}(t) = \sum_{k=1}^{K} c_{m,n,k,q} s_k(t-\tau_{BBm}).$$

Referring to FIG. 2-8a, an LUT unit $LUT_{m,n}$ in the in-phase BLUT 325 is used as an example to describe construction and a working process of the LUT unit. It is assumed that an even polynomial is used as a basis function.

The LUT of the $LUT_{m,n}$ includes an LUT adder 331, multiple BFGs, and multiple multipliers. The multiple BFGs are respectively a BFG_1, a BFG_2, ..., and a BFG_K. The multiple multipliers are respectively a multiplier M1, a multiplier M2, ..., and a multiplier MK, and K is a preset integer. The BFG refers to a basis function generator, that is, an acronym of a basis function generator.

Nonlinear predistortion coefficients of the LUT of the $LUT_{m,n}$ are $c_{m,n,1,i}$ to $c_{m,n,K,i}$. Therefore, the nonlinear predistortion coefficients of the $LUT_{m,n}$ in the in-phase BLUT 325 are K real numbers.

An input end of the BFG_k is connected to the envelope module 2, and an output end of the BFG_k is connected to an input end of the multiplier Mk. An output end of the multiplier Mk is connected to the LUT adder 331, and k=1, 2, ..., K.

Preferably, the input end of the BFG_k is connected to an output end of a $BBD_{-1}$ included in the envelope module 2.

The BFG_k is configured to receive the $m^{th}$ envelope signal $r(t-\tau_{BBm})$ output by the envelope module 2, generate a basis function signal $s_k(r(t-\tau_{BBm}))$ according to the $m^{th}$ envelope signal $r(t-\tau_{BBm})$, and output the basis function signal $s_k(r(t-\tau_{BBm}))$ to the multiplier Mk corresponding to the BFG_k. Because it is assumed that the basis function is the even polynomial, the basis function signal $s_k(r(t-\tau_{BBm}))$ generated by the BFG_k is actually $r^{2k}(t-\tau_{BBm})$, and k=1, 2, ..., K.

The multiplier Mk is configured to receive the basis function signal $s_k(r(t-\tau_{BBm}))$ and the nonlinear predistortion coefficient $c_{m,n,k,i}$ output by the APD training module C, multiply the basis function signal $s_k(r(t-\tau_{BBm}))$ by the nonlinear predistortion coefficient $c_{m,n,k,i}$ to obtain a basis contribution signal $c_{m,n,k,i} s_k(r(t-\tau_{BBm}))$, and output the basis contribution signal $c_{m,n,k,i} s_k(r(t-\tau_{BBm}))$ to the LUT adder 331. Because it is assumed that the basis function is the even polynomial, the basis contribution signal output to the LUT adder 331 is actually $c_{m,n,k,i} r^{2k}(t-\tau_{BBm})$, and k=1, 2, ..., K.

The LUT adder 331 is configured to receive the basis contribution signal $c_{m,n,k,i} s_k(r(t-\tau_{BBm}))$ output by the multiplier Mk, and add the received basis contribution signals, to obtain an LUT output signal $\rho_{m,n,i}(t)$, and $$\rho_{m,n,i}(t) = \sum_{k=1}^{K} c_{m,n,k,i} s_k(r(t - \tau_{BBm})).$$

Because it is assumed that the basis function is the even polynomial, the output signal of the LUT of the $LUT_{m,n}$ in the in-phase LUT 325 is actually $$\rho_{m,n,i}(t) = \sum_{k=1}^{K} c_{m,n,k,i} r^{2k}(t - \tau_{BBm}).$$

Referring to FIG. 2-8b, an internal block diagram of an LUT unit of an $LUT_{m,n}$ in the quadrature BLUT 326 is provided. A working principle of the LUT unit of the $LUT_{m,n}$ in the quadrature BLUT 326 is the same as that of the LUT unit of the $LUT_{m,n}$ in the in-phase BLUT 325 in the foregoing FIG. 2-8a, but input coefficients are different. In FIG. 2-8a, the input coefficients are $c_{m,n,1,i}$ to $c_{m,n,K,i}$, and in FIG. 2-8b, the input coefficients are $c_{m,n,1,q}$ to $c_{m,n,K,q}$, where k=1, 2, . . . , K. An output signal of the LUT of the $LUT_{m,n}$ in the quadrature LUT 326 is $\rho_{m,n,q}(t)$, and $$\rho_{m,n,q}(t) = \sum_{k=1}^{K} c_{m,n,k,q} s_k((t - \tau_{BBm})).$$

Because it is assumed that the basis function is an even polynomial, the output signal of the LUT of the $LUT_{m,n}$ in the quadrature LUT 326 is actually $$\rho_{m,n,q}(t) = \sum_{k=1}^{K} c_{m,n,k,q} r^{2k}(t - \tau_{BBm}).$$

The LUT in the in-phase BLUT 325 and the LUT in the quadrature BLUT 326 have a same structure and a working process. A difference is that the APD training module C outputs the nonlinear predistortion coefficients $c_{m,n,1,i}$ to $c_{m,n,K,i}$ to the in-phase BLUT, and outputs the nonlinear predistortion coefficients $c_{m,n,1,q}$ to $c_{m,n,K,q}$ to the quadrature BLUT, where m is a value in 1, 2, . . . M.

Referring to FIG. 2-7b, the quadrature BLUT 326 obtains the quadrature BLUT output signal $w_{n,q}(t)$ according to the linear predistortion coefficient $h_{n,q}$, the nonlinear predistortion coefficients $c_{m,n,1,q}$–$c_{m,n,K,q}$, and the selected at least one envelope signal, and outputs the quadrature BLUT output signal $w_{n,q}(t)$ to the quadrature modulation signal input end of the AVM.

Referring to FIG. 2-6, the AVM includes a QPS (Quadrature Phase Splitter) 3271, an in-phase multiplier 3272, a quadrature multiplier 3273, and a subtractor 3274. In the following description, it is assumed that the AVM is in the $BSL_n$, and n is a number in 1 to N.

The QPS 3271 is configured to receive the $n^{th}$ radio frequency delay signal $x(t-\tau_{RFn})$ sent by the radio frequency delay module 1; divide the $n^{th}$ radio frequency delay signal $x(t-\tau_{RFn})$ into a radio frequency delay signal $x(t-\tau_{RFn})$ on a 0-degree and a radio frequency delay signal $\hat{x}(t-\tau_{RFn})$ on a −90-degree, where a phase difference between the two radio frequency delay signals is 90 degrees; output the radio frequency delay signal $x(t-\tau_{RFn})$ on the 0-degree to the in-phase multiplier 3272; and output the radio frequency delay signal $\hat{x}(t-\tau_{RFn})$ on the −90-degree to the quadrature multiplier 3273.

The 0-degree signal and the −90-degree signal that are output by the QPS are used for ease of principle description. The key is that a phase difference between the two radio frequency signals output by the QPS is 90 degrees. Whether the two radio frequency signals are specifically a 45-degree signal and −45-degree signal, 20-degree signal and −70-degree signal, −16-degree signal and −106-degree signal, 133-degree signal and 43-degree signal, or the like does not affect a function and performance of the QPS.

The in-phase multiplier 3272 is configured to receive the in-phase BLUT output signal $w_{n,i}(t)$ and the radio frequency delay signal $x(t-\tau_{RFn})$ on the 0-degree, and multiply the in-phase BLUT output signal $w_{n,i}(t)$ by the radio frequency delay signal $x(t-\tau_{RFn})$ on the 0-degree to obtain an in-phase modulated radio frequency signal $w_{n,i}(t)x(t-\tau_{RFn})$, and output the in-phase modulated radio frequency signal to the subtractor 3274.

The quadrature multiplier 3273 is configured to receive the quadrature BLUT output signal $w_{n,q}(t)$ and the radio frequency delay signal $\hat{x}(t-\tau_{RFn})$ on the −90-degree, and multiply the quadrature BLUT output signal $w_{n,q}(t)$ by the radio frequency delay signal $\hat{x}(t-\tau_{RFn})$ on the −90-degree to obtain a quadrature modulated radio frequency signal $w_{n,q}(t)\hat{x}(t-\tau_{RFn})$, and output the quadrature modulated radio frequency signal to the subtractor 3274.

The in-phase modulation signal and the quadrature modulation signal that are input to the AVM are both baseband signals, and the baseband signals and the radio frequency signal that are input to the AVM are all analog signals. This is the reason why the AVM is referred to as an analog vector modulator, that is, the analog vector modulator. The in-phase multiplier 3272 and the quadrature multiplier 3273 complete multiplication of the baseband signals and the radio frequency signal. The AVM outputs a radio frequency signal.

The subtractor 3274 is configured to subtract the quadrature modulated radio frequency signal $w_{n,q}(t)\hat{x}(t-\tau_{RFn})$ from the in-phase modulated radio frequency signal $w_{n,i}(t)x(t-\tau_{RFn})$ to obtain the radio frequency signal $v_n(t)$ output by the AVM, that is, the $n^{th}$ tap signal output by the $BSL_n$, $v_n(t)=w_{n,i}(t)x(t-\tau_{RFn})-w_{n,q}(t)\hat{x}(t-\tau_{RFn})$. The radio frequency signal $v_n(t)$ output by the AVM is the radio frequency output by the $BSL_n$, that is, the $n^{th}$ tap signal received by the predistortion signal adder 31.

The signal $x(t-\tau_{RFn})$ that is on the 0-degree and is output by the QPS is merely for ease of description, and does not indicate that the signal that is on the 0-degree and is output by the QPS is the same as the radio frequency signal $x(t-\tau_{RFn})$ input to the QPS. A key technical characteristic of the QPS is a 90-degree phase difference between the output radio frequency delay signal on the 0-degree and the output radio frequency delay signal on the −90-degree. Whether the output radio frequency delay signal on the 0-degree or the output radio frequency delay signal on the −90-degree is the same as the input radio frequency signal is not concerned.

The LUT includes an LUT adder, a reference voltage generation module, multiple basis function generation units BFGs, and multiple multipliers. Each BFG in the multiple BFGs is corresponding to a multiplier.

A first input end of each BFG is connected to the envelope module, a second input end is connected to the reference voltage generation module, and an output end of each BFG is respectively connected to a first input end of a multiplier corresponding to each BFG.

A second input end of each multiplier in the multiple multipliers is connected to the APD training module, and an output end is connected to the LUT adder.

The BFG is configured to receive the envelope signal $r(t-\tau_{BBm})$ output by the envelope module and a reference voltage input by the reference voltage generation module, generate a basis function signal according to the envelope signal $r(t-\tau_{BBm})$ and the reference voltage, and output the basis function signal to a multiplier corresponding to the BFG, where m=1, 2, ..., M.

The multiplier is configured to receive the basis function signal and a first predistortion coefficient output by the APD training module, obtain a basis contribution signal according to the basis signal and the first predistortion coefficient, and output the basis contribution signal to the BLUT adder.

The LUT adder is configured to receive a basis contribution signal output by each multiplier, and add the received basis contribution signals, to obtain the LUT signal.

The LUT includes an LUT adder, multiple basis function generation units BFGs, and multiple multipliers. Each BFG in the multiple BFGs is corresponding to a multiplier.

An input end of each BFG is connected to the envelope module, and an output end is respectively connected to a first input end of a multiplier corresponding to each BFG. A second input end of each multiplier in the multiple multipliers is connected to the APD training module, and an output end is connected to the LUT adder.

The BFG is configured to receive the envelope signal $r(t-\tau_{BBm})$ output by the envelope module, generate a basis function signal according to the envelope signal $r(t-\tau_{BBm})$, and output the basis function signal to a multiplier corresponding to the BFG, where m=1, 2, ..., M.

The multiplier is configured to receive the basis function signal and a first predistortion coefficient output by the APD training module, obtain a basis contribution signal according to the basis signal and the first predistortion coefficient, and output the basis contribution signal to the BLUT adder.

The LUT adder is configured to receive a basis contribution signal output by each multiplier, and add the received basis contribution signals, to obtain the LUT signal.

According to the first type of the APD model in the present invention, that is, the matrix model, a radio frequency delay module delays a feed-forward radio frequency signal to obtain multiple radio frequency delay signals with different delays, and outputs each radio frequency delay signal to a contact matrix module, so that the contact matrix module generates a predistortion signal according to the radio frequency delay signals with different delays. An APD core module in the matrix model has a nonlinear memory predistortion characteristic by configuring an appropriate coefficient. Therefore, when a PA has a distortion characteristic that is contrary to the predistortion characteristic of the APD core module, distortion generated by the PA can be effectively offset, so that a signal output by the PA is the same as a signal input to the APD core module.

In this embodiment of the present invention, the radio frequency delay module delays the feed-forward radio frequency signal to obtain multiple radio frequency delay signals with different delays, and inputs each radio frequency delay signal to the contact matrix module, so that the contact matrix module generates the predistortion signal according to the radio frequency delay signals with different delays. Therefore, when the PA has a distortion characteristic that is not corresponding to the APD core module, an effect on the contact matrix module can be eliminated, and distortion generated by the PA can be effectively offset.

The third part of the present invention is a second type of an APD model in the present invention, that is, a cascaded model.

The second type of the APD model of the APD core module B in the block diagram of the system in the present invention is the cascaded model. Referring to FIG. 3-1, a first embodiment of the cascaded model of the APD core module B includes a linear filtering module 4 and a ZMNL module 5. An output end of the linear filtering module 4 is connected to an input end of the ZMNL module. The ZMNL refers to zero memory nonlinear, that is, an acronym of zero memory nonlinear.

The linear filtering module 4 is configured to receive a feed-forward radio frequency signal, perform linear filtering on the feed-forward radio frequency signal according to a linear filtering coefficient, and output, to the ZMNL module 5, a radio frequency signal obtained after the linear filtering. The radio frequency signal obtained after the linear filtering is referred to as a linear premodulated signal.

The ZMNL module 5 is configured to receive the linear premodulated signal output by the linear filtering module 4, and perform nonlinear processing on the linear premodulated signal according to a ZMNL coefficient, to generate a predistortion signal.

The linear filtering coefficient and the ZMNL coefficient are output by the APD training module C to the APD core module B. The feed-forward radio frequency signal is output by an input end of an analog predistorter system to the APD core module B.

Preferably, for an internal block diagram of the linear filtering module 4 and the ZMNL module 5, refer to FIG. 3-2.

The linear filtering module 4 includes P−1 radio frequency delay units RFDs, P DVMs (Digital Vector Modulator), and a linear adder. The P−1 radio frequency delay units RFDs are respectively an $RFD_{in1}$, an $RFD_{in2}$, ..., and an $RFD_{inP-1}$. The P digital vector modulator units DVMs are respectively a $DVM_{in1}$, a $DVM_{in2}$, ..., and a $DVM_{inP}$, and P is a preset integer. The $RFD_{in1}$, the $RFD_{in2}$, ..., and the $RFD_{inP-1}$ are sequentially connected in series. The feed-forward radio frequency signal is sent to an input end of the $RFD_{in1}$ and an input end of the $DVM_{in1}$. Output ends of the $RFD_{in2}$, ..., and the $RFD_{inP-1}$ are respectively connected to input ends of the $DVM_{in2}$, the $DVM_{in3}$, ..., and the $DVM_{inP}$. Output ends of the $DVM_{in1}$, the $DVM_{in2}$, ..., and the $DVM_{inP}$ are all connected to an input end of the linear adder 41.

The $RFD_{in1}$ is configured to receive a feed-forward radio frequency signal x(t), delay the feed-forward radio frequency signal x(t) to obtain a first radio frequency delay signal $x(t-\tau_{RFx1})$, and output the first radio frequency delay signal $x(t-\tau_{RFx1})$ to the $RFD_{in2}$ and the $DVM_{in2}$, where $\tau_{RFx1}$ is a delay generated by the $RFD_{in1}$.

The $RFD_{inp}$ is configured to receive a $(p-1)^{th}$ radio frequency delay signal $x(t-\tau_{RFxp-1})$ output by the $RFD_{inp-1}$, delay the $(p-1)^{th}$ radio frequency delay signal $x(t-\tau_{RFxp-1})$ to obtain a $p^{th}$ radio frequency delay signal $x(t-\tau_{RFxp})$, and output the $p^{th}$ radio frequency delay signal $x(t-\tau_{RFxp})$ to the $RFD_{inp+1}$ and the $DVM_{inp+1}$, where $\tau_{RFxp}$ is a delay jointly generated by the $RFD_{in1}$, the $RFD_{in2}$, ..., and the $RFD_{inp}$, and p=2, 3, ..., P−2.

The $RFD_{inP-1}$ is configured to receive a $(P-2)^{th}$ radio frequency delay signal $x(t-\tau_{RFxP-2})$ output by the $RFD_{inP-2}$, delay the $(P-2)^{th}$ radio frequency delay signal $x(t-\tau_{RFxP-2})$ to obtain a $(P-1)^{th}$ radio frequency delay signal $x(t-\tau_{RFxP-1})$, and output the $(P-1)^{th}$ radio frequency delay signal $x(t-\tau_{RFxP-1})$ to the $DVM_{inP}$, where $\tau_{RFxP-1}$ is a delay jointly generated by the $RFD_{in1}$, the $RFD_{in2}$, ..., and the $RFD_{inP-1}$.

The APD training module C generates corresponding predistortion coefficients for the $DVM_{in1}$, the $DVM_{in2}$, ..., and the $DVM_{inP}$. The predistortion coefficients corresponding to the $DVM_{in1}$, the $DVM_{in2}$, ..., and the $DVM_{inP}$ are respectively $c_{FIRin,1}$, $c_{FIRin,2}$, ..., and $c_{FIRin,P}$. $c_{FIRin,p}$ is a complex number, and $c_{FIRin,p}=c_{FIRin,p,i}+jc_{FIRin,p,q}$, where $c_{FIR,p,i}$ and $c_{FIR,p,q}$ are real numbers.

The $DVM_{in1}$ is configured to receive the feed-forward radio frequency delay signal $x(t)$ and the predistortion coefficient $c_{FIRin,1}$ input from exterior, perform, according to the predistortion coefficient $c_{FIRin,1}$, amplitude conversion and phase conversion on the feed-forward radio frequency delay signal $x(t)$ to obtain an output signal $u_1(t)$, and send the output signal $u_1(t)$ to the linear filtering adder 41.

The $DVM_{inp}$ is configured to receive the $(p-1)^{th}$ radio frequency delay signal $x(t-\tau_{RFxp-1})$ and the predistortion coefficient $c_{FIRin,p}$ input from exterior, perform, according to the predistortion coefficient $c_{FIRin,p}$, amplitude conversion and phase conversion on the $(p-1)^{th}$ radio frequency delay signal $x(t-\tau_{RFxp-1})$ to obtain an output signal $u_p(t)$, and send the output signal $u_p(t)$ to the linear filtering adder 41, where $p=2, 3, \ldots, P$.

Specific processing performed by the $DVM_{in1}$ to the $DVM_{inP}$ on input signals may be represented by using a formula $u_p(t)=c_{FIRin,p,i}x(t-\tau_{RFxp-1})-c_{FIRin,p,q}\hat{x}(t-\tau_{RFxp-1})$. $\hat{x}(t-\tau_{RFxp-1})$ represents Hilbert transform of $x(t-\tau_{RFxp-1})$, that is, a signal obtained after −90-degree phase shift, where $p=1, 2, \ldots, P$. For description of a detailed process, refer to a description part of the DVM.

The linear adder is configured to receive output signals $u_1(t)$, $u_2(t)$, ..., and $u_P(t)$ output by the $DVM_{in1}$, the $DVM_{in2}$, ..., and the $DVM_{inP}$, and add the output signals to obtain the linear premodulated signal. The linear premodulated signal is $$\sum_{p=1}^{P} u_p(t).$$

Referring to FIG. 3-3, a DVM structure is shown. The following description of a block diagram and a working process of a DVM are applicable to all the $DVM_{in1}$, the $DVM_{in2}$, ..., and the $DVM_{inP}$. The DVM includes a QPS 421, an in-phase multiplier 422, a quadrature multiplier 423, and a subtractor 424.

A connection relationship and an internal block diagram of the QPS 421 are the same as those of the foregoing QPS 3271. Details are not repeatedly described.

A first output end of the QPS 421 is connected to an input end of the in-phase multiplier 422, and a second output end is connected to an input end of the quadrature multiplier 423. An output end of the in-phase multiplier 422 is connected to a first input end of the subtractor 424. An output end of the quadrature multiplier 423 is connected to a second input end of the subtractor 424. An output end of the subtractor 424 is connected to the linear filtering adder 41.

The QPS 421 included in the DVM is configured to receive the $p^{th}$ radio frequency delay signal $x(t-\tau_{RFxp})$; divide the $p^{th}$ radio frequency delay signal $x(t-\tau_{RFxp})$ into a radio frequency signal $x(t-\tau_{RFxp})$ on a 0-degree and a radio frequency signal $\hat{x}(t-\tau_{RFxp})$ on a −90-degree, where a phase difference between the two radio frequency signals is 90 degrees; and output the radio frequency signal $x(t-\tau_{RFxp})$ on the 0-degree and the radio frequency signal $\hat{x}(t-\tau_{RFxp})$ on the −90-degree respectively to the in-phase multiplier 422 and the quadrature multiplier 423.

The following describes a working principle of the DVM by using the $DVM_{inp}$ as an example, and p is a specific number in 1, 2, ..., P.

A linear filtering coefficient generated and configured by the APD training module C for the $DVM_{inp}$ is $c_{FIRin,p}=c_{FIRin,p,i}+jc_{FIRin,p,q}$, where $c_{FIRin,p,i}$ and $c_{FIRin,p,q}$ are real numbers. $c_{FIRin,p,i}$ and $c_{FIRin,p,q}$ are respectively referred to as an in-phase coefficient and a quadrature coefficient. Therefore, it may be considered that the linear filtering coefficient actually configured by the APD training module C for the $DVM_{inp}$ is two real numbers: $c_{FIRin,p,i}$ and $c_{FIRin,p,q}$.

The in-phase coefficient $c_{FIRin,p,i}$ and the quadrature coefficient $c_{FIRin,p,q}$ that are input to the DVM are digital parameters, but the radio frequency signal input to the DVM is an analog parameter. This is the reason why the DVM is referred to as a digital vector modulator, that is, the digital vector modulator. The in-phase multiplier 422 and the quadrature multiplier 423 complete multiplication of the digital parameters and the radio frequency signal. The DVM outputs a radio frequency signal.

The in-phase multiplier 422 is configured to receive the radio frequency signal $x(t-\tau_{RFxp-1})$ on the 0-degree and the in-phase coefficient $c_{FIRin,p,i}$, multiply the radio frequency signal $x(t-\tau_{RFxp-1})$ on the 0-degree by the in-phase coefficient $c_{FIRin,p,i}$ to obtain an in-phase product signal $c_{FIRin,p,i}x(t-\tau_{RFxp-1})$, and output the in-phase product signal $c_{FIRin,p,i}x(t-\tau_{RFxp-1})$ to the subtractor 424.

The quadrature multiplier 423 is configured to receive the radio frequency signal $\hat{x}(t-\tau_{RFxp-1})$ on the −90-degree and the quadrature coefficient $c_{FIRin,p,q}$, multiply the radio frequency signal $\hat{x}(t-\tau_{RFxp-1})$ on the −90-degree by the quadrature coefficient $c_{FIRin,p,q}$ to obtain a quadrature product signal $c_{FIRin,p,q}\hat{x}(t-\tau_{RFxp-1})$, and output the quadrature product signal $c_{FIRin,p,q}\hat{x}(t-\tau_{RFxp-1})$ to the subtractor 424.

The subtractor 424 is configured to subtract the quadrature product signal $c_{FIRin,p,q}\hat{x}(t-\tau_{RFxp-1})$ from the in-phase product signal $c_{FIRin,p,i}x(t-\tau_{RFxp-1})$, to obtain a $p^{th}$ tap signal $u_p(t)$, that is, the DVM radio frequency signal output by the DVM unit is $u_p(t)=c_{FIRin,p,i}x(t-\tau_{RFxp-1})-c_{FIRin,p,q}\hat{x}(t-\tau_{RFxp-1})$.

Signals $u_1(t)$, $u_2(t)$, ..., $u_P(t)$ that are output by the P DVM units $DVM_{in1}$, $DVM_{in2}$, ..., and $DVM_{inP}$ are added in the linear filtering adder 41, to obtain the output linear premodulated signal $v(t)$ of the linear filtering module, where $$v(t) = \sum_{p=1}^{P} u_p(t) = \sum_{p=1}^{P} c_{FIRin,p,i}x(t-\tau_{RFxp-1}) - c_{FIRin,p,q}\hat{x}(t-\tau_{RFxp-1}).$$

The linear premodulated signal is a radio frequency signal output by the linear filtering module, that is, a radio frequency signal input to the ZMNL module.

Referring to FIG. 3-2, the ZMNL module 5 includes an envelope detection unit ED and a signal lookup table unit SL. An input end of the ZMNL module and an input end of the ED are connected to a radio frequency input end x of the SL. An output end of the ED is connected to an envelope input end y of the SL. An output end of the SL is an output end of the ZMNL.

A connection relationship and an internal block diagram of the ED are the same as the foregoing description. Details are not repeatedly described. The ED is configured to perform envelope detection on the linear premodulated signal v(t) output by the linear filter to generate an envelope signal, and output the envelope signal to the SL. Assuming that an envelope of v(t) is $r_v(t)$, the signal output by the ED is $r_v(t)$.

According to a design, the ED may output a square of the envelope of the linear premodulated signal v(t). That is, the signal output by the ED is $r_v^2(t)$.

The following description is based on a fact that the signal output by the ED is $r_v(t)$. Actually, the signal output by the ED may be $r_v^2(t)$, but a description manner needs to be correspondingly modified. Details are not described.

The SL is configured to receive the linear premodulated signal v(t) output by the linear filter, the envelope signal output by the ED, and predistortion coefficients $c_{SL,1} \sim c_{SL,K}$ input from exterior, where $c_{SL,1} \sim c_{SL,K}$ are K complex numbers, $c_{SL,k} = c_{SL,k,i} + j c_{SL,k,q}$, and $c_{SL,k,i}$ and $c_{SL,k,q}$ are real numbers. Amplitude conversion and phase conversion are performed on the linear premodulated signal v(t) according to the predistortion coefficients and the envelope signal, to obtain the predistortion signal z(t). K herein represents a quantity of basis functions used in the SL, and k=1, 2, . . . , K.

Referring to FIG. 3-4, the SL module 5 includes an in-phase LUT 521, a quadrature LUT 522, and an AVM unit. The radio frequency signal input end x of the SL is connected to an input end of the AVM. The envelope signal input end y of the SL is connected to an envelope input end of the in-phase LUT and an envelope input end of the quadrature LUT. The in-phase LUT 521 and the quadrature LUT 522 further receive a ZMNL coefficient from the APD training module C. An output end of the in-phase LUT 521 and an output end of the quadrature LUT 522 are respectively connected to an in-phase modulation signal input end of the AVM and a quadrature modulation signal input end of the AVM. An output end of the AVM unit is an output end of the SL module.

The ZMNL coefficient generated and configured by the APD training module C for the SL is $c_{SL,k} = c_{SL,k,i} + j c_{SL,k,q}$, where $c_{SL,k,i}$ and $c_{SL,k,q}$ are real numbers, and k=1, 2, . . . , K. Therefore, it may be considered that the ZMNL coefficient actually configured by the APD training module C for the SL is 2K real numbers.

Working principles and internal block diagrams of the in-phase LUT 521 and the quadrature LUT 522 are the same as the foregoing description. A working principle and an internal block diagram of the AVM 523 are the same as those of the AVM 327. Details are not repeatedly described.

The in-phase LUT 521 receives the envelope signal $r_v(t)$ and in-phase LUT coefficients $c_{SL,1,i} \sim c_{SL,K,i}$, where the in-phase LUT 521 has K basis function generation units that are used to generate K basis functions $s_k(r_v(t))$, k=1, 2, . . . , K, so as to generate an in-phase modulation signal $$\sum_{k=1}^{K} c_{SL,k,i} s_k(r_v(t)).$$

Then, the in-phase LUT 521 outputs the in-phase modulation signal $$\sum_{k=1}^{K} c_{SL,k,i} s_k(r_v(t))$$

to the in-phase modulation signal input end of the AVM 523.

The quadrature LUT 522 receives the envelope signal $r_v(t)$ and quadrature LUT coefficients $c_{SL,1,q} \sim c_{SL,K,q}$, where the quadrature LUT 522 has K basis function generation units that are used to generate K basis functions $s_k(r_v(t))$, k=1, 2, . . . , K, so as to generate a quadrature modulation signal $$\sum_{k=1}^{K} c_{SL,k,q} s_k(r_v(t)).$$

Then, the quadrature LUT 522 outputs the quadrature modulation signal $$\sum_{k=1}^{K} c_{SL,k,q} s_k(r_v(t))$$

to the quadrature modulation signal input end of the AVM 523.

The AVM 523 receives the linear premodulated signal v(t) output by the linear filtering module, perform amplitude modulation and phase modulation on v(t) according to the in-phase modulation signal $$\sum_{k=1}^{K} c_{SL,k,i} s_k(r_v(t))$$

and the quadrature modulation signal $$\sum_{k=1}^{K} c_{SL,k,q} s_k(r_v(t)),$$

to obtain an output radio frequency signal $$z(t) = v(t) \sum_{k=1}^{K} c_{SL,k,i} s_k(r_v(t)) - \hat{v}(t) \sum_{k=1}^{K} c_{SL,k,q} s_k(r_v(t))$$

of the AVM, where $\hat{v}(t)$ represents Hilbert transform of the v(t), that is, a signal obtained after −90-degree phase shift is performed on the v(t). The output radio frequency signal z(t) of the AVM is an output signal of the APD core module, that is, the predistortion signal.

Figures 2, 3, 4, 5:
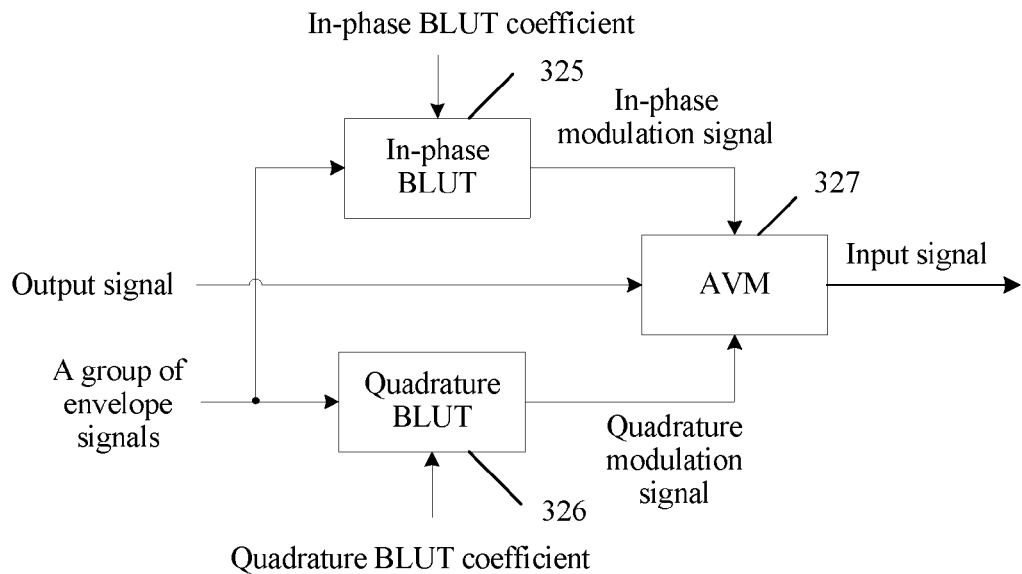

Further, referring to FIG. 3-5, a second embodiment of the cascaded model of the APD core module B includes a linear filtering module 6, a ZMNL module 7, and a broadband linear filtering module 8.

Figures 2, 3, 4, 5, 6:
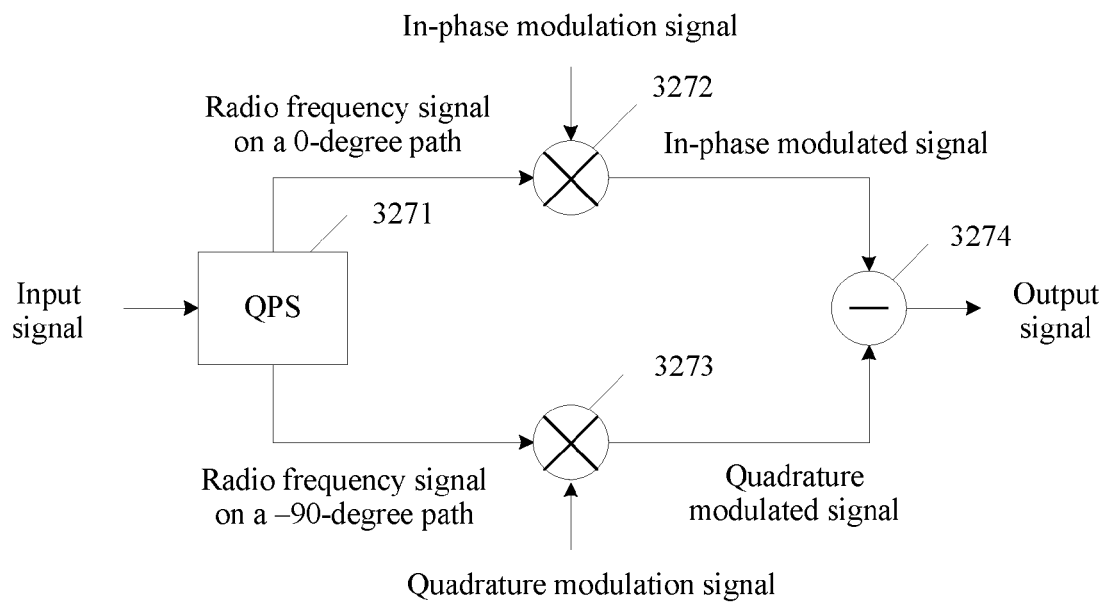
Figures 2, 3, 4, 5, 6, 7, 7A:
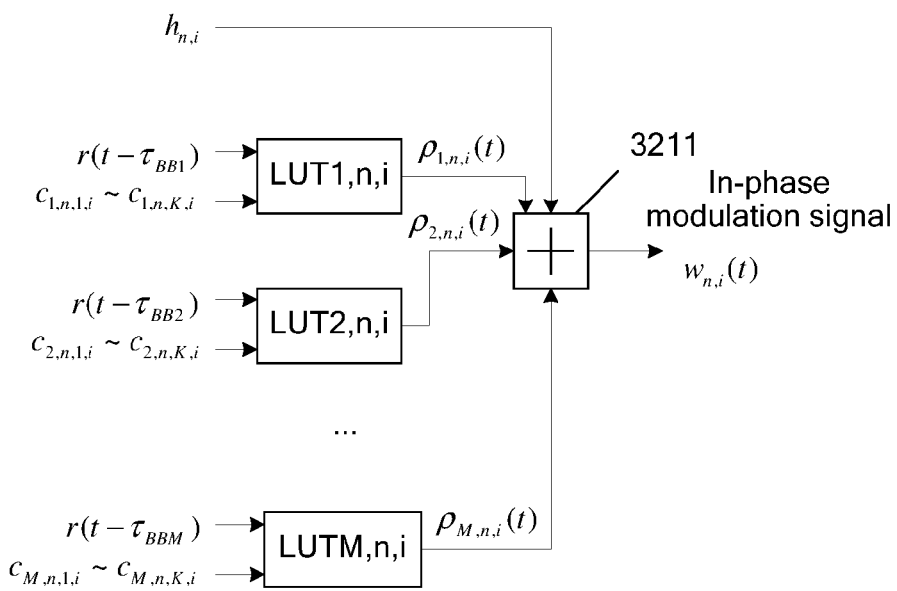
Figures 2, 3, 4, 5, 6, 7, 7B:
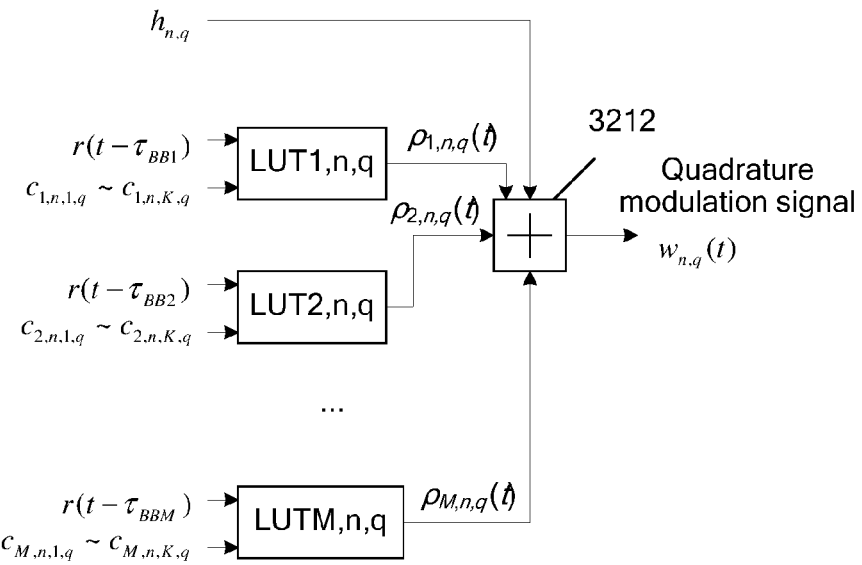
Figures 2, 3, 4, 5, 6, 7, 8, 8A:
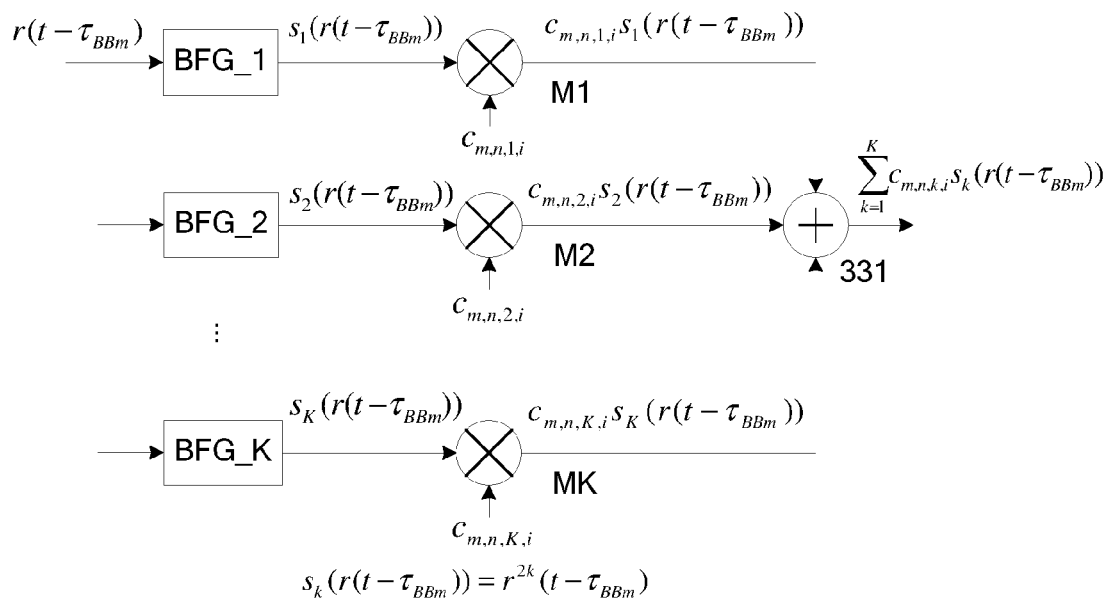
Figures 2, 3, 4, 5, 6, 7, 8, 8B:
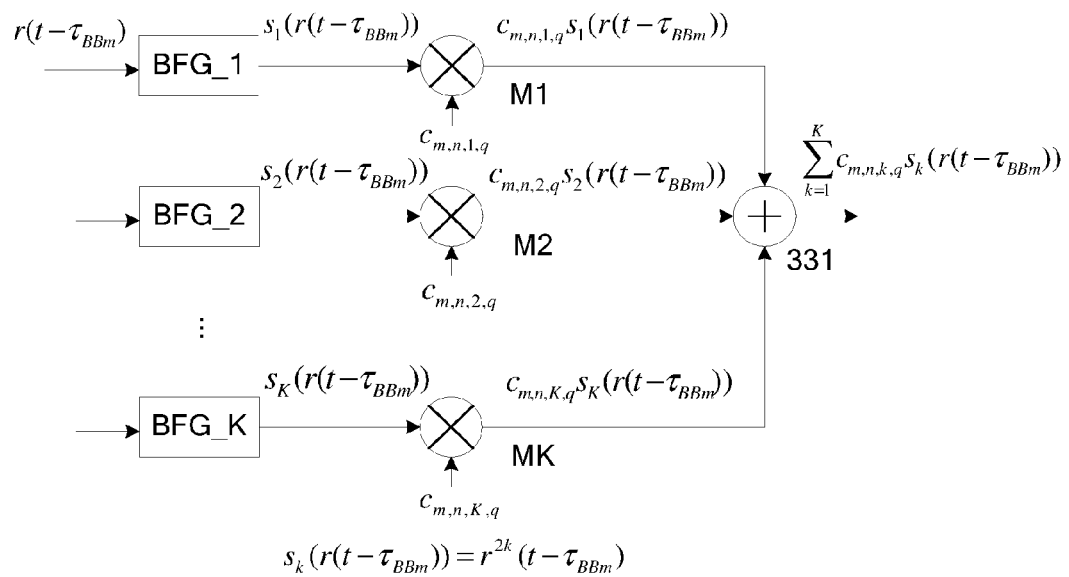
Figures 1, 3:
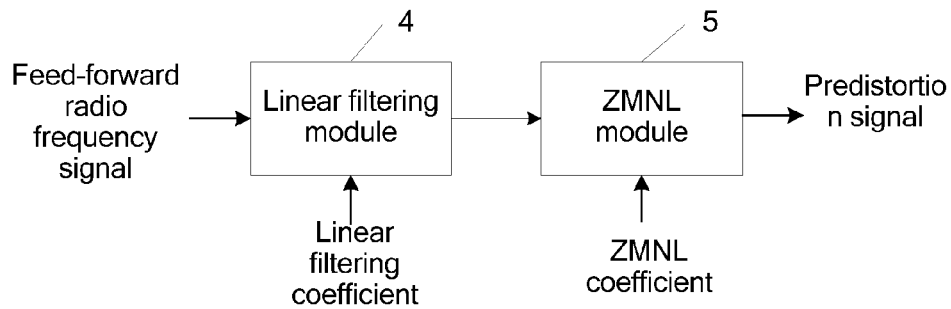
Figures 2, 3:
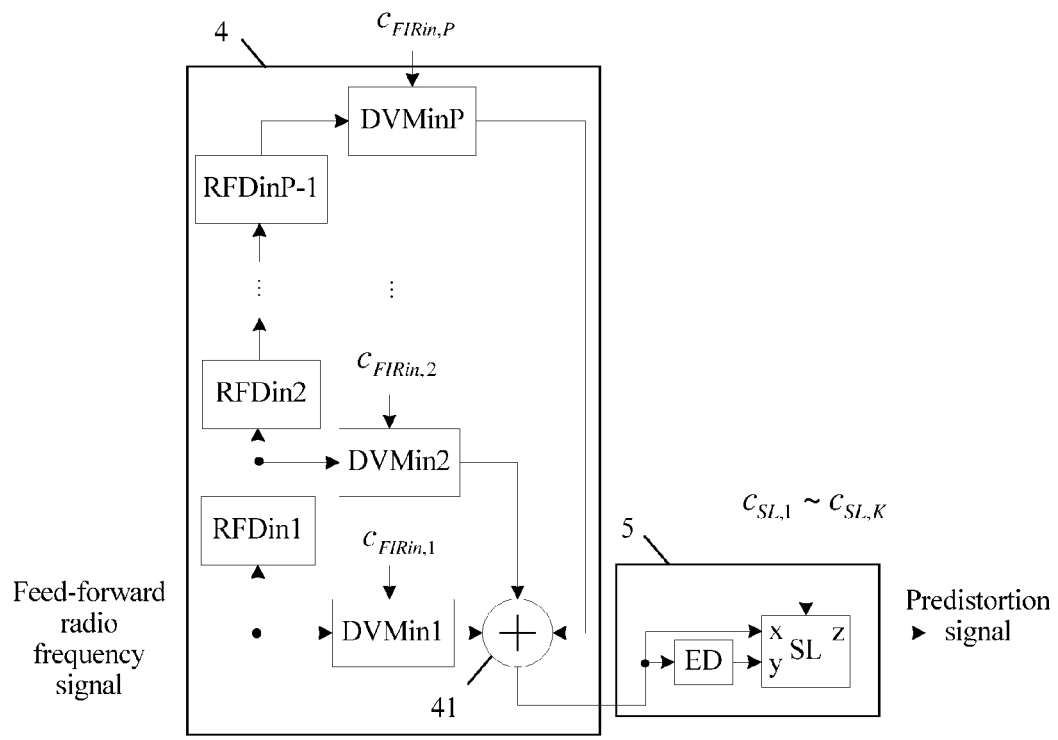
Figure 3:
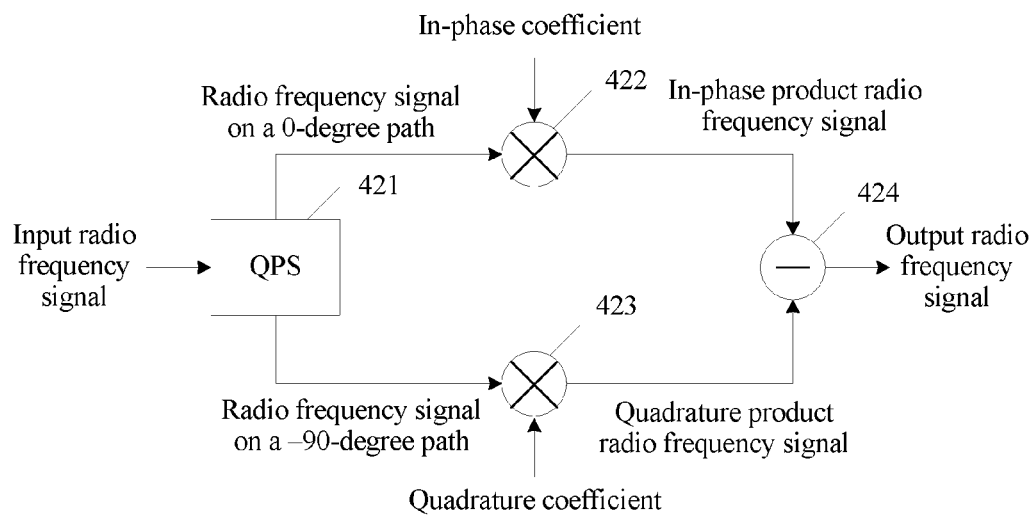
Figures 3, 4:
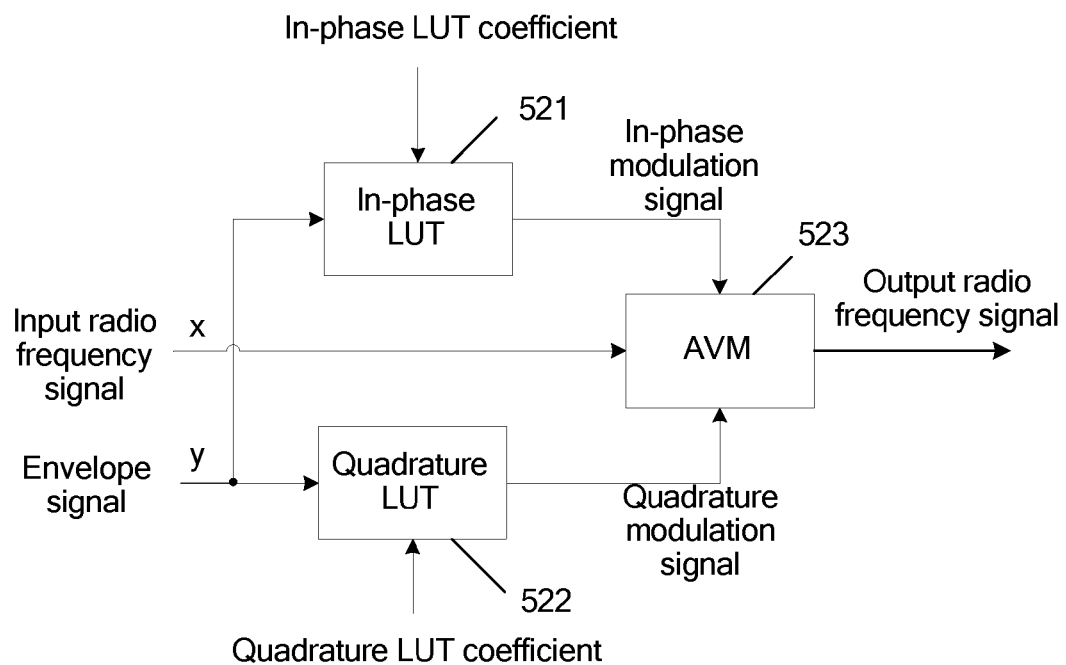
Figures 3, 4, 5:
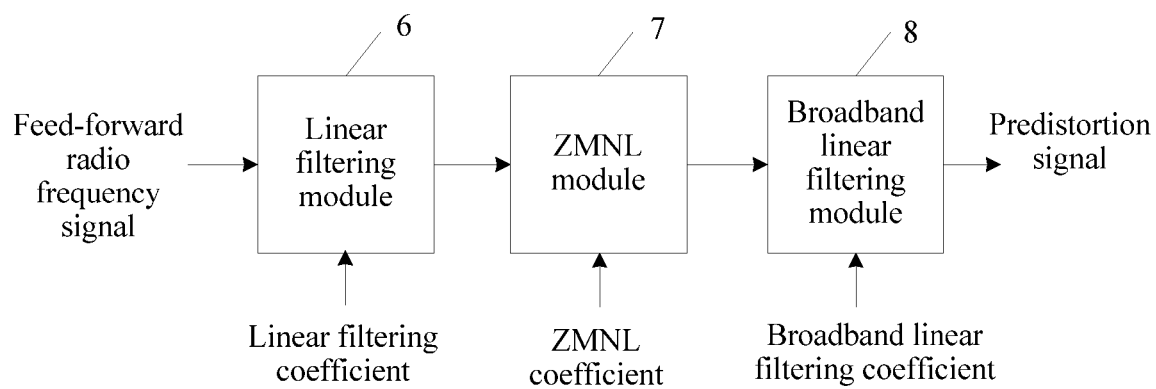
Figures 3, 4, 5, 6:
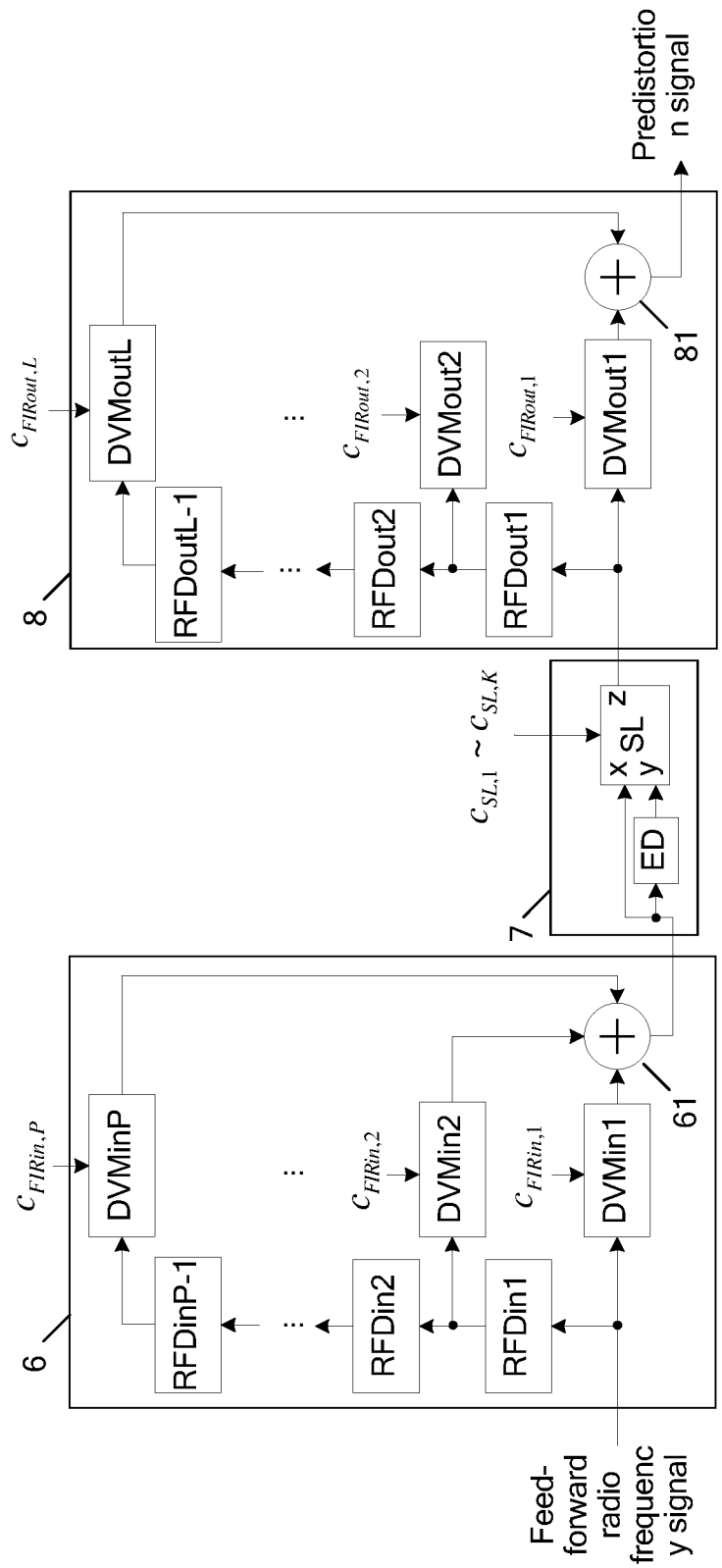
Figures 3, 4, 5, 6, 7:
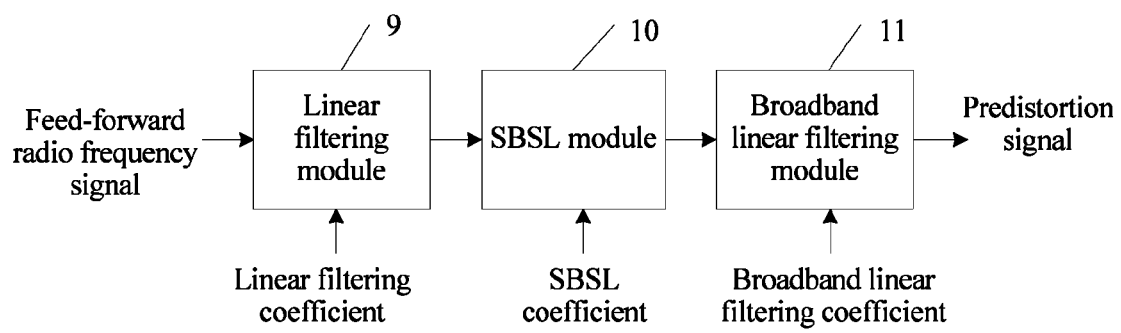
Figures 3, 4, 5, 6, 7, 8:
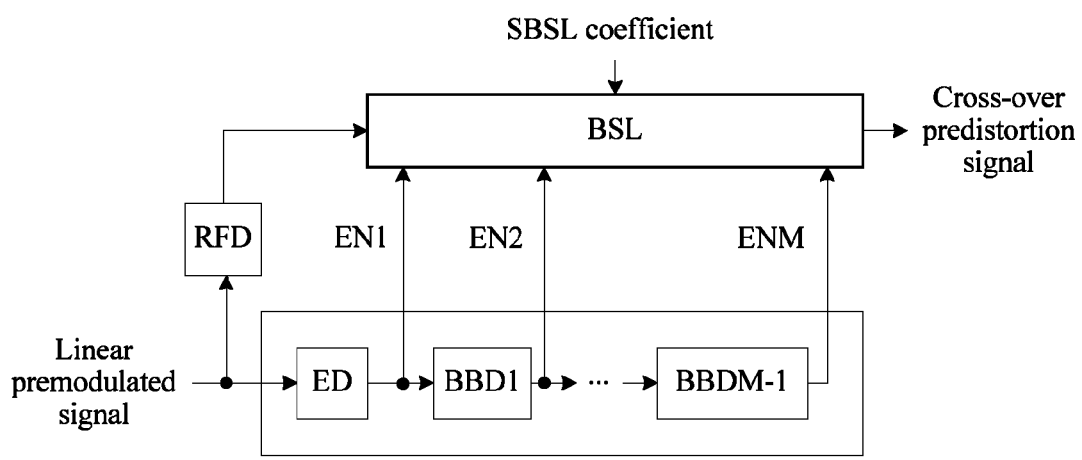

For internal block diagrams of the linear filtering module 6, the ZMNL module 7, and the broadband linear filtering module 8, refer to FIG. 4-6.

A working principle of the linear filtering module 6 and a working principle of the ZMNL module 7 are respectively the same as that of the linear filtering module 4 and that of the ZMNL module 5. Details are not repeatedly described.

The broadband linear filtering module 8 has a same form as the linear filtering module 4. A difference is that processing bandwidth of each corresponding unit in the broadband linear filtering module 8 is wider than processing bandwidth in the linear filtering module 4. In an example in which bandwidth of the feed-forward radio frequency signal x(t) is 100 MHZ, and bandwidth of a signal output by the SL is generally not less than 500 MHZ. Correspondingly, in this case, bandwidth of a signal processed by the linear filtering module 4 is 100 MHZ, and bandwidth of a signal processed by the broadband linear filtering module 8 is not less than 500 MHZ. This requires that a circuit design of the broadband linear filtering module 8 is different from that of the linear filtering module 4.

Specifically, radio frequency delay units in the broadband linear filtering module 8 are respectively an $RFD_{out1}$, an $RFD_{out2}$, ..., and an $RFD_{outL}$. There are L radio frequency delay units $RFD_{out}$ in total, and bandwidth of each $RFD_{out}$ is greater than that of an $RFD_{in}$. Correspondingly, there are L digital vector modulator units $DVM_{out}$, and bandwidth of each $DVM_{out}$ is greater than that of a $DVM_{in}$. A circuit connection relationship and a working principle of the broadband linear filtering module 8 are similar to those of the linear filtering module 4. Details are not repeatedly described.

The linear filtering module 6 processes a feed-forward radio frequency signal according to a linear filtering coefficient input by the APD training module C, and outputs a linear premodulated signal.

The ZMNL module 7 processes the linear premodulated signal according to a ZMNL coefficient input by the APD training module C, and outputs a middle predistortion signal.

The broadband linear filtering module 8 processes, according to a broadband linear filtering coefficient input by the APD training module C, the middle predistortion signal input by the ZMNL module 7, and outputs a predistortion signal.

Further, referring to FIG. 3-7, a third embodiment of the cascaded model of the APD core module B includes a linear filtering module 9, an SBSL (Single Block Signal LUT) module 10, and a broadband linear filtering module 11.

For internal block diagrams of the linear filtering module 9, the SBSL module 10, and the broadband linear filtering module 11, refer to FIG. 4-6.

A working principle of the linear filtering module 9 and a working principle of the broadband linear filtering module 11 are respectively the same as that of the linear filtering module 4 and that of the broadband linear filtering module 8. Details are not repeatedly described.

The SBSL in the SBSL module 10 refers to a single block signal LUT, that is, an acronym of a single BSL. For an internal block diagram of the SBSL module 10, refer to FIG. 3-8. It can be seen that the SBSL module 10 is actually a specific example of a contact matrix module that includes only a single BSL. For a working principle of the SBSL module 10, reference may be made to the contact matrix module. Details are not repeatedly described.

The linear filtering module 9 processes a feed-forward radio frequency signal according to a linear filtering coefficient input by the APD training module C, and outputs a linear premodulated signal.

The SBSL module 10 processes the linear premodulated signal according to an SBSL coefficient input by the APD training module C, and outputs a middle predistortion signal.

The broadband linear filtering module 11 processes, according to a broadband linear filtering coefficient input by the APD training module C, the middle predistortion signal input by the SBSL module 10, and outputs a predistortion signal.

According to the second type of the APD model in the present invention, that is, the cascaded model, a linear filtering module and a ZMNL module are cascaded with each other, or a linear filtering module, a ZMNL module, and a broadband linear filtering module are cascaded with one another, or a linear filtering module, an SBSL module, and a broadband linear filtering module are cascaded with one another. An APD core module in the cascaded model generates a nonlinear memory predistortion characteristic by configuring an appropriate coefficient. Therefore, when a PA has a distortion characteristic that is contrary to the predistortion characteristic of the APD core module, distortion generated by the PA can be effectively offset, so that a signal output by the PA is the same as a signal input to the APD core module.

The fourth part of the present invention is a basis function in the present invention, that is, a ramp basis function.

It should be noted first that the basis function in the present invention, that is, the ramp basis function, is independent of the foregoing APD model in the present invention. The APD model includes the foregoing first APD model, that is, the matrix model, and the foregoing second APD model, that is, the cascaded model. That is, the ramp basis function can be applied to the first APD model and the second APD model in the present invention, and can be further applied to an APD model in the prior art or another APD model invented in the future.

Figures 1A, 4:
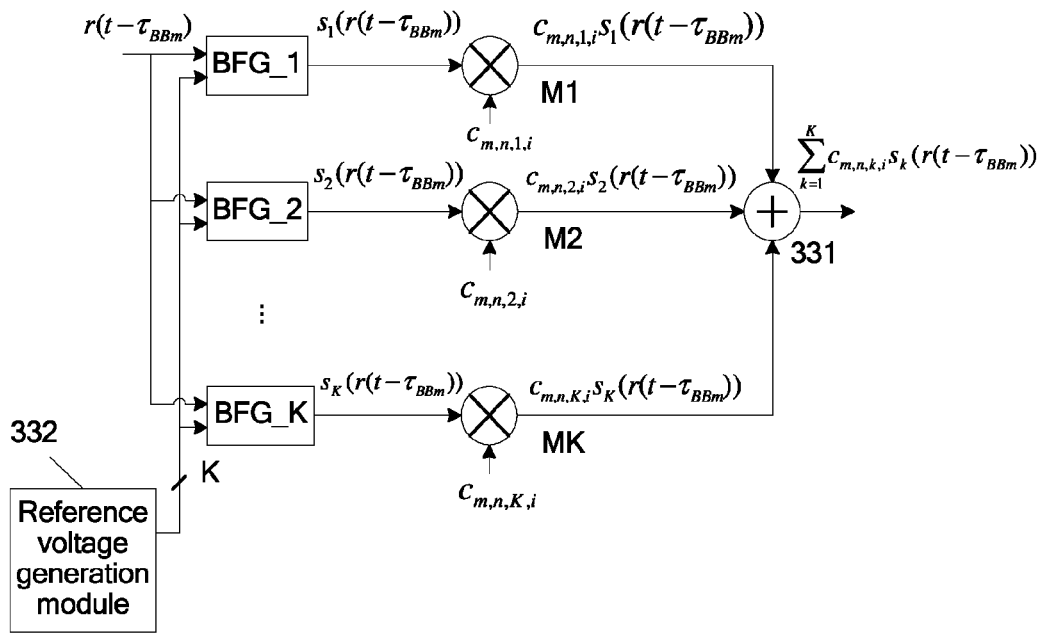
Figures 1B, 4:
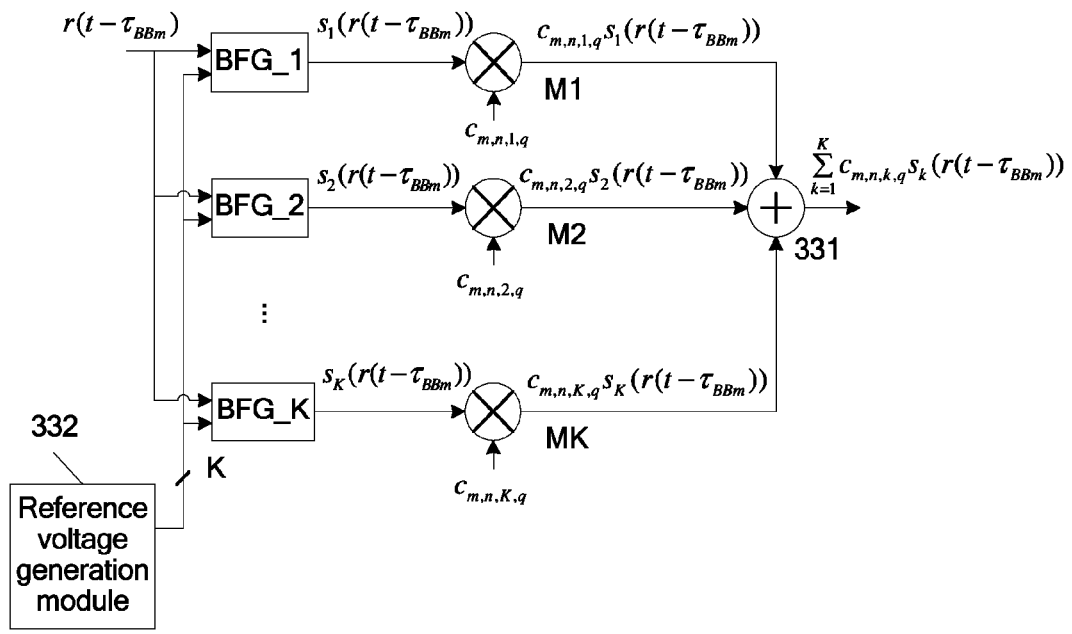
Figures 2, 4:
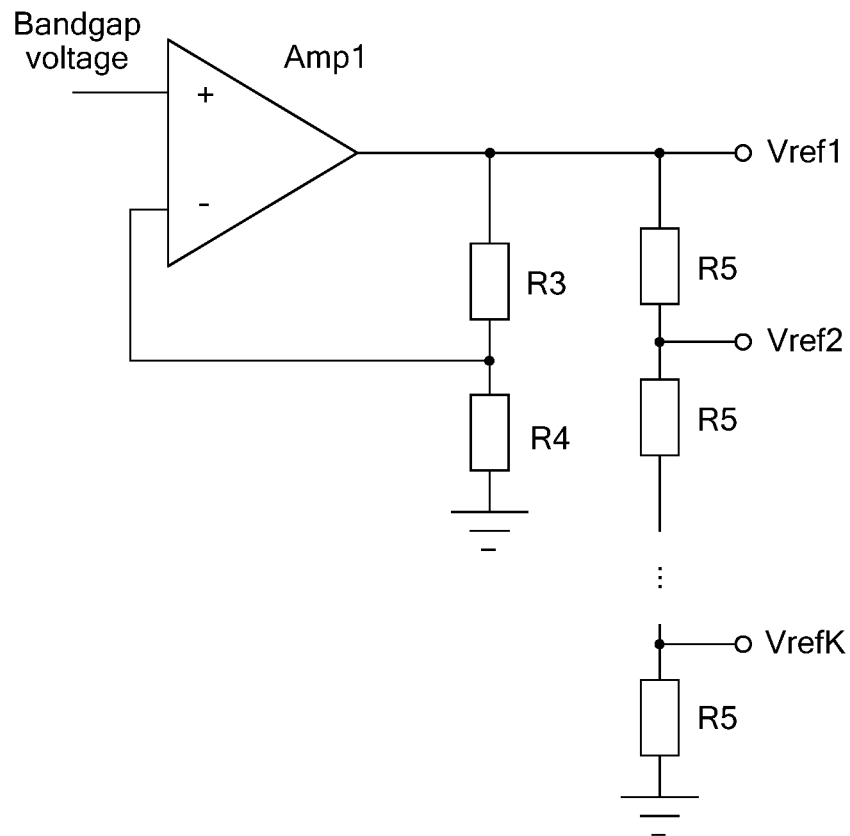
Figures 3, 4:
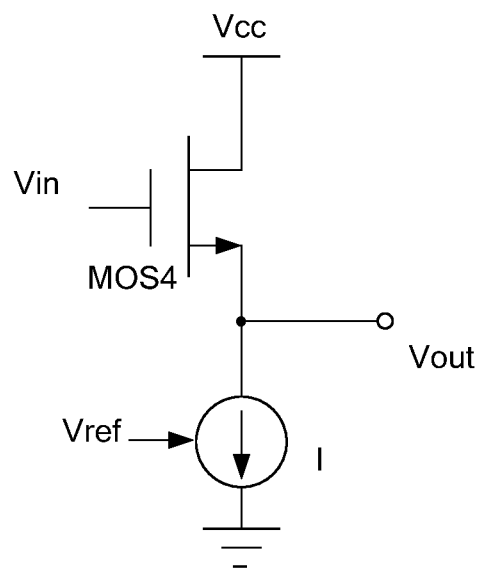
Figure 4:
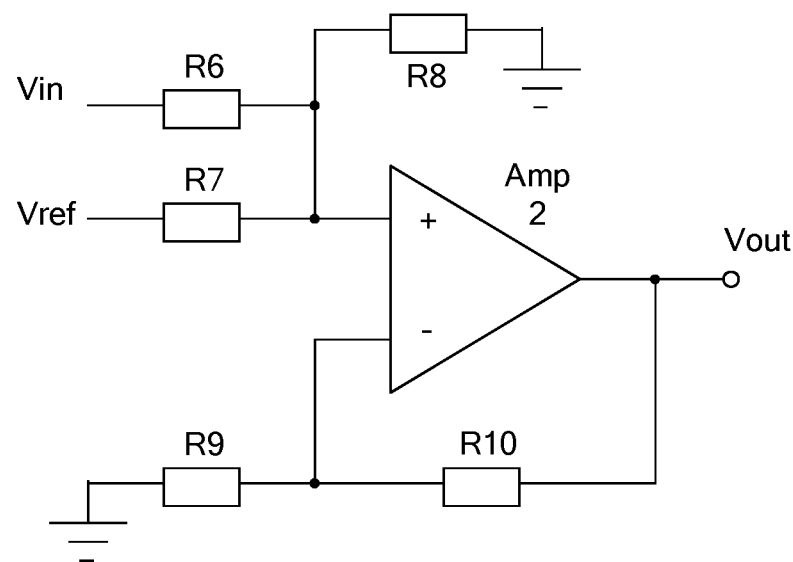
Figures 4, 5:
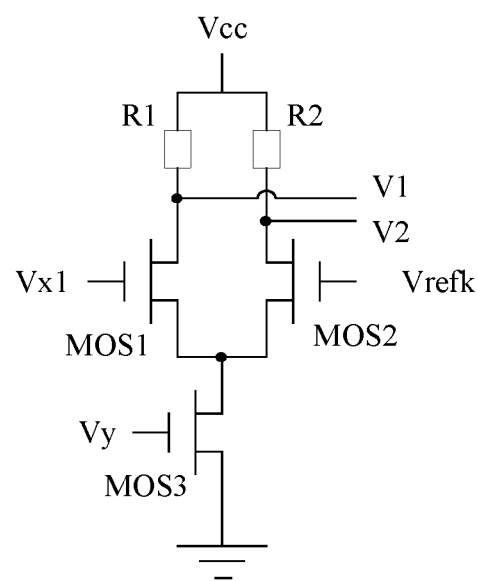
Figures 4, 5, 6:
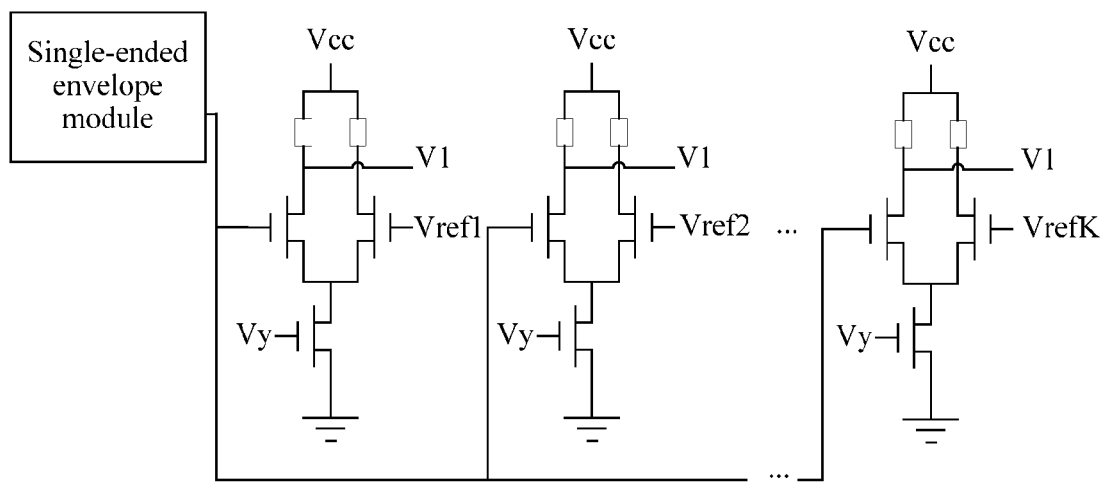
Figures 4, 5, 6, 7:
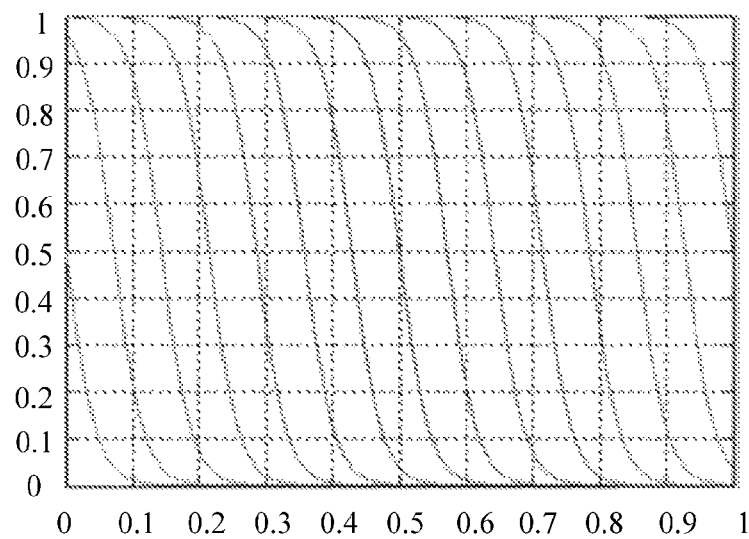
Figures 4, 5, 6, 7, 8:
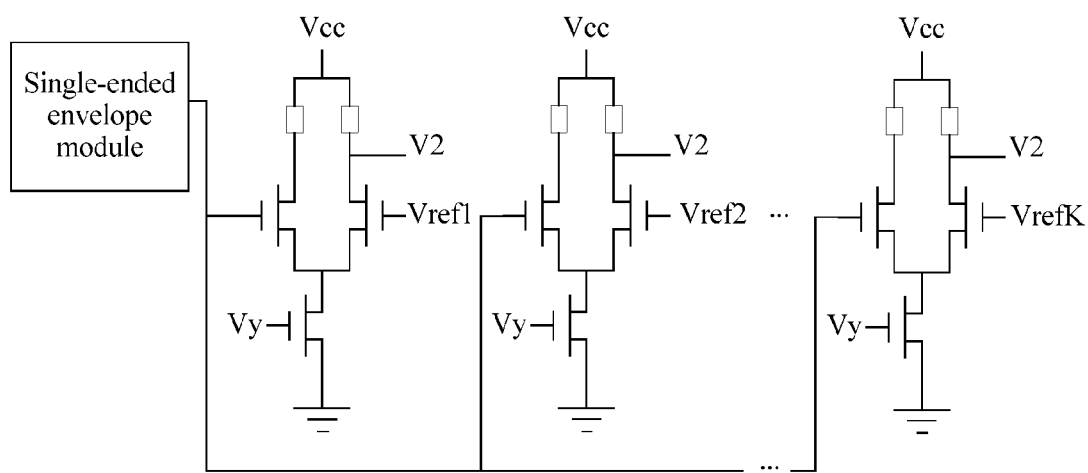
Figures 4, 5, 6, 7, 8, 9:
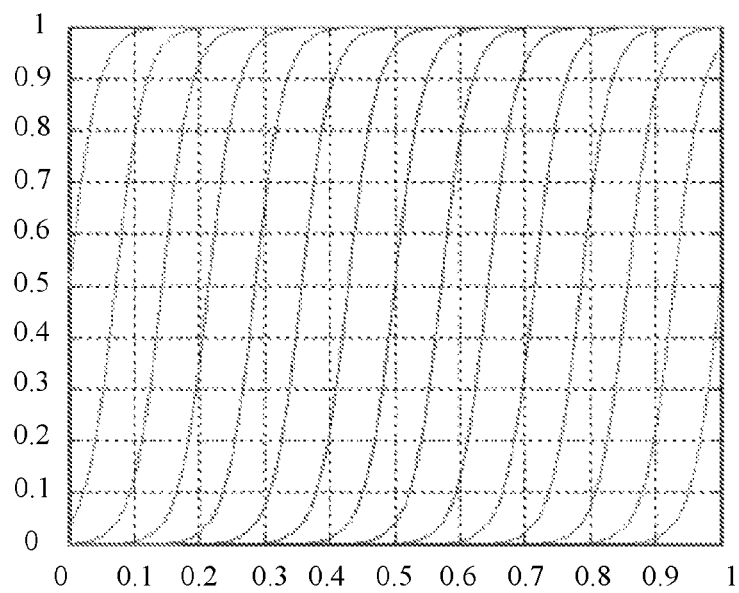
Figures 4, 5, 6, 7, 8, 9, 10:
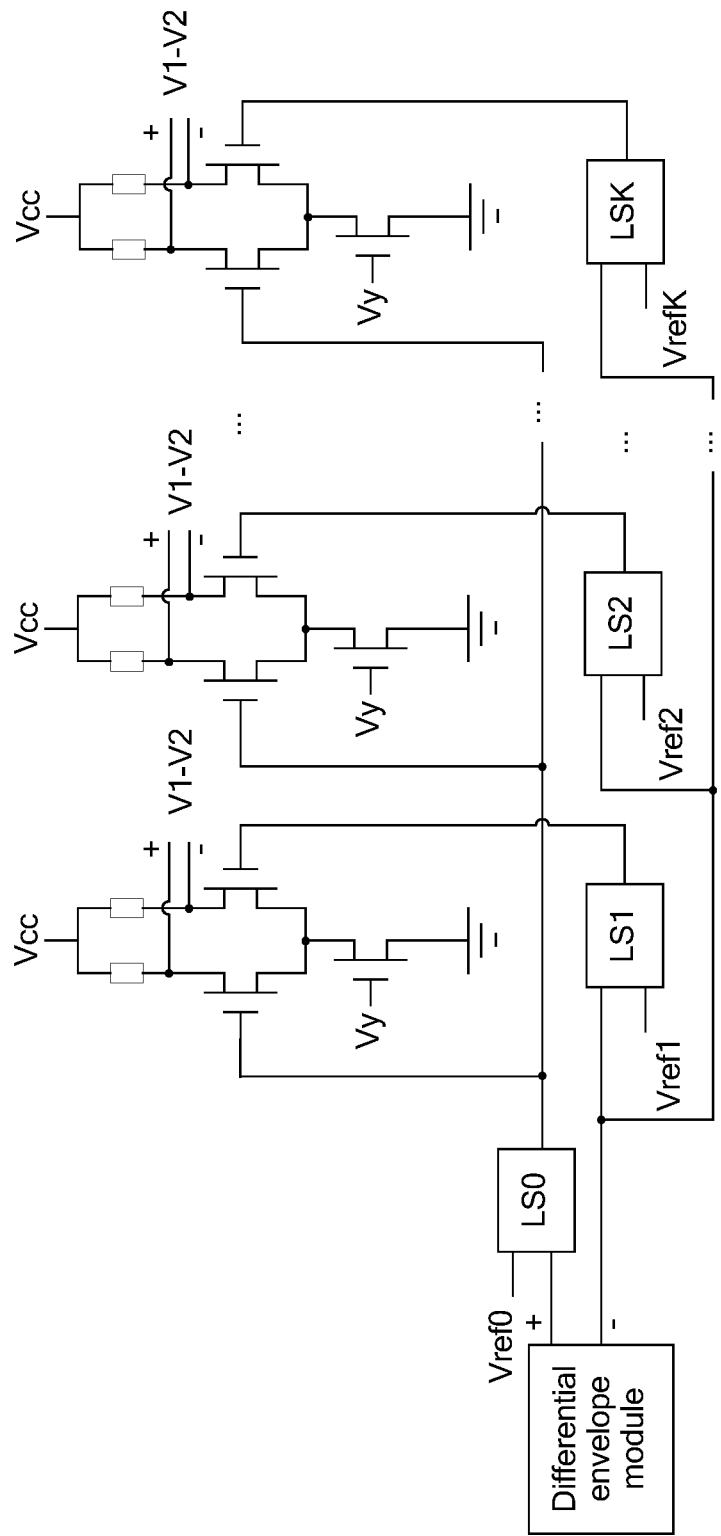
Figures 4, 5, 6, 7, 8, 9, 10, 11:
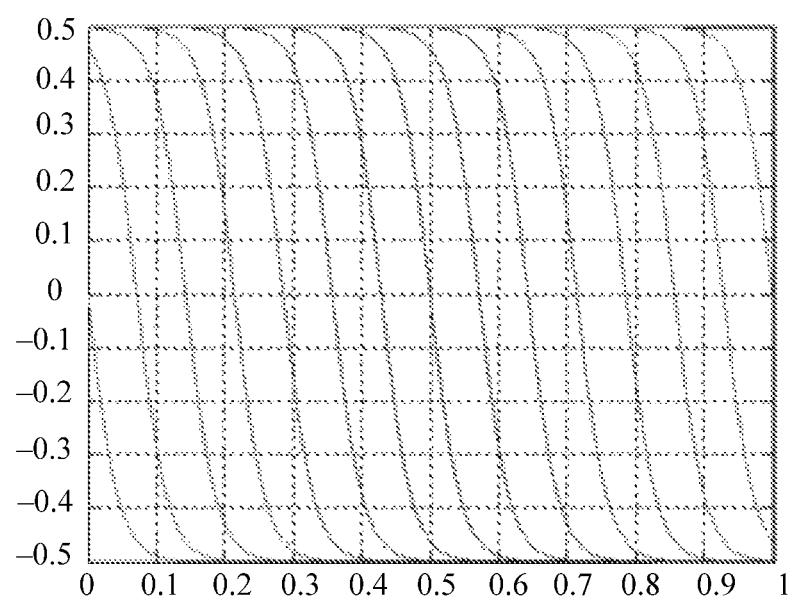
Figures 4, 5, 6, 7, 8, 9, 10, 11, 12:
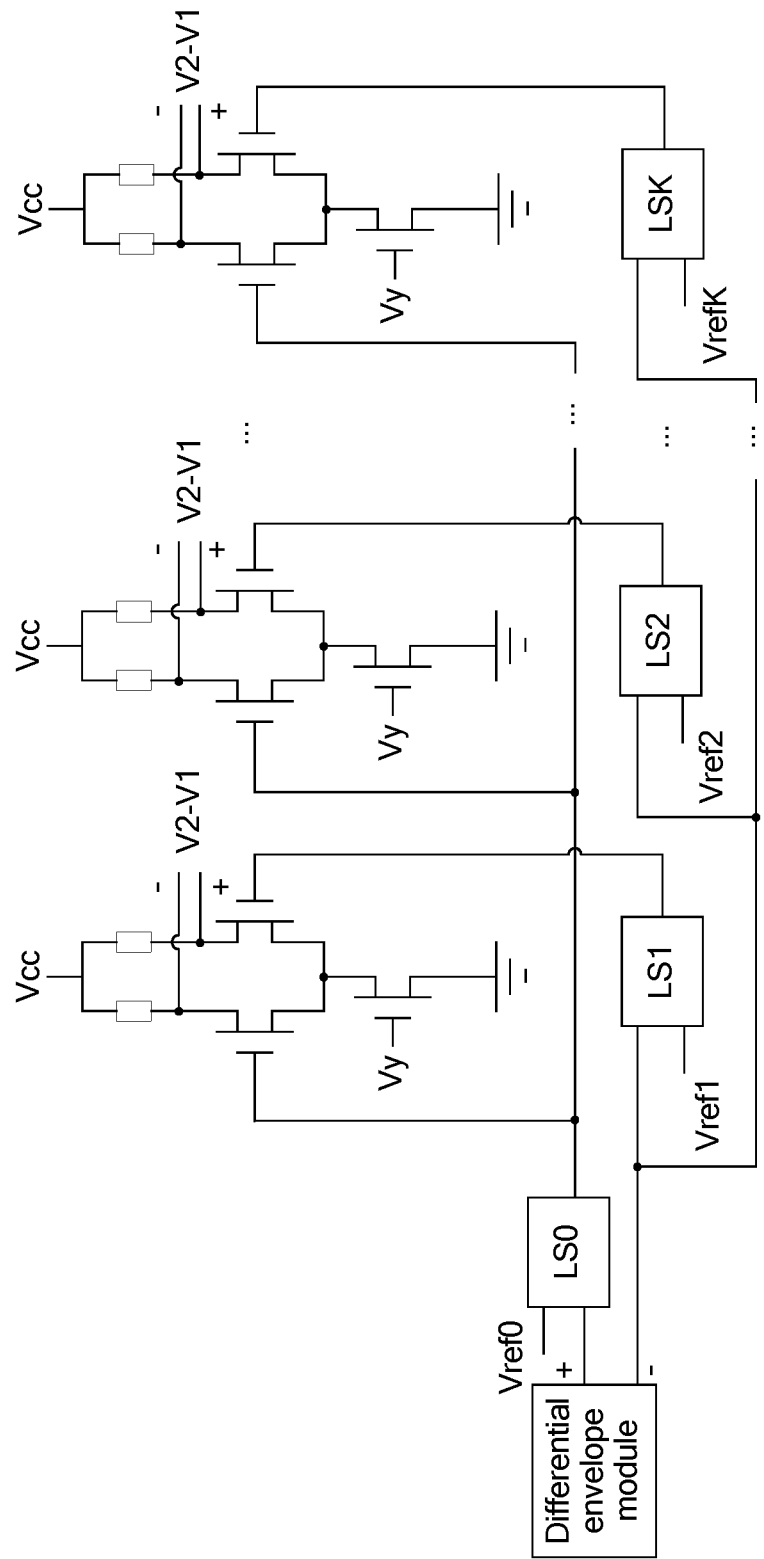
Figures 4, 5, 6, 7, 8, 9, 10, 11, 12, 13:
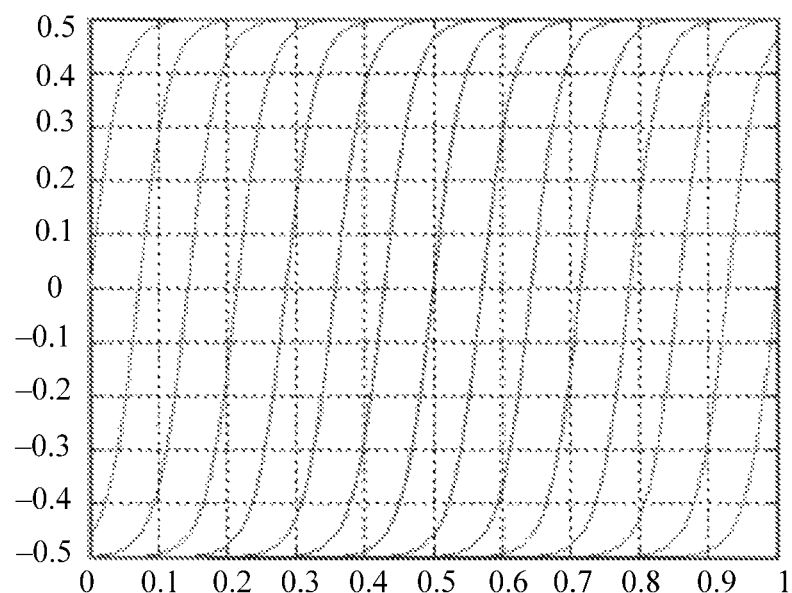

Referring to FIG. 4-1a, a difference between the ramp basis function and a polynomial basis function is internal implementation of an LUT in a BLUT. It is still assumed that the LUT is in an in-phase BLUT 325, and the BULT 325 is in a $BSL_n$. That is, an LUT unit $LUT_{m,n}$ in the in-phase BLUT 325 is used as an example to describe construction and a working process of the ramp basis function.

The LUT of the $LUT_{m,n}$ includes an LUT adder 331, a reference voltage generation module 332, multiple BFGs, and multiple multipliers. The multiple BFGs are respectively a BFG_1, a BFG_2, ..., and a BFG_K. The multiple multipliers are respectively a multiplier M1, a multiplier M2, ..., and a multiplier MK, and K is a preset integer. The BFG refers to a base function generator, that is, an acronym of a basis function generator.

A first input end of the BFG_k is connected to an envelope module 2, and a second input end is connected to the reference voltage generation module 332. An output end of the BFG_k is connected to an input end of the multiplier Mk. An output end of the multiplier Mk is connected to the LUT adder 331, and k=1, 2, ..., K.

Preferably, the first input end of the BFG_k is connected to an output end of a $BBD_{m-1}$ included in the envelope module 2. The reference voltage generation module 332 is configured to generate a corresponding reference voltage Vrefk for the BFG_k, and output the reference voltage Vrefk to the BFG_k.

The BFG_k is configured to receive an $m^{th}$ envelope signal $r(t-\tau_{BBm})$ output by the envelope module 2 and the reference voltage Vrefk input by the reference voltage generation module 332, generate a basis function signal $s_k(r(t-\tau_{BBm}))$ according to the $m^{th}$ envelope signal $r(t-\tau_{BBm})$ and the reference voltage Vrefk, and output the basis function signal $s_k(r(t-\tau_{BBm}))$ to the multiplier Mk corresponding to the BFG_k.

The multiplier Mk is configured to receive the basis function signal $s_k(r(t-\tau_{BBm}))$ and a linear predistortion coefficient $c_{m,n,k,i}$ output by the APD training module C, multiply the basis function signal $s_k(r(t-\tau_{BBm}))$ by the linear predistortion coefficient $c_{m,n,k,i}$ to obtain a basis contribution signal $c_{m,n,k,i}s_k(r(t-\tau_{BBm}))$, and output the basis contribution signal $c_{m,n,k,i}s_k(r(t-\tau_{BBm}))$ to the LUT adder 331.

The LUT adder 331 is configured to receive the basis contribution signal $c_{m,n,k,i}s_k(r(t-\tau_{BBm}))$ output by the multiplier Mk, and add the received basis contribution signals, to obtain an LUT signal $$\sum_{k=1}^{K} c_{m,n,k,i}s_k(r(t-\tau_{BBm})).$$

Referring to FIG. 4-2, the reference voltage generation module 332 includes a first amplifier Amp1, a third resistor R3, a fourth resistor R4, and multiple fifth resistors R5. The multiple fifth resistors R5 are sequentially connected in series to form a series circuit.

A positive electrode input end of the first amplifier Amp1 is configured to receive a bandgap voltage input from exterior, and an output end is connected to an end of the third resistor R3, an end of the series circuit, and an input end of the BFG_1. Another end of the third resistor R3 is connected to a negative electrode input end of the first amplifier Amp1 and an end of the fourth resistor R4. Another end of the fourth resistor R4 is connected to the ground.

A connection point of any two neighboring fifth resistors R5 in the series circuit is connected to a BFG, and another end of the series circuit is connected to the ground.

The + input end of the first amplifier Amp1 receives the bandgap voltage. The first amplifier Amp1 amplifies the bandgap voltage to obtain a reference voltage Vref1, and outputs the reference voltage Vref1 to the series circuit. The connection point of any two neighboring fifth resistors R5 in the series circuit generates a reference voltage, and outputs the reference voltage to the BFG connected to the connection point. Reference voltages generated by connection points included in the series circuit are respectively Vref2, Vref3, . . . , and VrefK.

An LS includes two circuit structures shown in FIG. 4-3 and FIG. 4-4. The LS refers to a level shifter, that is, an acronym of a level shifter. Specifically, Referring to FIG. 4-3, the LS may include a fourth MOS (Metal Oxide Semiconductor) transistor MOS4 and a constant current source I. A drain electrode of the fourth MOS transistor MOS4 is connected to a power supply, a source electrode is connected to a first input end of the constant current source I, and a gate electrode Vin is connected to the envelope module 2. A second input end of the constant current source I is connected to an output end of the reference voltage generation module 332, and an output end is connected to the ground.

Referring to FIG. 4-4, the LS may include a sixth resistor R6, a seventh resistor R7, an eighth resistor R8, a ninth resistor R9, a tenth resistor R10, and a second amplifier Amp2.

An end of the sixth resistor R6 is connected to the envelope module 2, and another end is connected to an end of the seventh resistor R7, an end of the eighth resistor R8, and a positive electrode input end of the second amplifier Amp2. Another end of the seventh resistor R7 is connected to the reference voltage generation module 332, and another end of the eighth resistor R8 is connected to the ground. A negative electrode input end of the second amplifier Amp2 is connected to an end of the ninth resistor R9 and an end of the tenth resistor R10, and an output end is connected to another end of the tenth resistor R10. Another end of the ninth resistor R9 is connected to the ground.

Referring to FIG. 4-5, the present invention provides a basis function generation unit BFG, including:

a first MOS transistor MOS1, a second MOS transistor MOS2, a third MOS transistor MOS3, a first resistor R1, and a second resistor R2.

An end of the first resistor R1 and an end of the second resistor R2 are both connected to a power supply Vcc, and another end of the first resistor R1 and another end of the second resistor R2 are respectively connected to a drain electrode of the first MOS transistor MOS1 and a drain electrode of the second MOS transistor MOS2.

A gate electrode of the first MOS transistor MOS1 is connected to the envelope module 2, and a source electrode is connected to a drain electrode of the third MOS transistor MOS3. A gate electrode of the second MOS transistor MOS2 is connected to the reference voltage generation module 332, and a source electrode is connected to the drain electrode of the third MOS transistor MOS3.

A gate electrode of the third MOS transistor MOS3 is connected to a fixed voltage $V_y$, and a source electrode is connected to the ground.

Preferably, the gate electrode of the first MOS transistor MOS1 is connected to an output end of a $BBD_{m-1}$ included in the envelope module 2. A basis function signal generated by the BFG is shown in the following formula:

$$f = V_2 - V_1 = \alpha f(V_y) th\left(\frac{V_{x1} - V_{Vrefk}}{2V_T}\right).$$

In the foregoing formula, $f$ is the basis function signal, $V_{x1}$ is an envelope signal $r(t-\tau_{BBm})$ output by the envelope module 2, and Vrefk is a reference voltage generated by the reference voltage generation module 332 for a BFG_k. $V_T=kT/q$, where k is a Boltzmann constant, $k=1.3806488*10^{-23}$ $JK^{-1}$, and J is an acronym of an energy unit Joule; K represents an absolute temperature; q is an electron charge, $q=1.6021892*10^{-19}$ C, and C is an acronym of an electric quantity unit Coulomb. When T=300K, $V_T=26$ mV. α is a constant related to a circuit characteristic. $f(V_y)$ is a fixed function determined by a semiconductor characteristic. When $V_y$ is determined, $f(V_y)$ is determined, and $V_2-V_1$ and $V_{x1}-V_{x2}$ are determined by using a hyperbolic tangent function. th is the hyperbolic tangent function:

$$th(x) = \frac{e^x - e^{-x}}{e^x + e^{-x}}.$$

A characteristic of the hyperbolic tangent function is a ramp basis function curve. Translation of the ramp basis function curve is implemented by adding a bias on $V_{x1}$ and $V_{x2}$. A slope of the ramp basis function curve is implemented by changing $V_y$. The parameter $V_y$ is a design value and is related to a source voltage $V_y$ and a quantity of basis functions K. According to a specific $V_y$ and K, the most appropriate $V_y$ may be found by means of design.

The BFG_k may generate a single-ended uphill basis function signal, a single-ended downhill basis function signal, a differential uphill basis function signal, and a differential downhill basis function signal. A V1 output end of the BFG_k outputs the single-ended downhill basis function signal, and a V2 output end outputs the single-ended uphill basis function signal. A signal obtained by subtracting the signal output by the V2 from the signal output by the V1 is the differential uphill basis function signal. A signal obtained by subtracting the signal output by the V1 from the signal output by the V2 is the differential downhill function signal.

Referring to FIG. 4-6, an LUT may include K BFGs. A gate electrode of a first MOS transistor MOS1 of each BFG is connected to a single-ended envelope module. A gate electrode of a second MOS transistor MOS2 is connected to the reference voltage generation module 332 of the LUT. A V1 output end of each BFG outputs a single-ended downhill basis function signal. For example, K=15, that is, there are a BFG_1, a BFG_2, . . . , and a BFG_15. Single-ended downhill basis function signals respectively generated by the BFG_1, the BFG_2, . . . , and the BFG_15 are shown in FIG. 4-7. The single-ended envelope module outputs an envelope signal in a single-ended form. The envelope signal is a delayed envelope signal output by the envelope module 2, and is output in a single-ended signal form.

Referring to FIG. 4-8, an LUT includes K BFGs. A gate electrode of a first MOS transistor MOS1 of each BFG is connected to a differential envelope module. A gate electrode of a second MOS transistor MOS2 is connected to the reference voltage generation module 332 included in the LUT. A V2 output end of each BFG outputs a single-ended uphill basis function signal. For example, K=15, that is, there are a BFG_1, a BFG_2, . . . , and a BFG_15. Single-ended uphill basis function signals respectively generated by the BFG_1, the BFG_2, . . . , and the BFG_15 are shown in FIG. 4-9. The differential envelope module outputs an envelope signal in a differential form. The envelope signal is a delayed envelope signal output by the envelope module 2, and is output in a differential signal form.

Referring to FIG. 4-10, the LUT further includes multiple LSs and K BFGs, and the multiple LSs are respectively an LS0, an LS1, an LS2, . . . , and an LSK. The differential envelope module outputs a differential envelope signal. The $m^{th}$ envelope signal $r(t-\tau_{BBm})$=(Differential positive end signal)−(Differential negative end signal). A differential positive output end of the differential envelope module is connected to a second input end of the LS0, and a differential negative output end of the differential envelope module is connected to a second input end of the LSk, where k=1, 2, . . . , K.

The LS0 is referred to as a first LS. A first input end of the first LS, that is, the LS0, is connected to an external constant-voltage signal Vref0. The second input end of the LS0 is connected to the differential positive output end of the differential envelope module. An output end of the LS0 is connected to a differential positive input end of the BFG_k, that is, the gate electrode of the first MOS transistor, to perform, according to the constant-voltage signal Vref0, translation on the differential positive-end envelope signal input from the differential envelope module, and output the translated differential positive-end envelope signal to the gate electrode of the first MOS transistor of the BFG_k, where k=1, 2, . . . , K.

K LSks (k=1, 2, . . . , K) are referred to as a second LS. A first input end of the $k^{th}$ LS, that is, the LSk, in the second LS is connected to Vrefk output by the reference voltage generation module 332. The second input end of the LSk is connected to the differential negative output end of the differential envelope module. An output end of the LSk is connected to a differential positive input end of the BFG_k, that is, the gate electrode of the second MOS transistor, to perform translation on the reference voltage Vrefk according to the $m^{th}$ differential negative-end envelope signal, and output the translated Vrefk to the gate electrode of the second MOS transistor of the BFG_k, where k=1, 2, . . . , K.

A signal output by a V2 output end is subtracted from a signal output by a V1 output end of each BFG, to form a differential downhill function signal. For example, K=15, that is, there are a BFG_1, a BFG_2, . . . , and a BFG_15. Differential downhill basis function signals respectively generated by the BFG_1, the BFG_2, . . . , and the BFG_15 are shown in FIG. 4-11.

Referring to FIG. 4-12, a signal output by a V1 output end is subtracted from a signal output by a V2 output end of each BFG, to form a differential uphill function signal. Differential uphill basis function signals respectively generated by the BFG_1, the BFG_2, . . . , and the BFG_15 are shown in FIG. 4-13.

In the prior art, for example, for an APD chip of the American Scintera company (the company has been merged by the Maxiam company), an APD core module of the APD chip is equivalent to an SBSL module, and the APD core module has an extremely limited capability in correcting memory distortion.

If the APD core module in the present invention is in a matrix model, multiple BSLs may be included. A radio frequency delay module delays a feed-forward radio frequency signal to obtain multiple radio frequency delay signals with different delays, and outputs each radio frequency delay signal to a contact matrix module, so that the contact matrix module generates a predistortion signal according to the radio frequency delay signals with different delays, thereby greatly improving a capability of an APD system in correcting memory distortion.

If the APD core module in the present invention is in a cascaded model, due to a linear filtering module and a broadband linear filtering module that may be included, a capability of an APD system in correcting memory distortion is greatly improved.

It can be seen that, regardless of whether the APD core module in the present invention uses the matrix model or the cascaded model, when a PA has relatively strong memory linear distortion and memory nonlinear distortion, the APD core module can effectively correct distortion generated by the PA.

In addition, in the prior art, for example, for the APD chip of the American Scintera company (the company has been merged by the Maxiam company), an even polynomial is used as an APD basis function. A problem of using the even polynomial is dynamic extension of a peak-to-average ratio (PAR) of an envelope signal is great. For example, a PAR of an envelope signal r(t) of a radio frequency signal x(t) is 7 dB, a PAR of a basis function unit output signal $r^2(t)$ of a quadratic polynomial of the envelope signal r(t) is 14 dB, a PAR of a basis function unit output signal $r^4(t)$ of a quartic polynomial of the envelope signal r(t) is 28 dB, a PAR of a basis function unit output signal $r^6(t)$ of a sextic polynomial of the envelope signal r(t) is 42 dB, a PAR of a basis function unit output signal $r^8(t)$ of a degree 8 polynomial of the envelope signal r(t) is 56 dB, and a PAR of a basis function unit output signal $r^{10}(t)$ of a degree 10 polynomial of the envelope signal r(t) is 70 dB.

It is assumed that a peak of a basis function unit output signal that is allowed to pass in a specific source voltage is 0 dBm, and a noise level of a circuit is −70 dBm. For the envelope signal r(t) of the radio frequency signal x(t), a peak power of the envelope signal r(t) is 0 dBm, an average power of the envelope signal r(t)=Peak power−PAR=−7 dBm, and an SNR of the envelope signal r(t)=Average power−Circuit noise=−7−(−70)=63 dB. For the basis function unit output signal $r^2(t)$ of the quadratic polynomial, a peak power of the basis function unit output signal $r^2(t)$ is 0 dBm, an average power of the basis function unit output signal $r^2(t)$=Peak power−PAR=−14 dBm, and an SNR of the basis function unit output signal $r^2(t)$=Average power−Circuit noise=−14−(−70)=56 dB. For the basis function unit output signal $r^4(t)$ of the quartic polynomial, a peak power of the basis function unit output signal $r^4(t)$ is 0 dBm, an average power of the basis function unit output signal $r^4(t)$=Peak power−PAR=−28 dBm, and an SNR of the basis function unit output signal $r^4(t)$=Average power−Circuit noise=−28−(−70)=42 dB. For the basis function unit output signal $r^6(t)$ of the sextic polynomial, a peak power of the basis function unit output signal $r^6(t)$ is 0 dBm, an average power of the basis function unit output signal $r^6(t)$=Peak power−PAR=−42 dBm, and an SNR of the basis function unit output signal $r^6(t)$=Average power−Circuit noise=−42−(−70)=28 dB. For the basis function unit output signal $r^8(t)$ of the degree 8 polynomial, a peak power of the basis function unit output signal $r^8(t)$ is 0 dBm, an average power of the basis function unit output signal $r^8(t)$=Peak power−PAR=−56 dBm, and an SNR of the basis function unit output signal $r^8(t)$=Average power−Circuit noise=−56−(−70)=14 dB. For the basis function unit output signal $r^{10}(t)$ of the degree 10 polynomial, a peak power of the basis function unit output signal $r^{10}(t)$ is 0 dBm, an average power of the basis function unit output signal $r^{10}(t)$=Peak power−PAR=−70 dBm, and an SNR of the basis function unit output signal $r^{10}(t)$=Average power−Circuit noise=−70−(−70)=0 dB.

It can be seen that, in a specific source voltage and a specific circuit noise level, because S in the SNR refers to an average signal power, a PAR of a higher-degree basis function unit output signal causes decrease of an SNR of a higher-degree basis function, leading to deterioration of correcting performance of an APD.

For the ramp basis function in the present invention, it can be seen from an implementation circuit that, because there is only a translation relationship between characteristics of basis functions, PARs of basis function unit output signals are almost equal to each other. In a specific source voltage and a specific circuit noise level, a PAR difference between basis function unit output signals does not cause decrease of SNRs of some basis functions and deterioration of correction performance of an APD.

The foregoing descriptions are merely examples of embodiments of the present invention, but are not intended to limit the present invention. Any modification, equivalent replacement, and improvement made without departing from the spirit and principle of the present invention shall fall within the protection scope of the present invention.

What is claimed is:

1. An analog predistorter (APD) core module, wherein the APD core module comprises:
   a radio frequency delay module;
   an envelope module; and
   a contact matrix module, wherein the contact matrix module is connected to both the radio frequency delay module and the envelope module;
   wherein the radio frequency delay module is configured to receive a feed-forward radio frequency signal, generate multiple radio frequency delay signals with different delays according to the feed-forward radio frequency signal, and output each radio frequency delay signal to the contact matrix module;
   wherein the envelope module is configured to receive the feed-forward radio frequency signal, perform envelope detection on the feed-forward radio frequency signal to obtain multiple envelope signals with different delays, and output each envelope signal to the contact matrix module; and
   wherein the contact matrix module is configured to receive each radio frequency delay signal, each envelope signal, and a predistortion coefficient from an exterior source, and generate a predistortion signal according to the predistortion coefficient, each radio frequency delay signal, and each envelope signal;
   wherein the contact matrix module comprises multiple block signal lookup tables BSLs and a predistortion signal adder;
   wherein the multiple BSLs are respectively a $BSL_1$, a $BSL_2$, ..., and a $BSL_N$, wherein N is a preset integer;
   wherein the $BSL_N$ is connected to the radio frequency delay module, the envelope module, the predistortion signal adder, and an APD training module, wherein n=1, 2, ..., N;
   wherein the $BSL_n$ receives an $n^{th}$ radio frequency delay signal $x(t-\tau_{RFn})$ output by the radio frequency delay module, M envelope signals output by the envelope module, and a predistortion coefficient output by the APD training module, selects at least one envelope signal from the M envelope signals, performs amplitude conversion and phase conversion on the $n^{th}$ radio frequency delay signal $x(t-\tau_{RFn})$ according to the selected at least one envelope signal and the received predistortion coefficient to obtain an $n^{th}$ tap signal, and outputs the $n^{th}$ tap signal to the predistortion signal adder; and
   wherein the predistortion signal adder is configured to receive tap signals output by all BSLs, wherein the tap signals are respectively a first tap signal, a second tap signal, ..., and an $N^{th}$ tap signal; and add the first tap signal, the second tap signal, ..., and the $N^{th}$ tap signal to obtain the predistortion signal.

2. The APD core module according to claim 1, wherein the radio frequency delay module comprises multiple radio frequency delay units (RFDs), and the multiple RFDs are respectively an $RFD_0$, an $RFD_1$, ..., and an $RFD_{N-1}$, wherein N is a quantity of columns of a preset nonlinear model matrix;
   wherein the $RFD_0$, the $RFD_1$, ..., and the $RFD_{N-1}$, are sequentially connected in series, and an output end of each RFD in the $RFD_0$, the $RFD_1$, ..., and the $RFD_{N-1}$, is connected to the contact matrix module;
   wherein the $RFD_0$ is configured to receive a feed-forward radio frequency signal $x(t)$, delay the feed-forward radio frequency signal $x(t)$ to obtain a first radio frequency delay signal $x(t-\tau_{RF1})$, and output the first radio frequency delay signal $x(t-\tau_{RF1})$ to the contact matrix module; and
   wherein the $RFD_n$ is configured to receive an $n^{th}$ radio frequency delay signal $x(t-\tau_{RFn})$ output by the $RFD_{n-1}$, delay the $n^{th}$ radio frequency delay signal $x(t-\tau_{RFn})$ to obtain an $(n+1)^{th}$ radio frequency delay signal $x(t-\tau_{RFn+1})$, and output the $(n+1)^{th}$ radio frequency delay signal $x(t-\tau_{RFn+1})$ to the contact matrix module, wherein n=1, 2, ..., N−1.

3. The APD core module according to claim 1, wherein the envelope module comprises an envelope detector unit (ED) and multiple baseband delay units (BBDs), wherein the multiple BBDs are respectively a $BBD_1$, a $BBD_2$, ..., and a $BBD_{M-1}$, and wherein M is a quantity of rows of a preset nonlinear model matrix;
   wherein an output end of the ED is connected to an input end of the $BBD_1$, the $BBD_1$, the $BBD_2$, ..., and the $BBD_{M-1}$ are sequentially connected in series, and an output end of each BBD in the $BBD_1$, the $BBD_2, \ldots,$ and the $BBD_{M-1}$ is connected to the contact matrix module;

wherein the ED is configured to receive the feed-forward radio frequency signal x(t), perform envelope detection on the feed-forward radio frequency signal x(t) to obtain a first envelope signal $r(t-\tau_{BB1})$, and output the first envelope signal $r(t-\tau_{BB1})$ to the $BBD_1$ and the contact matrix module;

wherein the $BBD_1$ is configured to delay the first envelope signal $r(t-\tau_{BB1})$ to obtain a second envelope signal $r(t-\tau_{BB2})$, and output the second envelope signal $r(t-\tau_{BB2})$ to the $BBD_2$ and the contact matrix module;

wherein the $BBD_m$ is configured to receive an $m^{th}$ envelope signal $r(t-\tau_{BBm})$ output by the $BBD_{m-1}$, delay the $m^{th}$ envelope signal $r(t-\tau_{BBm})$ to obtain an $(m+1)^{th}$ envelope signal $r(t-\tau_{BBm+1})$, and output the $(m+1)^{th}$ envelope signal $r(t-\tau_{BBm+1})$ to a $BBD_{m+1}$ and the contact matrix module, wherein m=2, 3, . . . , M-2; and wherein the $BBD_{M-1}$ is configured to receive an $(M-1)^{th}$ envelope signal $r(t-\tau_{BBM-1})$ output by the $BBD_{M-2}$, delay the $(M-1)^{th}$ envelope signal $r(t-\tau_{BBM-1})$ to obtain an $M^{th}$ envelope signal $r(t-\tau_{BBM})$, and output the $M^{th}$ envelope signal $r(t-\tau_{BBM})$ to the contact matrix module.

4. The APD core module according to claim 1, wherein the envelope module comprises multiple envelope generation units EDs, and the multiple envelope generation units EDs are respectively an $ED_0$, an $ED_1, \ldots,$ and an $ED_{N-1}$, wherein N is a quantity of columns of a preset nonlinear model matrix;

wherein an input end of the $ED_0$ is configured to receive the feed-forward radio frequency signal, and an output end of the $ED_0$ is connected to the contact matrix module;

wherein an input end of the $ED_n$ is connected to an output end of the radio frequency delay module, and an output end is connected to the contact matrix module, wherein n=1, 2, . . . , N-1; and wherein the $ED_n$ is configured to receive an $(n+1)^{th}$ radio frequency delay signal $x(t-\tau_{RFn+1})$, perform envelope detection on the $(n+1)^{th}$ radio frequency delay signal $x(t-\tau_{RFn+1})$ to obtain an $(n+1)^{th}$ envelope signal $r(t-\tau_{BBn+1})$, and output the $(n+1)^{th}$ envelope signal $r(t-\tau_{BBn+1})$ to the contact matrix module, wherein n=0, 1, . . . , N-1.

5. The APD core module according to claim 1, wherein the envelope module comprises multiple envelope generation unit EDs and a BBD, and the multiple EDs are respectively an $ED_0$, an $ED_1, \ldots,$ and an $ED_N$, wherein N is a quantity of columns of a preset nonlinear model matrix;

wherein an input end of the $ED_0$ is configured to receive the feed-forward radio frequency signal, and an output end is connected to the contact matrix module;

wherein an input end of the $ED_n$ is connected to an output end of the radio frequency delay module, and an output end is connected to the contact matrix module, wherein n=1, 2, . . . , N;

wherein an input end of the BBD is connected to an output end of the $ED_N$, and an output end is connected to the contact matrix module;

wherein the $ED_0$ is configured to receive the feed-forward radio frequency signal x(t), perform envelope detection on the feed-forward radio frequency delay signal x(t) to obtain a first envelope signal $r(t-\tau_{BB1})$, and output the first envelope signal $r(t-\tau_{BB1})$ to the contact matrix module;

wherein the $ED_n$ is configured to receive an $n^{th}$ radio frequency delay signal $x(t-\tau_{RFn})$, perform envelope detection on the $n^{th}$ radio frequency delay signal $x(t-\tau_{RFn})$ to obtain an $(n+1)^{th}$ envelope signal $r(t-\tau_{BBn+1})$, and output the $(n+1)^{th}$ envelope signal $r(t-\tau_{BBn+1})$ to the contact matrix module, wherein n=1, 2, . . . , N-1;

wherein the $ED_N$ is configured to receive an $N^{th}$ radio frequency delay signal $x(t-\tau_{RFN})$, perform envelope detection on the $N^{th}$ radio frequency delay signal $x(t-\tau_{RFN})$ to obtain an $(N+1)^{th}$ envelope signal $r(t-\tau_{BBN+1})$, and output the $(N+1)^{th}$ envelope signal $r(t-\tau_{BBN+1})$ envelope signal contact matrix module and the BBD; and wherein the BBD is configured to receive the $(N+1)^{th}$ envelope signal $r(t-\tau_{BBN+1})$, and delay the $(N+1)^{th}$ envelope signal $r(t-\tau_{BBN+1})$ to obtain an $(N+2)^{th}$ envelope signal $r(t-\tau_{BBN+2})$, and output the $(N+2)^{th}$ envelope signal $r(t-\tau_{BBN+2})$ to the contact matrix module.

6. The APD core module according to claim 1, wherein the $BSL_n$ comprises:

an in-phase block lookup table (BLUT);
a quadrature BLUT; and
an analog vector modulator (AVM);

wherein an envelope input end of the in-phase BLUT and an envelope input end of the quadrature BLUT are connected to the envelope module; a coefficient input end of the in-phase BLUT and a coefficient input end of the quadrature BLUT are connected to coefficient input ends of the BSL module;

wherein a coefficient at the coefficient input end of the in-phase BLUT is an in-phase BLUT coefficient; a coefficient at the coefficient input end of the quadrature BLUT is a quadrature BLUT coefficient, and a coefficient at a coefficient input end of the BSL module is a BSL coefficient;

wherein the BSL coefficient comprises two coefficients, including the in-phase BLUT coefficient and the quadrature BLUT coefficient;

wherein an output end of the in-phase BLUT and an output end of the quadrature BLUT are respectively connected to an in-phase modulation signal input end of the AVM and a quadrature modulation signal input end of the AVM;

wherein a first input end of the AVM is connected to the radio frequency delay module; and an output end of the AVM is connected to the predistortion signal adder;

wherein the envelope input end of the in-phase BLUT and the envelope input end of the quadrature BLUT comprise at least one delayed envelope signal, and the comprised envelope signal is determined by a nonlinear model matrix A, and nonlinear predistortion coefficients of the in-phase BLUT coefficient and the quadrature BLUT coefficient are determined by the nonlinear model matrix A;

wherein a linear model vector L determines whether the in-phase BLUT coefficient and the quadrature BLUT coefficient comprise a linear predistortion coefficient;

wherein the in-phase BLUT receives a linear predistortion coefficient $h_{n,i}$ and nonlinear predistortion coefficients $c_{m,n,1,i} \sim c_{m,n,K,i}$ that are input by the APD training module, the in-phase BLUT selects at least one envelope signal, the in-phase BLUT obtains an in-phase BLUT output signal $w_{n,i}(t)$ according to the linear predistortion coefficient $h_{n,i}$, the nonlinear predistortion coefficients $c_{m,n,1,i}$~$c_{m,n,K,i}$, and the selected at least one envelope signal, and the in-phase BLUT outputs the in-phase BLUT output signal $w_{n,i}(t)$ to the in-phase modulation signal input end of the AVM;

wherein, in the $BSL_n$, i in a subscript of the coefficient indicates that a radio frequency signal served by the coefficient is the $n^{th}$ radio frequency delay signal $x(t-\tau_{RFn})$ and q in a subscript of the coefficient indicates that a radio frequency signal served by the coefficient is Hilbert transform of the $n^{th}$ radio frequency delay signal, that is, $\hat{x}(t-\tau_{RFn})$;

wherein, in the $BSL_n$, m in a subscript of the coefficient indicates that an envelope signal served by the coefficient is an $m^{th}$ envelope delay signal $r(t-\tau_{BBm})$;

wherein the quadrature BLUT receives a linear predistortion coefficient $h_{n,q}$ and nonlinear predistortion coefficients $c_{m,n,1,q}$~$c_{m,n,K,q}$ that are input by the APD training module, selects at least one envelope signal, the quadrature BLUT obtains a quadrature BLUT output signal $w_{n,q}(t)$ according to the linear predistortion coefficient $h_{n,q}$, the nonlinear predistortion coefficients $c_{m,n,1,q}$~$c_{m,n,K,q}$, and the selected at least one envelope signal, and the quadrature BLUT outputs the quadrature BLUT output signal $w_{n,q}(t)$ to the quadrature modulation signal input end of the AVM; and wherein the AVM receives the in-phase BLUT output signal $w_{n,i}(t)$, the quadrature BLUT output signal $w_{n,q}(t)$, and the radio frequency delay signal $x(t-\tau_{RFn})$ output by the radio frequency delay module, and processes the radio frequency delay signal $x(t-\tau_{RFn})$ according to the in-phase BLUT output signal $w_{n,i}(t)$ and the quadrature BLUT output signal $w_{n,q}(t)$, to obtain an output radio frequency signal $v_n(t)$ that is the $n^{th}$ tap signal, wherein n=1, 2, ..., N.

7. The APD core module according to claim 6, wherein the AVM of the $BSL_n$ comprises:
a quadrature phase splitter (QPS);
an in-phase multiplier;
a quadrature multiplier; and
a subtractor;
wherein an input end of the QPS is connected to an output end of the radio frequency delay module, a first output end is connected to a first input end of the in-phase multiplier, and a second output end is connected to a first input end of the quadrature multiplier;
wherein the QPS is configured to receive the $n^{th}$ radio frequency delay signal $x(t-\tau_{RFn})$ sent by the radio frequency delay module, wherein the QPS is configured to divide the $n^{th}$ radio frequency delay signal $x(t-\tau_{RFn})$ into a radio frequency delay signal $x(t-\tau_{RFn})$ on a 0-degree and a radio frequency delay signal $\hat{x}(t-\tau_{RFn})$ on a −90-degree, wherein a phase difference between the two radio frequency delay signals is 90 degrees;
wherein the QPS is configured to output the radio frequency delay signal $x(t-\tau_{RFn})$ on the 0-degree to the in-phase multiplier; and wherein the QPS is configured to output the radio frequency delay signal $\hat{x}(t-\tau_{RFn})$ on the −90-degree to the quadrature multiplier;
wherein the in-phase multiplier is configured to receive the in-phase BLUT output signal and the radio frequency delay signal $x(t-\tau_{RFn})$ on the 0-degree, wherein the in-phase multiplier is configured to multiply the in-phase BLUT output signal by the radio frequency delay signal $x(t-\tau_{RFn})$ on the 0-degree to obtain an in-phase modulated radio frequency signal, and wherein the in-phase multiplier is configured to output the in-phase modulated radio frequency signal to the subtractor;
wherein the quadrature multiplier is configured to receive the quadrature BLUT output signal and the radio frequency delay signal $\hat{x}(t-\tau_{RFn})$ on the −90-degree, wherein the quadrature multiplier is configured to multiply the quadrature BLUT output signal by the radio frequency delay signal $\hat{x}(t-\tau_{RFn})$ on the −90-degree to obtain a quadrature modulated radio frequency signal, and wherein the quadrature multiplier is configured to output the quadrature modulated radio frequency signal to the subtractor; and
wherein the subtractor is configured to subtract the quadrature modulated radio frequency signal from the in-phase modulated radio frequency signal to obtain the $n^{th}$ tap signal.

8. The APD core module according to claim 6, wherein the BLUT of the $BSL_n$ comprises:
at least one lookup table (LUT); and
a BLUT adder;
wherein the at least one LUT comprises a $LUT_{m,n}$, wherein m=1, 2, ..., M, and M is a preset integer;
wherein the nonlinear model matrix A is preset, wherein A has M rows and N columns, an element on an $m^{th}$ row and an $n^{th}$ column of A is $A_{m,n}$, and wherein a value of $A_{m,n}$ is 0 or 1; wherein $A_{m,n}=1$ indicates that the BLUT comprises the $LUT_{m,n}$ and a BLUT coefficient input to the BLUT comprises the nonlinear predistortion coefficients $c_{m,n,1,i}$ to $c_{m,n,K,i}$, and wherein $A_{m,n}=0$ indicates that the BLUT does not comprise the $LUT_{m,n}$ and a BLUT coefficient input to the BLUT does not comprise the nonlinear predistortion coefficients $c_{m,n,1,i}$ to $c_{m,n,K,i}$, wherein m=1, 2, ..., M, and M is a preset integer;
wherein the linear model vector L is preset, wherein L has N elements, an $n^{th}$ element of L is $L_n$, and a value of $L_n$ is 0 or 1; when $L_n=1$, the BLUT coefficient comprises linear predistortion coefficients $h_{n,i}$ and $h_{n,q}$, or when $L_n=0$, the BLUT coefficient does not comprise linear predistortion coefficients $h_{n,i}$ and $h_{n,q}$, wherein n=1, 2, ..., N; a first input end of the $LUT_{m,n}$ is connected to the envelope module, a second input end is connected to the APD training module, and an output end is connected to the BLUT adder, and the BLUT adder is further connected to the APD training module;
wherein the $LUT_{m,n}$ receives the $m^{th}$ envelope signal $r(t-\tau_{BBm})$ output by the envelope module and a nonlinear predistortion coefficient output by the APD training module, wherein the $LUT_{m,n}$ obtains, according to the predistortion coefficient, a LUT signal corresponding to the $m^{th}$ envelope signal $r(t-\tau_{BBm})$, and wherein the $LUT_{m,n}$ outputs the LUT signal to the BLUT adder, wherein m=1, 2, ..., M; and
wherein the BLUT adder receives a LUT signal output by each LUT and the linear predistortion coefficient output by the APD training module, and wherein the BLUT adder adds each LUT signal and the linear predistortion coefficient to obtain an in-phase modulation signal and a quadrature modulation signal.

9. The APD core module according to claim 8, wherein the LUT comprises:
an LUT adder;
multiple basis function generation units (BFGs); and
multiple multipliers, wherein each BFG of the multiple BFGs corresponds to a multiplier of the multiple multipliers;

wherein an input end of each BFG is connected to the envelope module, and an output end is respectively connected to a first input end of a multiplier corresponding to each BFG; and a second input end of each multiplier in the multiple multipliers is connected to the APD training module, and an output end is connected to the LUT adder;

wherein the BFG is configured to receive the envelope signal $r(t-\tau_{BBm})$ output by the envelope module, wherein the BFG is configured to generate a basis function signal according to the envelope signal $r(t-\tau_{BBm})$, and wherein the BFG is configured to output the basis function signal to a multiplier corresponding to the BFG, wherein m=1, 2, . . . , M;

wherein the multiplier is configured to receive the basis function signal and a first predistortion coefficient output by the APD training module, wherein the multiplier is configured to obtain a basis contribution signal according to the basis signal and the first predistortion coefficient, and wherein the multiplier is configured to output the basis contribution signal to the BLUT adder; and wherein the LUT adder is configured to receive a basis contribution signal output by each multiplier, and wherein the LUT adder is configured to add the received basis contribution signals, to obtain the LUT signal.

10. The APD core module according to claim 8, wherein the LUT comprises:

an LUT adder;
a reference voltage generation module;
multiple basis function generation units (BFGs); and
multiple multipliers, wherein each BFG of the multiple BFGs corresponds to a multiplier of the multiple multipliers;

wherein a first input end of each BFG is connected to the envelope module, a second input end is connected to the reference voltage generation module, and an output end of each BFG is connected to a first input end of a multiplier corresponding to each BFG;

wherein a second input end of each multiplier in the multiple multipliers is connected to the APD training module, and an output end is connected to the LUT adder;

wherein the BFG is configured to receive the envelope signal $r(t-\tau_{BBm})$ output by the envelope module and a reference voltage input by the reference voltage generation module, wherein the BFG is configured to generate a basis function signal according to the envelope signal $r(t-\tau_{BBm})$ and the reference voltage, and wherein the BFG is configured to output the basis function signal to a multiplier corresponding to the BFG, wherein m=1, 2, . . . , M;

wherein the multiplier is configured to receive the basis function signal and a first predistortion coefficient output by the APD training module, wherein the multiplier is obtain a basis contribution signal according to the basis function signal and the first predistortion coefficient, and wherein the multiplier is output the basis contribution signal to the LUT adder; and wherein the LUT adder is configured to receive a basis contribution signal output by each multiplier, and wherein the LUT adder is add the received basis contribution signals, to obtain the LUT signal.

11. The APD core module according to claim 10, wherein the reference voltage generation module of the LUT comprises:

an amplifier;
a third resistor;
a fourth resistor; and
multiple fifth resistors, wherein the multiple fifth resistors are sequentially connected in series to form a series circuit;

wherein an output end of the amplifier is connected to an end of the third resistor, an end of the series circuit, and a BFG, wherein another end of the third resistor is connected to a negative electrode input end of the amplifier and an end of the fourth resistor, and wherein another end of the fourth resistor is connected to the ground; and wherein a connection point of any two neighboring fifth resistors in the series circuit is connected to a BFG, and another end of the series circuit is connected to the ground.

12. The APD core module according to claim 10, wherein the LUT comprises K BFGs, and the K BFGs are respectively a BFG_1, a BFG_2, . . . , and a BFG_K, wherein K is a preset integer; and a gate electrode of a first MOS transistor of the BFG_k is connected to the envelope module of the APD core module, a gate electrode of a second MOS transistor is connected to the reference voltage generation module of the APD core module, and a V1 output end of the BFG_k outputs a single-ended downhill basis function signal, or a V2 output end of the BFG_k outputs a single-ended uphill basis function signal, wherein k=1, 2, . . . , K.

13. The APD core module according to claim 12, further comprising a first LS and multiple second LSs, wherein each BFG in the multiple BFGs is corresponding to a second LS;

wherein a first input end of the first LS is connected to the differential positive output end of the differential envelope module, and an output end is connected to the differential positive input end of each BFG in the multiple BFGs; and wherein a first input end of each second LS in the multiple second LSs is connected to the differential negative output end of the envelope module, a second input end is connected to the reference voltage generation module, and an output end is connected to a differential negative input end of a BFG corresponding to the second LS.

14. The APD core module according to claim 12, wherein each BFG in the K BFGs comprises:

a first MOS field-effect transistor;
a second MOS transistor;
a third MOS transistor;
a first resistor; and
a second resistor;

wherein an end of the first resistor and an end of the second resistor are both connected to a power supply, wherein another end of the first resistor is connected to a drain electrode of the first MOS transistor, and wherein another end of the second resistor is connected to a drain electrode of the second MOS transistor; and wherein a base electrode of the first MOS transistor is connected to the external envelope module, and a source electrode is connected to a drain electrode of the third MOS transistor, wherein a base electrode of the second MOS transistor is connected to the external reference voltage generation module, and a source electrode is connected to the drain electrode of the third MOS transistor, and wherein a source electrode of the third MOS transistor is connected to the ground.

15. The APD core module according to claim 10, wherein the LUT comprises:

K BFGs; and

K+1 level shifters (LSs), wherein K is a preset integer, wherein the K BFGs are respectively a BFG_1, a BFG_2, ..., and a BFG_K, and wherein the K+1 LSs are respectively an LS0, an LS1, ..., and an LSK;

wherein a first input end of the LS0 is connected to a differential positive end of an output end of the differential envelope module, a second input end receives a constant-voltage signal Vref0 input from exterior, and an output end is connected to a differential positive input end of the BFG_K, to perform, according to the constant-voltage signal, translation on a differential positive-end envelope signal output by the differential envelope module, and output the translated differential positive-end envelope signal to the differential positive input end of an input end of the BFG_K, wherein k=1, 2, ..., K;

wherein a first input end of the LSk is connected to a differential negative end of the output end of the envelope module, a second input end is connected to Vrefk output by the reference voltage generation module, and an output end is connected to a differential negative input end of an input end of the BFG_k, to receive a differential negative-end envelope signal and a reference voltage that is output by the reference voltage generation module, perform translation on the differential negative-end envelope signal according to the reference voltage, and output the translated differential negative-end envelope signal to the differential negative input end of the input end of the BFG_k, wherein k=1, 2, ..., K; and wherein a signal output by one of a V2 output end is subtracted from a signal output by a V1 output end of the BFG_k to form a differential downhill basis function signal, or a signal output, or a V1 output end is subtracted from a signal output by a V2 output end of the BFG_k to form a differential uphill function signal.

* * * * *